United States Patent [19]
Mishima et al.

[11] Patent Number: 6,052,571
[45] Date of Patent: *Apr. 18, 2000

[54] TUNER FOR PSK OR PAM DATA APPLICATIONS

[75] Inventors: Akira Mishima; Shigeharu Sumi, both of Gifu; Motoyoshi Kitagawa, Aichi, all of Japan

[73] Assignee: Matsushita Electric Industrial Co., Ltd., Osaka, Japan

[*] Notice: This patent is subject to a terminal disclaimer.

[21] Appl. No.: 08/969,253

[22] Filed: Nov. 13, 1997

Related U.S. Application Data

[63] Continuation-in-part of application No. 08/894,762, filed as application No. PCT/JP95/02668, Dec. 25, 1995.

[30] Foreign Application Priority Data

Dec. 25, 1995 [JP] Japan ................ PCT/JP95/02668

[51] Int. Cl.[7] ................ H03J 3/28; H03J 5/02; H03L 7/08; H04L 27/22
[52] U.S. Cl. .......... 455/318; 455/76; 455/260; 455/264; 455/265; 375/376; 331/25
[58] Field of Search ............ 455/76, 260, 264, 455/265, 313; 375/376; 331/25

[56] References Cited

U.S. PATENT DOCUMENTS

| | | |
|---|---|---|
| 4,912,437 | 3/1990 | Kuokkanen . |
| 5,325,401 | 6/1994 | Halik et al. . |
| 5,335,365 | 8/1994 | Ballantyne et al. ............ 455/76 |
| 5,390,168 | 2/1995 | Vimpari ............ 370/343 |
| 5,423,076 | 6/1995 | Westergren et al. ......... 455/86 |
| 5,461,348 | 10/1995 | Heuberger et al. ......... 332/128 |

FOREIGN PATENT DOCUMENTS

| | | |
|---|---|---|
| 2071817 | 3/1992 | Canada . |
| 0133799 | 3/1985 | European Pat. Off. . |
| 0673115A1 | 9/1995 | European Pat. Off. . |
| 55-050724 | 4/1980 | Japan . |
| 57-089304 | 6/1982 | Japan . |
| 58-16260 | 4/1983 | Japan . |
| 60-33727 | 2/1985 | Japan . |
| 61-120528 | 6/1986 | Japan . |
| 64-25236 | 2/1989 | Japan . |
| 02151101 | 6/1990 | Japan . |
| 4-70217 | 3/1992 | Japan . |
| 5-276208 | 10/1993 | Japan . |
| 7-245633 | 9/1995 | Japan . |
| 2282285 | 3/1995 | United Kingdom . |

*Primary Examiner*—Dwayne D. Bost
*Assistant Examiner*—Temica M. Davis
*Attorney, Agent, or Firm*—Ratner & Prestia

[57] ABSTRACT

A high frequency apparatus for receiving digitally modulated high frequency signals withstands vibration and has a simple tuning adjustment. The apparatus has an input terminal, a mixer which mixes the input signals and an output signal from a local oscillator, a voltage controlled oscillator which includes the local oscillator, an oscillating section, a movable conductive member and, a gluing agent for maintaining an adjusted state, and a control loop having a high loop band width which is large enough so that noise of the local oscillator is not dominated by noise of the voltage controlled oscillator.

113 Claims, 27 Drawing Sheets

(a)

(b)

Fig. 16(a)
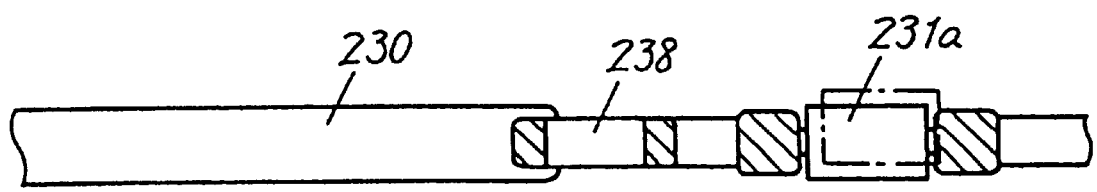
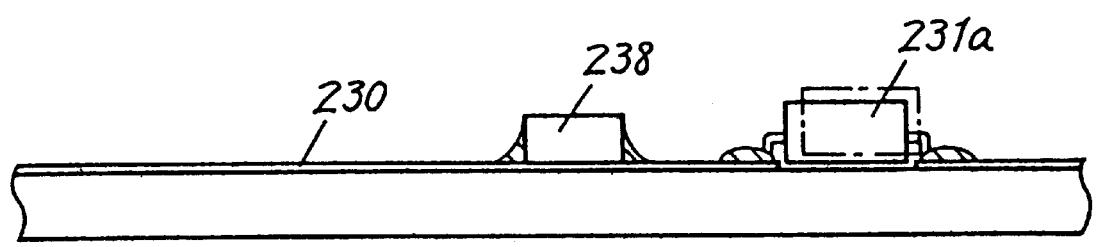
Fig. 16(b)

TUNER FOR PSK OR PAM DATA APPLICATIONS

This application is a continuation-in-part of U.S. patent application Ser. No. 08/894,762 filed Aug. 25, 1997 (pending) which is the National Phase Patent Application of PCT International Application Ser. No. PCT/JP95/02668, filed Dec. 25, 1995 (pending).

TECHNICAL FIELD

The present invention relates to a high frequency apparatus for receiving digital modulated high frequency signals. Specifically, to a high frequency signal tuner responding to PSK or PAM modulated high frequency signals.

BACKGROUND ART

In the conventional high frequency apparatus relating to the above described tuner for PSK or PAM data applications, the inductance of the tuning portion of a voltage controlled oscillator may be formed with a strip type transmission line to withstand vibration.

Namely, if the inductance is formed with a coil, for example, a vibration may cause vibration of the wire of the coil, which induces a shift in the inductance value, resulting in displacement of tuned frequency. In order to avoid the occurrence of such phenomenon, the inductance may be formed with a strip type transmission line of copper foil fixed on a substrate for securing stability against vibration.

A problem in the above described structure, where the inductance of the tuning portion is comprised of a strip type transmission line alone, is that fine tuning adjustment is not easy. This is because variations due to constants and mounting positions of electronic components constituting the local oscillator are compensated for before completion.

SUMMARY OF THE INVENTION

An apparatus according to the present invention comprises an input terminal for receiving digitally modulated high frequency signals, a mixer which receives the signals inputted to the input terminal at one input and an output signal of a local oscillator at the other input, and an output terminal for delivering the output signal of the mixer, the local oscillator being comprised of a voltage controlled oscillator, a frequency divider intervening in the control loop of the voltage controlled oscillator, a phase comparator and a loop filter. The voltage controlled oscillator comprises an oscillation section and a tuning section. The tuning section comprises a frequency adjusting section and a means for maintaining a tuned state of the frequency adjusting section. The control loop has a sufficiently high loop band width so that the noise of the local oscillator is not dominated by the noise of the voltage controlled oscillator. Thus, in the high frequency receiving apparatus of the present invention, vibration resistance property is improved, oscillation frequency stability is ensured for a long term, tuning adjustment is easy, and the local oscillator supplies clear output signals free from phase noise to the mixer.

A first exemplary high frequency apparatus comprises an input terminal for receiving digital modulated high frequency signals, a mixer for receiving the input signal at one input and an output signal of a local oscillator at the other input, and an output terminal for delivering the output signal of the mixer. The local oscillator comprises a voltage controlled oscillator, a frequency divider intervening in the control loop of the voltage controlled oscillator, a phase comparator, and a loop filter. The voltage controlled oscillator comprises an oscillation section and a tuning section. The tuning section comprises a frequency adjusting section and a means for maintaining a tuned state of the frequency adjusting section. The control loop has a sufficiently high loop band width so that the noise of the local oscillator is not dominated by noise of the voltage controlled oscillator.

With the above described constitution, tuning adjustment is simple because a frequency adjusting section has been provided as the tuning section of the voltage controlled oscillator. Furthermore, the state of the frequency adjusting section, after adjustment, is maintained by the maintaining means. As a result, the vibration resistance is assured.

In When a case when a maintaining means is used for assuring the anti-vibration property and the long term stability of the oscillation frequency, a stray capacitance is usually formed in the tuning section because the inductance intrinsic to the maintaining means is higher than that of the atmospheric air. As a result, dielectric loss is caused by the stray capacitance and the oscillation characteristics deteriorate. In the present invention, however, the control loop of the voltage controlled oscillator has a sufficiently high loop band width so that the noise of the local oscillator is not dominated by voltage noise. Therefore, the deterioration of oscillation characteristics is compensated for by a broad frequency width. Thus, output signals delivered from local oscillator to the mixer are clear and free from phase noise.

A second exemplary high frequency apparatus is similar to that of the first exemplary high frequency apparatus, except that the frequency adjusting section in the tuning section is comprised of a movable conductive member provided on a substrate. The conductive member is fixed after adjustment with a fixing member, or a maintaining means. The conductive member includes all types of motion such as (but not limited to) pivotable, slidable, or extendable. As the movable conductive member is firmly fixed with a fixing member, an adjusted value hardly shifts due to vibration or aging.

A third exemplary high frequency apparatus is similar to that of the first exemplary apparatus, except that the inductance element of the tuning section employs a pattern inductance line. A movable conductive member is placed in the vicinity of the pattern inductance line, and the movable conductive member is fixed with a fixing member, or a maintaining means, after a tuning frequency is adjusted by moving the movable conductive member. With the above constitution, the component count and process steps may be reduced by putting a portion of the inductance into a pattern. Furthermore, since the tuning section of the local oscillator is adjustable by the movable conductive member, the input signals may be received over the entire range even if there are variations in the value of components constituting the voltage controlled oscillator and the mounting position of the components. Furthermore, because the movable conductive member is fixed after adjustment with a fixing member, or a maintaining means, a tuned frequency is maintained stable and the inductance value does not shift due to deformation caused by long term temperature cycles, etc.

A fourth exemplary high frequency apparatus is similar to the third exemplary high frequency apparatus, except that the movable conductive member is disposed above approximately the center of the width and approximately parallel to the pattern inductance line. With the above described constitution, fine adjustment is simple because of the small coupling and the narrow adjustment range.

A fifth exemplary high frequency apparatus is similar to the third exemplary high frequency apparatus, except that the movable conductive member is disposed near an open end of the pattern inductance line. With the above constitution, because of a large change in coupling, a relatively large adjustment range is obtainable for the oscillation frequency.

A sixth exemplary high frequency apparatus is similar to the first exemplary high frequency apparatus, except that the inductance element of the tuning section is comprised of a coreless coil or a flat line. The inductance is adjusted by adjusting the coreless coil or the flat line, and then fixed with a fixing member, or a maintaining means. With the above constitution, because of the use of coreless coil or flat line, it is easy to have a large inductance, and a compact and relatively low-frequency voltage controlled oscillator is obtainable.

A seventh exemplary high frequency apparatus is similar to the first exemplary high frequency apparatus, except that a conductor, acting as the coil, is wound around the outer surface of a core used as the maintaining means. With the above constitution, the inductance value hardly shifts due to coil deformation even if an external force is exerted on the coil, because an electroconductive member, or a coil, is wound around a core.

An inductor of an eighth exemplary embodiment of the present invention comprises a cylinder shaped insulator, a conductor wound around the outer surface of the insulator, a female screw provided inside the cylinder shaped insulator, and a movable core having a male screw that couples with the female screw around the outer surface. With the above constitution, the inductance value can be changed by rotating the movable core, and an automatic adjustment can be easily introduced. Further, even if an external force is exerted, the inductance value hardly changes due to coil deformation, because the conductor is wound around an insulator. Furthermore, the movable core is fixed to the insulator by the friction of the screw not permitting the movable core to shift from an adjusted position. Therefore, the inductance value remains unchanged for a long time.

A ninth exemplary high frequency apparatus is similar to the first exemplary high frequency apparatus, except that a pattern inductance line and a movable conductive member are connected in series to form an inductance element constituting the tuning section. The inductance value is adjusted by adjusting the movable conductive member, and the movable conductive member is fixed after adjustment with a fixing member, or a maintaining means. With the above constitution, the area of the substrate may be reduced because the inductance is shared in common by the pattern inductance line and the serial movable conductive member. This results in a compact apparatus.

A tenth exemplary high frequency apparatus is similar to the first exemplary high frequency apparatus, except that a pattern inductance line is used as the inductance element constituting the tuning section. An adjustment is conducted by trimming an adjusting section provided on the pattern inductance line, and the trimmed portion is covered by a covering material. With this constitution, the adjusting is performed by a two-dimensional work of trimming the pattern inductance line. Therefore automatic adjustment can be easily implemented. Further, because the trimmed portion is covered with a covering material, chemical reactions due to absorption of humidity, oxidation, etc., are prevented and an adjusted value is maintained for a long time.

An eleventh exemplary high frequency apparatus is similar to the first exemplary high frequency apparatus, except that a movable conductive member is connected in series with the pattern inductance line, and the movable conductive member is fixed after adjustment by a fixing member, or a maintaining means. With the above constitution, the adjustment is simple and with high accuracy, because there are two frequency adjusting sections provided, viz. the trimming of the pattern inductance line and the adjustment of the movable conductive member.

A twelfth exemplary high frequency apparatus is similar to the first exemplary high frequency apparatus except that the local oscillator and the mixer are housed in a metal case, and the pattern inductance line, laid on a substrate constituting a part of the tuning section of the local oscillator, is disposed in the vicinity of the metal case or a separating plate. With the above constitution, a stable oscillation frequency results because the metal case or separating plate provides a stable ground potential and is disposed in the vicinity of the pattern inductance line to avoid the influence of outside signals.

A thirteenth exemplary high frequency apparatus is similar to the first exemplary high frequency apparatus except that a film capacitor is used as the capacitance of the loop filter. With the above constitution, capacitance shift due to piezoelectric effect caused by pressure exerted on the capacitor as a result of vibration is reduced. This results in a high performance voltage controlled oscillator that has vibration stability.

A fourteenth exemplary high frequency apparatus is similar to the thirteenth exemplary high frequency apparatus except that a film capacitor is mounted on the upper surface of the substrate, a lead wire of the capacitor is inserted through a hole provided in the substrate and soldered to a conductive pattern on the back surface, and the inside of the hole is non-conductive. With the above constitution, damage to the film capacitor by heat will typically be avoided even when a lead wire is soldered to the back surface of the substrate. Because no electrode is formed in the hole through which the lead wire passes, an unheated length is maintained greater than the substrate thickness. Thus, the unheated length prevents molten solder from reaching the base of the lead wire at the film capacitor.

A fifteenth exemplary high frequency apparatus is similar to the first exemplary high frequency apparatus except that the loop filter is separated from the voltage controlled oscillator by a separating plate, the separating plate being provided with an opening to allow a conductive pattern connected between the loop filter and the voltage controlled oscillator, and a film capacitor is mounted in the vicinity of and covering the opening. With the above constitution, because one electrode of the film capacitor is grounded and the opening is shielded by the film capacitor, the loop filter and the voltage controlled oscillator are electrically separate from each other enabling efficient layout of components.

An exemplary loop filter of the sixteenth exemplary embodiment is comprised of transistors in two stages. The two-staged transistors provide appropriate amplitude and wide band characteristics.

A seventeenth exemplary high frequency apparatus is similar to the first exemplary high frequency apparatus except that a movable conductive member constituting the tuning section, a varactor diode and a pattern inductance line are connected in series, and the pattern inductance line is connected to the oscillating section. With the above constitution, because the oscillating section is coupled with a pattern inductance line having a fixed inductance, unstable coupling due to a high frequency mode usually does not arise. Because the adjustment is conducted by a movable conductive member disposed remotely from the oscillating section, the adjusting is easy. As the varactor diode is disposed between movable conductive member and pattern inductance line, an appropriate range of oscillation frequency is obtained by the varactor diode and the movable conductive member. Further, as it is unnecessary to raise the tuning sensitivity higher than a certain level, an increase of phase noise is suppressed even if a noise is injected into the loop filter.

An eighteenth exemplary high frequency apparatus is similar to the first exemplary high frequency apparatus except that a chip capacitor of small capacitance is mounted between the serial connection of varactor diode and pattern inductance line in proximity to the pattern inductance line, the varactor diode and the pattern inductance line is constituting the tuning section. The mounting of small capacitance chip capacitor raises the impedance of the line. The impedance increases due to the chip capacitor's contribution to diminish the influence caused by soldering which might eventually change the length of the lead wire of the varactor diode. Namely, as the varactor diode is heavier than the chip capacitor the self alignment effect does not work in reflow soldering. The accuracy of positioning on the substrate is deteriorated and the substantial length including lead wire etc. varies, causing non-uniform impedance. On the other hand, as the chip capacitor is light in weight the self alignment effect works during reflow soldering to a stable positioning. Although there is a possibility that the inductance between chip capacitor and varactor diode may vary, variation of the oscillation frequency of the voltage controlled oscillator is small because the impedance has already been raised by a chip capacitor.

A nineteenth exemplary high frequency apparatus is similar to the eighteenth exemplary high frequency apparatus except that a first small capacitance chip capacitor is inserted between the inductance and the varactor diode constituting tuning section, a second capacitor is inserted between the varactor diode and the oscillation section, the first capacitor and the second capacitor being temperature compensation capacitors. With the above constitution, the combination of respective temperature compensation characteristics of the two capacitors, provides a better temperature compensation characteristic; which implements a voltage controlled oscillator stable against temperature shift.

A twentieth exemplary high frequency apparatus is similar to the first exemplary high frequency apparatus further comprising a reference frequency divider to which a reference frequency signal is input, the reference frequency divider having a variable dividing ratio. With the above constitution, there is a reference frequency divider to which a reference frequency signal is input and the dividing ratio is variable, the dividing ratio of frequency divider of the control loop is made smaller maintaining the high loop band width. As a result, the response speed may be made faster, and a desired tuning frequency range is obtained.

A twenty-first exemplary high frequency apparatus is similar to the twentieth exemplary high frequency apparatus except that the dividing ratio of reference frequency divider becomes smaller as the output frequency of the voltage controlled oscillator increases. With the above constitution, as the dividing ratio of the reference frequency divider and the dividing ratio of the frequency divider in the control loop are controlled together, in accordance with the output frequency of voltage controlled oscillator, the dividing ratio of the frequency divider may be made smaller without being controlled by the output frequency; the response is thus improved.

A twenty-second exemplary high frequency apparatus is similar to the first exemplary high frequency apparatus except that a plurality of intermediate frequency tuning filters each having a roll-off characteristic and different band width are provided in parallel between the mixer and the output terminal. The intermediate frequency tuning filters are selectively switched according to the transfer rate of the input signal from the input terminal. With the above constitution, as the intermediate frequency tuning roll-off filters are selectively switched according to the difference in the band width of high frequency signal to be input from the input terminal, signals may be received in a better condition even if their transfer rate is different. In addition, the circuits before the mixer may be shared in common.

A twenty-third exemplary high frequency apparatus is similar to the first exemplary high frequency apparatus except that a variable attenuator is provided between the input terminal and the mixer, the variable attenuator provided with a control terminal for controlling the variable attenuator. With the above constitution, as the quantity of attenuation is controllable by a signal from the control terminal, optimal control is conducted and does not induce mixed modulation at the mixer.

A twenty-fourth exemplary high frequency apparatus is similar to the first exemplary high frequency apparatus except that an I/Q detector is connected to the output terminal via an intermediate frequency tuning surface acoustic wave filter. A first output terminal is provided for outputting an I signal of the I/Q detector, a second output terminal is provided for outputting Q signal of the I/Q detector, a second oscillator is provided for supplying oscillation frequency signal to the I/Q detector, substrate of a surface acoustic wave resonator constituting the resonating section of the second oscillator and substrate of the intermediate frequency tuning surface acoustic wave filter being made of a same material, a frequency error sensor is provided for the signals to be delivered from the first output terminal and the second output terminal, data of frequency divider are controlled at an adding/subtracting counter based on the output from error sensor, and the center of the intermediate frequency being made almost identical to the oscillation frequency of the second oscillator.

With the above constitution, because the substrate of the surface acoustic wave resonator of the second oscillator and the substrate of the intermediate frequency tuning surface acoustic wave filter are made of the same material, even if the frequency of the intermediate frequency tuning surface acoustic wave filter is shifted due to temperature changes, etc., the frequency of second oscillator also shifts in the same direction for the same frequency. Therefore, the shift is set-off as a whole, resulting in a state as if no shift had taken place.

Further, by controlling the frequency control data at the adding/subtracting counter according to the frequency error sensor so that the center frequency of the intermediate frequency, being output from mixer, is equal to the oscillation frequency of the second oscillator, the center frequency of the intermediate frequency becomes almost identical to the center frequency of intermediate frequency tuning surface acoustic wave filter. The detection error is thus eliminated, and an inexpensive material is usable for the substrate; which helps reduce the apparatus cost.

A twenty-fifth exemplary high frequency apparatus is similar to the twenty-fourth exemplary high frequency apparatus except that a band width of 3 dB cutoff frequency in the intermediate frequency tuning surface acoustic wave filter is more than 0% within +5% of the band width equal to the symbol rate of the received signal. Such a characteristic also functions to restore a characteristic emphasized at transmitting side to the original state. Therefore, there is no need of providing any specific filter for restoring a characteristic emphasized at the transmitting to the original state.

A twenty-sixth exemplary high frequency apparatus is similar to the first exemplary high frequency apparatus except that an input filter is inserted between the input terminal and the mixer, the local oscillator oscillates at a frequency that yields an intermediate frequency greater than one half the difference between the largest frequency and the smallest frequency to be input to the input terminal, the input filter being a fixed filter which allows all the frequencies ranging from the smallest frequency to largest frequency to pass through. With the above constitution, an image affecting frequency is always higher than the highest receiving frequency, as the local oscillator is made to oscillate at a frequency that yields an intermediate frequency greater than one half the difference between the largest frequency and the smallest frequency to be input. This makes it possible to connect, to the input terminal, a fixed filter which allows the frequency from the smallest receiving frequency to the largest receiving frequency to pass. Therefore, despite the use of a fixed filter, image disturbance is prevented, and the structure of an apparatus is significantly simplified.

A twenty-seventh exemplary high frequency apparatus is similar to the twenty-sixth high frequency apparatus except that the frequency of output signal from mixer is made to be approximately 612 MHz. With the above constitution, no disturbance comes from the input terminal, as the intermediate frequency is set at an empty channel frequency of the receiving signal. Further, an approximately 612 MHz trap may be inserted next to the input terminal.

A twenty-eighth exemplary high frequency apparatus is similar to the first exemplary high frequency apparatus except that an I/Q extracting means is connected to the output terminal, a first output terminal coupled with an I signal output of the I/Q extracting means is provided, a second output terminal coupled with a Q signal output of the I/Q extracting means is provided, a demodulator is connected with the first and second output terminal, with the demodulator being mounted outside of the metal cover. With the above constitution, good heat dissipation is assured because an integrated circuit section of the demodulator is not surrounded by a cover. Therefore, there is no risk of operating error due to thermal runaway, etc., of integrated circuit. Further, as a sufficient thermal dissipation is assured, the integration density of integrated circuit may be raised for making the device smaller. This helps making a high frequency apparatus smaller.

A twenty-ninth exemplary high frequency apparatus is similar to the twenty-eighth high frequency apparatus except that a substrate having a demodulator comprised of integrated circuits mounted on the surface, a copper foil laid underneath the demodulator and a copper foil provided on the back surface of the substrate are connected with a through hole. With the above constitution, as the copper foil underneath the integrated circuits and the copper foil on the back surface of substrate are connected together by a through hole, a heat generated by the integrated circuits is conducted via the through hole to the copper foil on the back surface for dissipation.

A thirtieth exemplary high frequency apparatus is similar to the twenty-eighth exemplary high frequency apparatus except that a hole is provided in the substrate carrying a demodulator comprised of integrated circuits at a place beneath the integrated circuits. The size of the hole is larger than the chip size inside the integrated circuit device and smaller than the outer dimension of the integrated circuit device. With the above constitution, as the hole is smaller than the outer dimension of the integrated circuit device, the device can be easily mounted by an ordinary chip mounting machine. Furthermore, the heat is dissipated efficiently because both the upper and the bottom surfaces of the device are directly exposed to the air.

A thirty-first exemplary high frequency apparatus is similar to the twenty-ninth exemplary high frequency apparatus except that a plurality of strips void of solder resist are provided on the copper foil on the back surface of substrate, and solder is melted to protrude on the strips void of solder resist. With the above constitution, as the back surface copper foil is provided with protruding solder, the area contacting the air has been expanded for more efficient heat dissipation.

A thirty-second exemplary high frequency apparatus is similar to the first exemplary high frequency apparatus except that a filter is provided between input terminal and mixer, an intermediate frequency tuning filter is connected with the output terminal, an I/Q extracting means is provided with which the output from intermediate frequency tuning filter is connected, a first output terminal connected with the I signal output of I/Q extracting means is provided, a second output terminal connected with the Q signal output of the I/Q extracting means is provided, all these being housed in a shield case. With the above constitution, the shield case avoids external disturbances, for example by a digital clock, etc., coming inside the high frequency apparatus for a broad range of frequency.

A thirty-third exemplary high frequency apparatus is similar to the thirty-second exemplary high frequency apparatus except that at least one sheet of a shield plate is provided between the mixer and an oscillator used for the I/Q extracting means. The above constitution helps Reduce the spurious interference between the oscillator and the mixer.

A thirty-fourth exemplary high frequency apparatus is similar to the thirty-second exemplary high frequency apparatus except that the mixer and an oscillator to be used for the I/Q extracting means are disposed on a diagonal line in a shield case. The above constitution likewise helps reduce the spurious interference between the oscillator and the mixer.

A thirty-fifth exemplary high frequency apparatus is similar to the thirty-second exemplary high frequency apparatus except that an input terminal is provided in a width side of approximately rectangular shaped shield case, an input filter and the mixer are disposed in the order following the input terminal, and a local oscillator for supplying oscillation frequency to the mixer is provided approximately in parallel with the input filter and the mixer with a separating plate in between. With the above constitution, as an input of digital signal for selecting a channel is located at the vicinity of input terminal of shield case in width side the digital signal for channel selection does not adversely-affect other compartments.

A thirty-sixth exemplary high frequency apparatus is similar to the thirty-third exemplary high frequency apparatus except that a compartment for mounting an intermediate frequency tuning filter is provided between the local oscillator for supplying oscillation frequency to mixer and the I/Q extracting means. With the above constitution, as the mixer and the I/Q detector are disposed separate to each other an excellent I/Q detection is performed without having mutual interference.

A thirty-seventh exemplary high frequency apparatus is similar to the thirty-fifth exemplary high frequency apparatus except that a control terminal for local oscillator and an output terminal of I/Q extracting means are provided in the vicinity of first length-side board of shield case. The above constitution offers a convenience of wiring, as each of the signals is disposed in a same direction on the substrate side.

A thirty-eighth exemplary embodiment of the present invention comprises an input terminal for receiving digital modulated high frequency signals, a mixer which receives the signals input to the input terminal at one of the inputs and output signals from local oscillator at the other input, and an output terminal which delivers output signals of the mixer, the local oscillator being comprised of a voltage controlled oscillator, a frequency divider intervening in the control loop of voltage controlled oscillator, a phase comparator and a loop filter. The voltage controlled oscillator comprises an oscillating section and a tuning section, the tuning section being comprised of a frequency adjusting section and a maintaining means for maintaining an adjusted state of the frequency adjusting section. The control loop being made to have a sufficiently great high loop band width so as the noise of the local oscillator is not affected by the noise of the voltage controlled oscillator, and a reference frequency signal to be delivered to the phase comparator being set to have a smaller signal level relative to a comparative signal delivered from frequency divider to comparator, in a same frequency with the exception of a portion substantially the center of frequency.

With the above constitution, the tuning adjustment is easy as there is a frequency adjusting section provided as tuning section of voltage controlled oscillator. Further, as an adjusted state of the frequency adjusting section is maintained by a maintaining means the vibration resistance is sufficiently assured.

On the other hand, when a maintaining means is employed for securing vibration resistance, a stray capacitance is formed because the material of the maintaining means usually has an dielectric constant greater than the atmospheric air. This creates a dielectric loss, resulting in a deteriorated oscillation characteristic. In the present invention, however, the control loop of the voltage controlled oscillator is set to have a high loop band width great enough so that the noise of the local oscillator is not affected by the noise of the voltage controlled oscillator, and the signal level of the reference frequency signal delivered to the phase comparator is made smaller, relative to the comparative signal delivered from the frequency divider to the comparator, in a same frequency with the exception of a portion substantially at the center frequency. As a result, the deterioration of the oscillation characteristic is corrected over a broad frequency band width. Therefore, the output signal of local oscillator delivered to the mixer is clearer and has less phase noise.

A thirty-ninth exemplary embodiment of the present invention comprises an input terminal for receiving digital modulated high frequency signals, a mixer which receives the signal inputted to the input terminal at one input and the output signal of local oscillator at the other input, and an output terminal to which the output signal of mixer is delivered, the local oscillator being comprised of a voltage controlled oscillator, a frequency divider intervening in the control loop of voltage controlled oscillator, a phase comparator and a loop filter. The voltage controlled oscillator comprises an oscillating section and a tuning section, the tuning section being comprised of a frequency adjusting section and maintaining means for maintaining an adjusted state of the frequency adjusting section. The control loop has a high loop band width great enough so as the noise of the local oscillator is not affected by noise of the voltage control oscillator, and the signal level at the vicinity of center frequency of reference frequency signal to be delivered to the phase comparator is made to be lower, relative to the frequency distribution characteristic of signal level at the vicinity of center frequency of the local oscillator to be delivered to mixer, than the signal level, which is to be noise-reduced by the high loop band width, in the same off-set frequency from the center frequency with the exception of a portion substantially the center of frequency in the frequency distribution characteristic.

With the above constitution, as there is a frequency adjusting section provided as tuning section of voltage controlled oscillator the tuning adjustment is easy, and as an adjusted state of the frequency adjusting section is maintained by a maintaining means the anti-vibration property is sufficiently assured. On the other hand, when a maintaining means is employed for the vibration resistance the oscillation characteristic deteriorates, because the rate of inductance is generally higher with material of maintaining means than with the atmospheric air, which creates a stray capacitance.

In the present invention, however, the control loop of voltage controlled oscillator is made to have a high loop band width great enough so that the noise of the local oscillator is not affected by noise of the voltage controlled oscillator, and the signal level of the reference frequency signal supplied to the phase comparator is made lower, relative to the frequency distribution characteristic of the signal level delivered from the local oscillator to the mixer, than a signal level which is noise-reduced by the high loop band width, in a same off-set frequency from the center frequency with the exception of a portion substantially at the center frequency in the frequency distribution characteristic. As a result, the noise of reference frequency signal does not affect the noise reduction effect of local oscillator due to the high loop band width; in practice, the correction is conducted effectively for the high loop band width covering a broad frequency width. Therefore, a local oscillator is implemented economically, and the output signal becomes clear with reduced phase noise.

A fortieth exemplary embodiment of the present invention comprises an input terminal for receiving digital modulated high frequency signals, a mixer which receives the signal inputted to the input terminal at one input and the output signal of local oscillator at the other input, and an output terminal to which the output signal of mixer is delivered, the local oscillator being comprised of a voltage controlled oscillator, a frequency divider, a phase comparator and a loop filter, the last three items disposed intervening in the control loop of voltage controlled oscillator. The voltage controlled oscillator comprises an oscillating section and a tuning section, the tuning section forming a pattern inductance line on substrate as the inductance element. The control loop has a high loop band width enough so as the noise of the local oscillator is not dominated by noise of the voltage controlled oscillator, and the signal level of reference frequency signal to be delivered to the phase comparator is made smaller, relative to a comparative signal delivered to comparator from frequency divider, in a same frequency with the exception of a portion substantially the center of frequency.

With the above constitution, even if a pattern inductance line is formed on a substrate of high inductance material as the dielectric element of tuning section of voltage controlled oscillator, the signal of local oscillator to be delivered to mixer becomes clearer with less phase noise, because the loop band width is broad enough not to be dominated by noise of voltage controlled oscillator and the level is maintained low enough not to be affected by reference frequency signal.

A forty-first exemplary embodiment of the present invention comprises an input terminal for receiving digital modulated high frequency signals, a mixer which receives the signal inputted to the input terminal at one input and the output signal of local oscillator at the other input, and an output terminal to which the output signal of mixer is delivered, the local oscillator being comprised of a voltage controlled oscillator, a frequency divider, a phase comparator and a loop filter, the last three items disposed intervening in the control loop of voltage controlled oscillator. The voltage controlled oscillator comprises an oscillating section and a tuning section, the tuning section forming a pattern inductance line on substrate as the inductance element. The control loop is made to have a high loop band width enough so as the noise of the local oscillator is not affected by noise of the voltage controlled oscillator, and the signal level of the frequency distribution characteristic at the vicinity of center frequency of reference frequency signal is made to be lower, relative to the frequency distribution characteristic of signal level at the vicinity of center frequency of the local oscillator to be delivered to mixer, than signal level which is to be noise-reduced by the high loop band width, in a same off-set frequency from the center frequency with the exception of a portion substantially the center of frequency in the frequency distribution characteristic.

With the above constitution, even if a pattern inductance line is formed on a substrate of high inductance material as the dielectric element of tuning section of voltage controlled oscillator, the noise of the reference frequency signal does not affect the noise reduction effect of the local oscillator due to the high loop band width, because the loop band width is broad enough not to be dominated by noise of the voltage controlled oscillator and the level is maintained low enough not to be affected by reference frequency signal. In the practical use, the correction is conducted efficiently in a high loop band width covering a broad frequency width. Therefore, the local oscillator is implemented economically, and the output signal becomes clearer with reduced phase noise.

BRIEF DESCRIPTION OF THE DRAWINGS

FIG. 16(a) is a plane view showing key part of voltage controlled oscillator in the high frequency apparatus of FIG. 10.

FIG. 16(b) is a side view of voltage controlled oscillator of the high frequency apparatus.

DETAILED DESCRIPTION (Embodiment 1)

Figure 1:
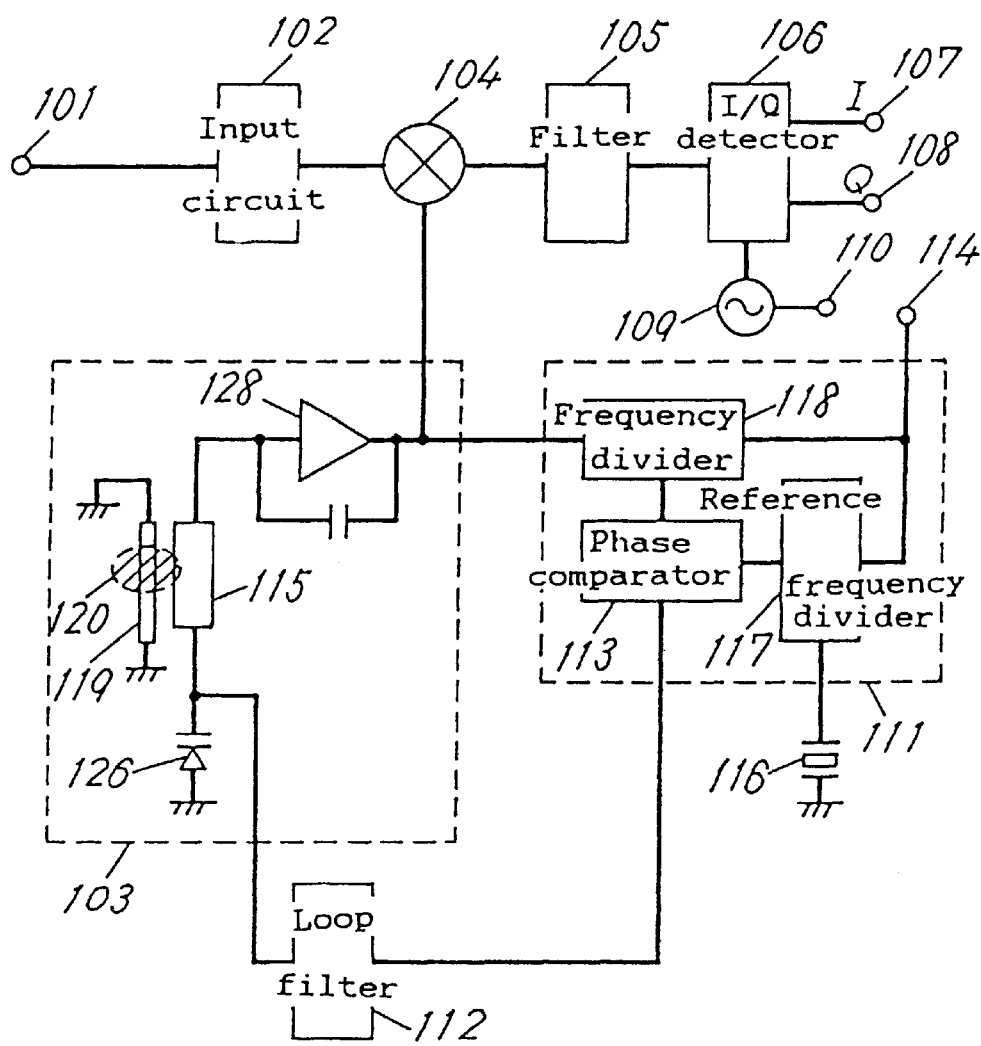
FIG. 1 is a block diagram showing high frequency apparatus according to Embodiment 1 of the present invention.

Referring to FIG. 1, a high frequency apparatus according to a first exemplary embodiment of the present invention comprises an input terminal 101 for receiving high frequency digital signals, an input circuit 102 connected to the input terminal 101, a mixer 104 to which an output of the input circuit 102 is supplied at one input, and an output of a first oscillator 103, or a local oscillator, is supplied to at the other input, a filter 105 connected to an output of mixer 104, an I/Q detector 106 connected to an output of filter 105, a first output terminal 107 for outputting an I signal of the I/Q detector 106, a second output terminal 108 for outputting a Q signal of the I/Q detector, a second oscillator 109 for supplying an oscillation frequency signal to the I/Q detector 106, an Automatic Frequency Control (AFC) terminal 110 for controlling the oscillation frequency of the second oscillator 109, a Phase-Locked-Loop (PLL) (frequency divider and phase comparator) 111 to which an output of the first oscillator 103 is connected, and a loop filter hereinafter referred to as low pass filter) 112 connected between the PLL 111 and an input of the first oscillator 103.

In the first oscillator 103, an output of low-pass filter 112 is provided to an input of an amplifier 128, which constitutes an oscillator, via a strip type transmission line(an example of the pattern inductance line) 115 laid on a substrate 115A (shown in FIG. 2(a)), and a connecting point of low pass filter 112 and strip type transmission line 115 is grounded via a variable capacitance diode 126. The output of amplifier 128 being the output of the first oscillator 103. A grounding pattern 115B (shown in FIG. 2(a)) is formed over the entire back surface of substrate 115A.

In the vicinity of the strip type transmission line 115 is a movable conductive member 119 constituting a frequency adjusting section, and the movable conductive member 119 is fixed, after adjustment, with a gluing agent(an example of the maintaining means) 120. In PLL 111, the output of oscillator 103 is connected to frequency divider 118. The output of frequency divider 118 is connected to one side of phase comparator 113, while the output of phase comparator 113 is connected to the low pass filter 112. Reference oscillator 116 is connected to reference frequency divider 117, and the output of reference frequency divider 117 is connected to another input of the phase comparator 113. Both the divider 118 and the reference frequency divider 117 are connected to a control input terminal 114, and the dividing ratio is varied according to the signal from the control input terminal 114.

As the frequency change steps are coarse due to a high reference frequency input to phase comparator 113, a modules type frequency divider, having a variable dividing ratio, is used as the frequency divider 118 for making the frequency variation steps finer.

With a high frequency apparatus constituted as above, the operation is described in the following. A high frequency digital signal is input at terminal 101 and provided to mixer 104 via input circuit 102. Here, an intermediate frequency signal is obtained after the input signal is mixed with an oscillation frequency output by first oscillator 103. The intermediate frequency signal goes through filter 105 and multiplied by a signal of second oscillator 109 at an I/Q detector 106 results in an I signal and a Q signal. The frequency of the second oscillator 109 is controlled with AFC terminal 110.

In the first oscillator 103, a variable capacitance diode 126 constitutes the capacitance component of the variable tuning circuit. The capacitance value of variable capacitance diode 126 changes according to a control voltage from low pass filter 112. Thus, the oscillation frequency of first oscillator 103 is controlled.

The oscillator desirably covers a frequency range of approximately 1430–2530 MHz. For this purpose, adjustments are made to absorb the variations in component constants and mounting status of the electronic components constituting a tuning circuit (hereinafter simply referred to as dispersion) for enabling to cover an entire range of input signals input at input terminal 101. Because a strip type transmission line 115 of a certain pattern is used as the inductance, no specific inductance component is needed for the portion; which contributes to rationalize the assembly steps etc.

Now in the following, an adjustment procedure of the tuning circuit for absorbing the variation will be described. By moving the movable conductive member 119 closer to or farther from strip type transmission line 115, an equivalent inductance value of the strip type transmission line 115 changes; which enables adjustment of the tuning frequency of the variable tuning circuit of oscillator 103. Namely, the inductance value is shifted to absorb i) variations in the component constants of oscillator 103 and i) stray capacitance due to variation in positioning of components, in order to obtain an optimum value.

Meanwhile, shifting of the inductance value due to deformation of movable conductive member 119 caused by vibration, long term temperature cycling, etc. has to be prevented. For this purpose, an adjustment is performed to absorb the variations, and then movable conductive member 119 is fixed by applying a gluing agent 120. A stabilizing measure has thus been taken against long term deformation.

However, the gluing agent 120, whose specific dielectric constant is larger than air, increases stray capacitance causing a substantial dielectric loss to a deteriorated Q of the tuning circuit of oscillator 103. This eventually increases the phase noise of oscillator 103, which poses a great task to be solved in the high frequency apparatus.

Then, phase noise has to be reduced to a low level so that no trouble due to the bit error rate would arise during digital signal reception. In order to solve the issue, phase noise has to be reduced through a high loop band width. The loop band width was about 60 Hz in the conventional reception of analog modulated high frequency signals. In the reception of digital modulated high frequency signals according to the present embodiment, however, the loop band width is set to approximately 7 kHz and the phase noise has been improved by about 40 dB. Conventionally, the phase comparative frequency was about 3 kHz, but in the present embodiment it has been set to approximately 360 kHz. In some cases, the loop band width is set at approximately 10 kHz; when, the phase comparative frequency is approximately 500 kHz.

Figure 2:
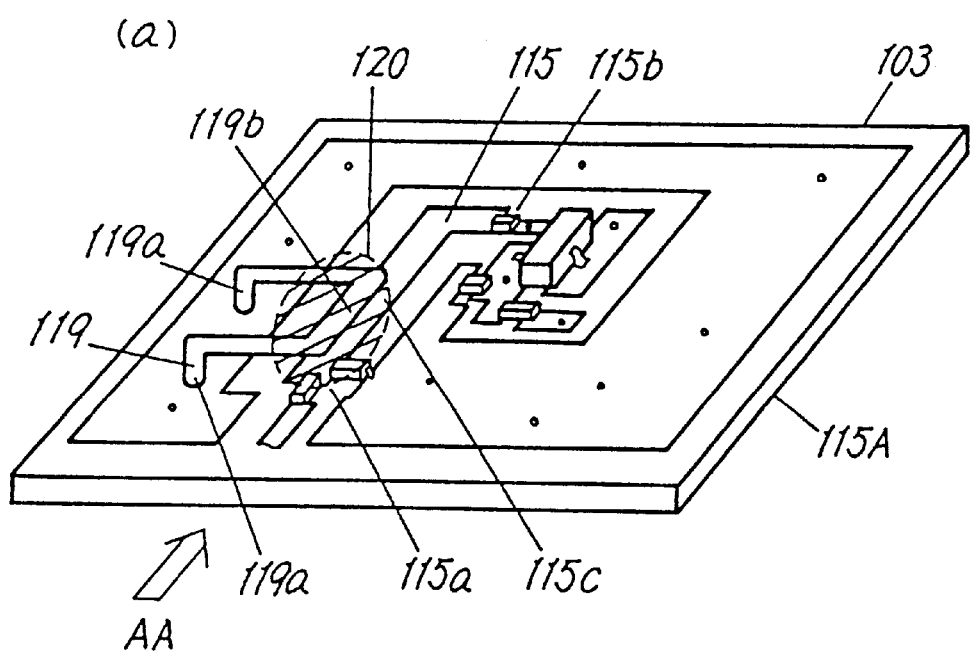
FIG. 2(a) is a perspective view of a local oscillator in the high frequency apparatus of FIG. 1.
FIG. 2(b) is a side view showing a key part of FIG. 2(a).
Figure 2:
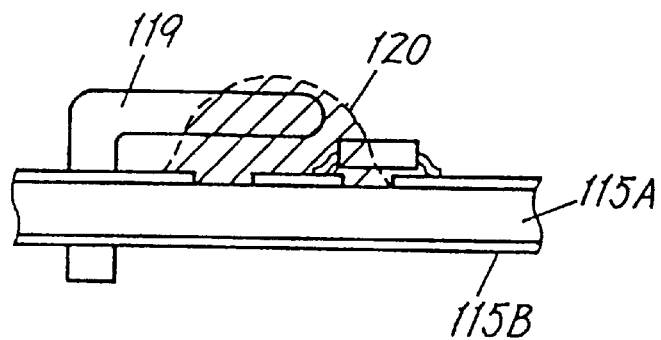

FIG. 2(a) is a perspective view showing details of the first oscillator 103 of FIG. 1. FIG. 2(b) is a side view showing the vicinity of movable conductive member 119 as seen from view A—A. In FIG. 2, the movable conductive member 119 is comprised of two reverse L-shaped feet 119a and a main body 119b bridging the feet. The main body 119b is magnetically coupled to strip type transmission line 115 by disposing main body 119b in a space above open end 115a or 115b, in approximately the middle of the width and approximately parallel with the strip type transmission line 115. With the above arrangement, an oscillation frequency adjusting range of about 100 MHz is obtainable. Namely, a relatively wide adjusting range of oscillation frequency has been obtained because the main body 119b is disposed over open end 115a or 115b.

A gluing agent 120 is applied so as the relative positioning between movable conductive member 119 and strip type transmission line 115 does not change and is stable against variations such as long term temperature cycles, etc. In the present embodiment, a solvent type rubber adhesive is used as the gluing agent 120. Adhesives such as silicone, epoxy, phenol, etc. may also be used for this purpose. In view of the work efficiency, what is preferred are adhesives that set at room temperature.

For a narrow oscillation frequency adjusting range, e.g. 30 MHz, the movable conductive member 119 may be disposed over the approximate center 115c of strip type transmission line 115. Although the adjusting range is narrow, adjustment is easy.

Figure 3A:
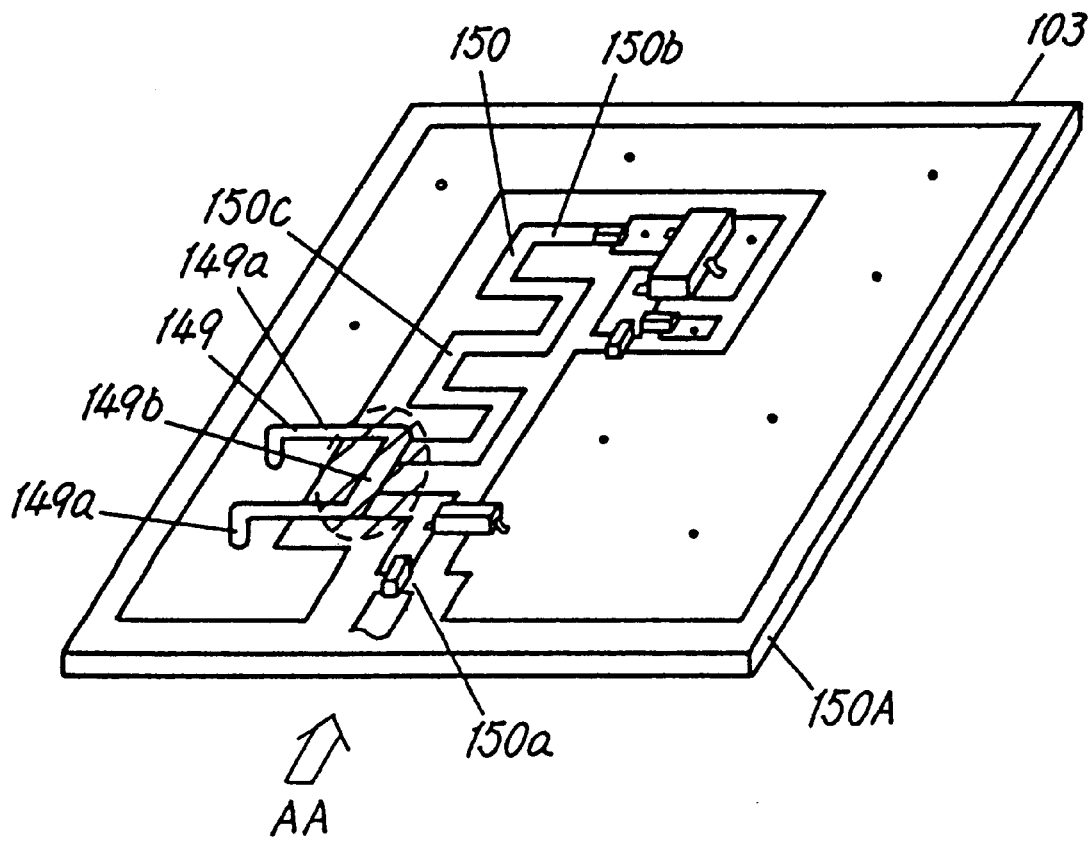
FIG. 3(a) is a perspective view of a local oscillator according to other embodiment in the high frequency apparatus of FIG. 1.
Figure 3B:
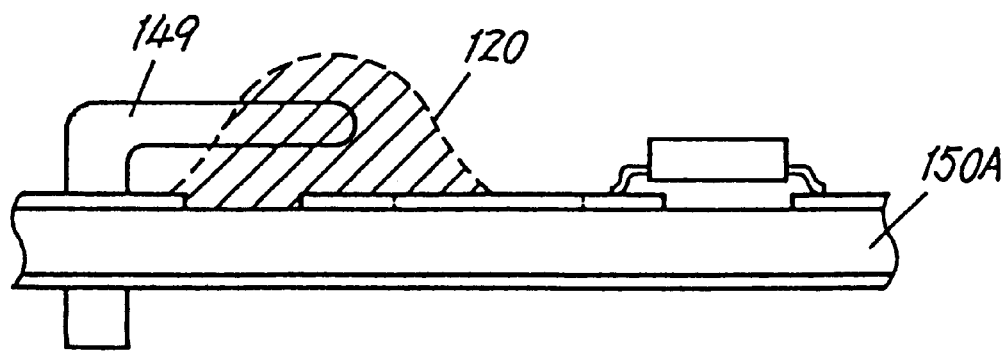
FIG. 3(b) is a side view showing a key part of FIG. 3(a).

FIG. 3(a) is a perspective view showing details of other example of the first oscillator 103 of FIG. 1. FIG. 3(b) is a side view showing the vicinity of movable conductive member 149 as seen from symbol 3b—3b. In FIG. 3, a movable conductive member 149 is comprised of two reverse-L shaped feet 149a and a main body 149b bridging the feet. The main body 149b is magnetically coupled to strip type transmission line 150 provided on substrate 150A is disposed in a space above open end 150a or 150b, and approximately parallel with strip type transmission line 150. Here, an oscillation frequency adjustable range of approximately 80 MHz is obtained. Namely, a relatively wide oscillation frequency adjusting range is obtained because the main body is disposed above open end, 150a or 150b. The strip type transmission line 150 has been formed in a shape of continuation of letters L. By so doing mounting area on substrate 150A is conserved. The same effect is obtained with a continuous form of letters S.

For a narrow oscillation frequency adjusting range of approximately 20 MHz, the movable conductive member 149 may be disposed at the approximate center 11c of strip type transmission line 150. In this case, the adjustment is easy because of the narrow adjusting range.

In the same manner as in the previous example, the movable conductive member 149 and the strip type transmission line are glued by the gluing agent 120 to avoid shift of the relative positioning. A grounding pattern 150B is provided over the entire back surface of substrate 150A.

(Embodiment 2)

In some cases where oscillation frequency is low the use of strip type transmission line 115 or 150 as an inductive element may be inappropriate because the size will become too large. When oscillating at a VHF frequency, for example, the timing section may be formed using an core-less coil or a flat plate transmission line as the inductive element. In this case, the inductance value is adjusted by changing the shape of core-less coil or flat plate transmission line, to improve the oscillation frequency range. In order to maintain the stability of the core-less coil or flat plate transmission line against long term temperature cycles, etc., it is fixed with a gluing agent in a same way as the embodiment described above.

Figure 4:
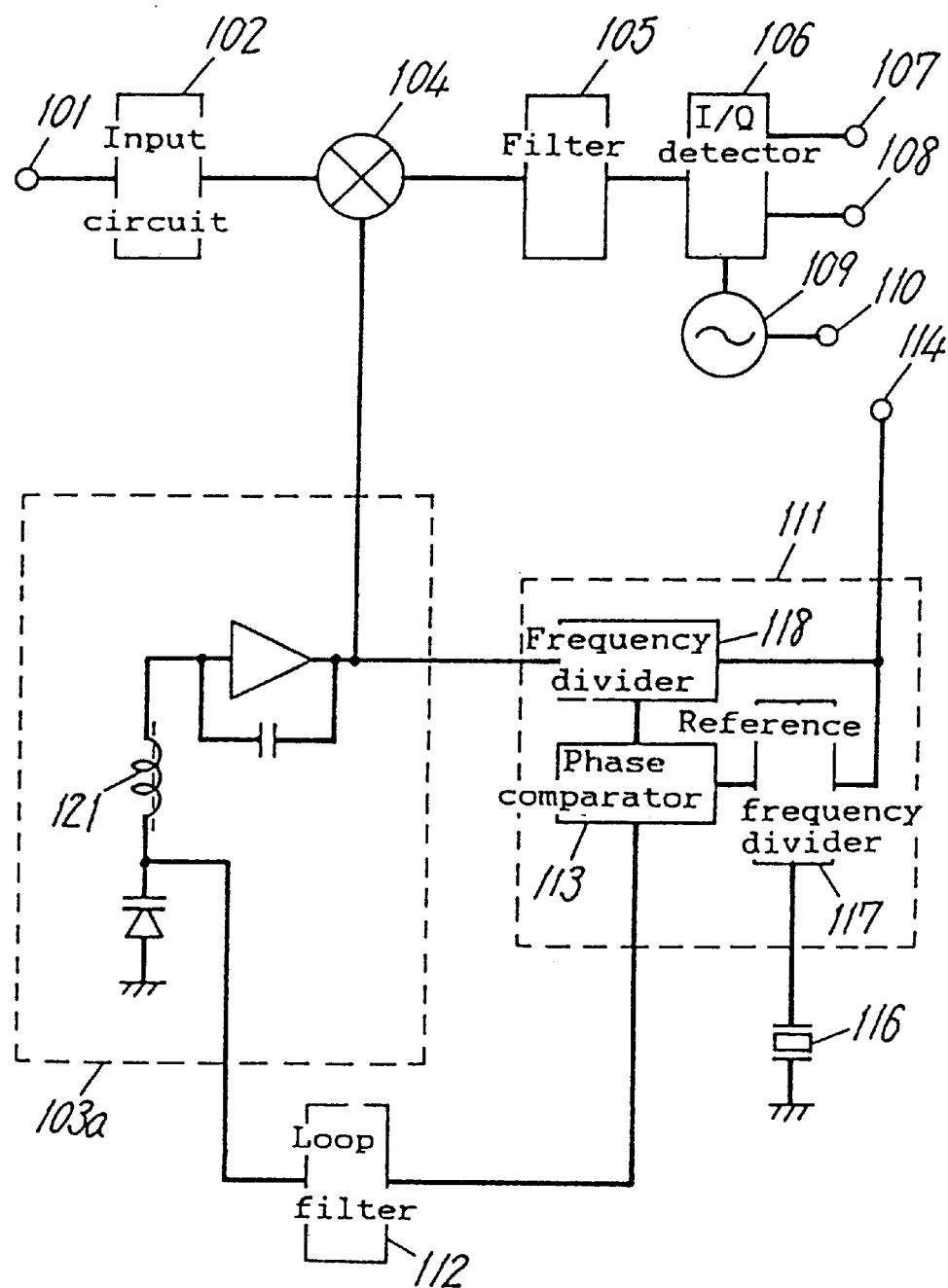
FIG. 4 is a block diagram showing high frequency apparatus according to Embodiment 2 of the present invention.

A second embodiment is shown in FIG. 4 and FIG. 5. FIG. 4 shows an example where the strip type transmission line 115,150, movable conductive member 119,149 and gluing agent 120 of FIG. 1, FIG. 2 or FIG. 3 have been replaced with inductance element 121.

Figure 5A:
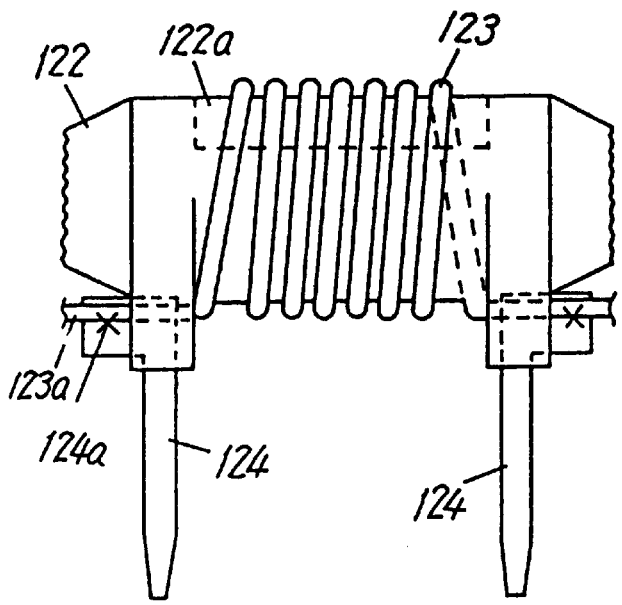
FIG. 5(a) is a front elevation of a first exemplary inductance to be used as the tuning section of local oscillator in the high frequency apparatus of FIG. 4.

FIG. 5(a) shows an example of the inductance element 121. The inductance element 121 is comprised of an insulated core 122 having an electrode 124 at both ends, and a coil 123 wound around the insulated core 122. The value of inductance element 121 is adjusted by changing the winding pitch of coil 123. This is done by inserting a tool, such as tweezers, in a groove 122a formed in the side opposite to electrode 124. The coil 123 of inductance element 121 stays stable against temperature cycles etc. without gluing, because it is wound around insulated core 122 and is maintained by friction with the insulator. Namely, the friction between coil 123 and insulated core 122 is the maintaining means. The coil 123 is also able to withstand some external force against deformation.

Because there is a dielectric loss in the insulated core 122, the phase noise generated in oscillator 103a has been reduced by raising the loop band width, in the same manner as in the previous exemplary embodiment. As a result, the phase comparative frequency of phase comparator 113 also rises. Regarding the increased frequency gap in the receiving frequency caused as the result of raised phase comparative frequency, coarse tuning of the receiving frequency is conducted at PLL 111 and first voltage controlled oscillator 103a, and fine tuning is conducted at AFC terminal 110 of second oscillator 109 of I/Q detector 106. A stable high frequency apparatus is thus implemented.

Figure 5B:
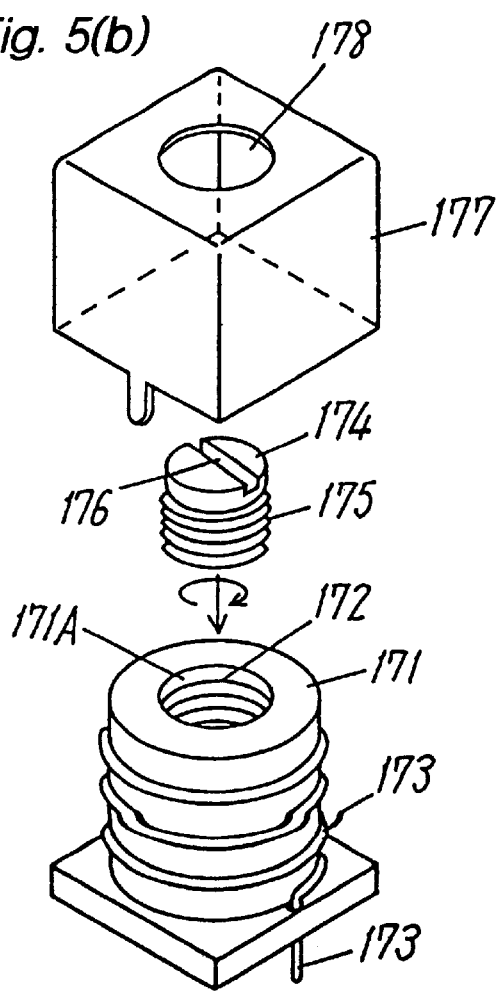
FIG. 5(b) is a perspective view showing assembly of a second exemplary inductance to be used as the tuning section of local oscillator in the high frequency apparatus of FIG. 4.
Figure 5C:
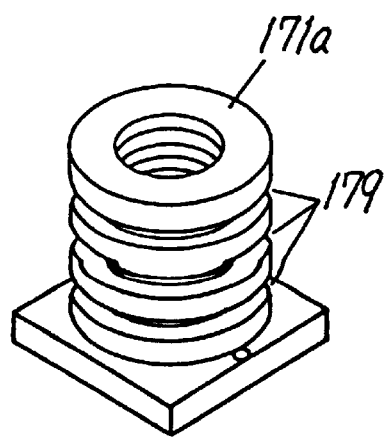
FIG. 5(c) is a perspective view of a third exemplary inductance.

FIG. 5(b) is another example of inductive element 121 of FIG. 4. In FIG. 5(b), numeral 171 denotes an insulator having a cylindrical shape, the inner wall surface of through hole 171A which is provided with a female screw 172. In order to insure strength, the bottom of through hole 171A may be sealed. Conductor 173 is wound around the outer surface of insulator 171. The outer surface has a column shape in the present example, but it is not so limited. Numeral 174 denotes a movable core formed with a magnetic material, which is provided with a male screw 175 on the outer surface fitting to the female screw 172 of through hole 171A. The movable core 174 is provided with a groove 176 at the top. By turning the movable core with a tool such as a screw-driver, for example, inserted in the groove 176, the movable core 174 makes fine up/down (in the FIG. ) movement inside the insulator 171. Metal shield case 177 covers the insulator 171. Hole 178 is provided at the top of shield case 177, through which hole the movable core 174 can be turned from the outside. It is also possible to provide a groove 179 in the outer surface of insulator 171a and to wind conductor 173 in the groove 179.

The inductance value is adjustable by tuning the movable core 174. As the conductor 173 has been wound around a core, it is not deformed easily even if an external force is extended. Further, as the movable core 174 is coupled with insulator 171 by means of a screw, and both are fixed together by a friction between the two(the friction is acting as the maintaining means), the position of movable core 174 is maintained fixed for a long term even without application of a gluing agent. Adjustment is easy because the inductance value is adjusted by a revolving motion. An inductance even more stable against vibration is obtained by providing a groove 179 around the outer surface of insulator and winding the conductor 173 around the groove 179, FIG. 5(c).

The oscillation characteristic of ting section, however, deteriorates due to the dielectric loss of insulator 171 and the magnetic loss of movable core 174. Therefore, the phase noise at voltage controlled oscillator 103a is reduced by raising the loop band width. As a result, the phase comparative frequency of phase comparator 113 also increases.

Regarding the increased frequency gap in the receiving frequency caused as the result of raised phase comparative frequency, coarse tuning of receiving frequency is provided at PLL 111 and first voltage controlled oscillator 103a, and fine tuning is provided at AFC terminal 110 of second oscillator 109 of I/Q detector 106. thus, a stable high frequency apparatus is implemented.

(Embodiment 3)

Figure 6:
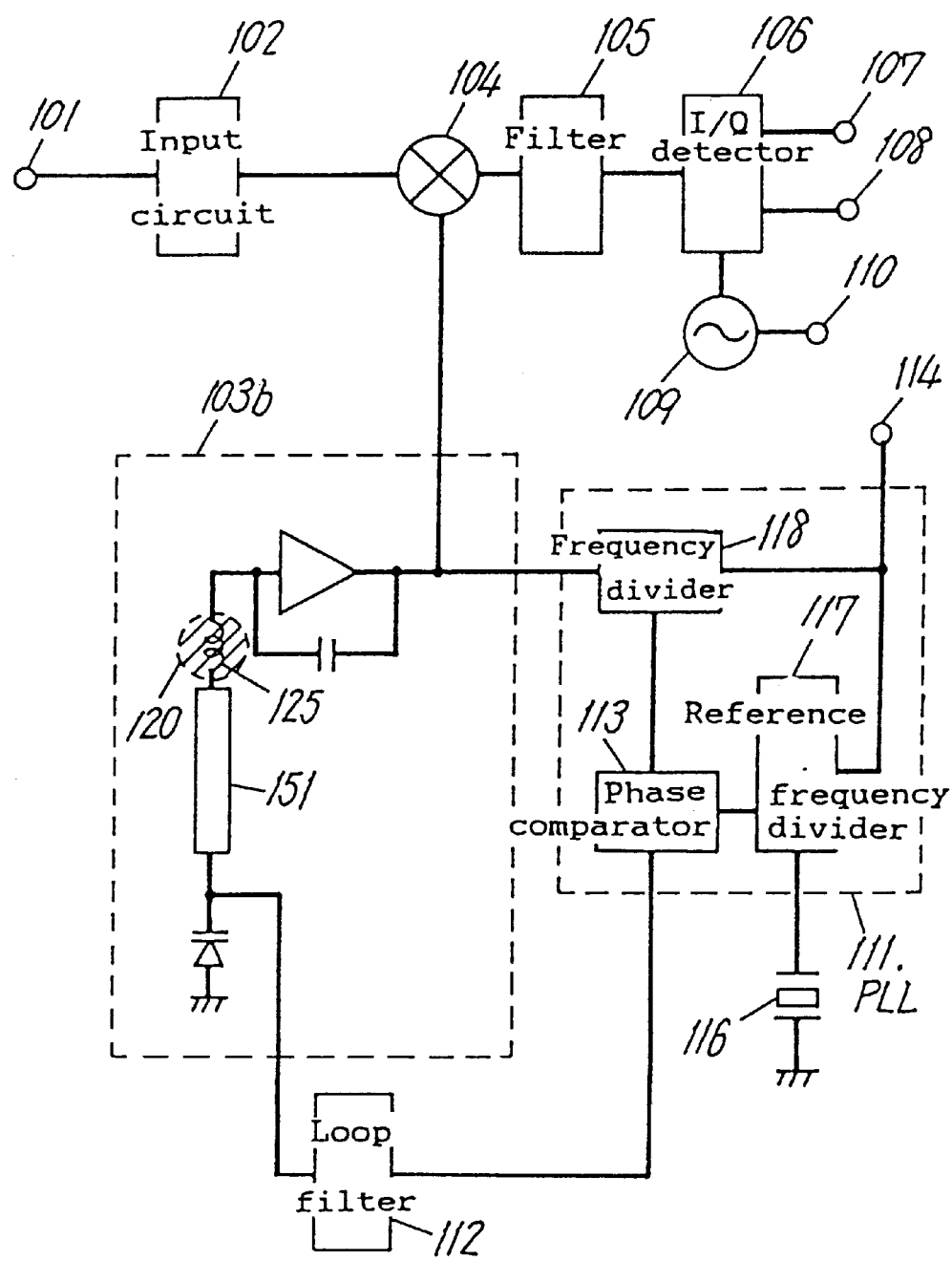
FIG. 6 is a block diagram showing high frequency apparatus according to Embodiment 3 of the present invention.

A third exemplary embodiment of the present invention is shown in FIG. 6 and FIG. 7. FIG. 7 is the first voltage controlled oscillator 103b of FIG. 6.

Figure 7A:
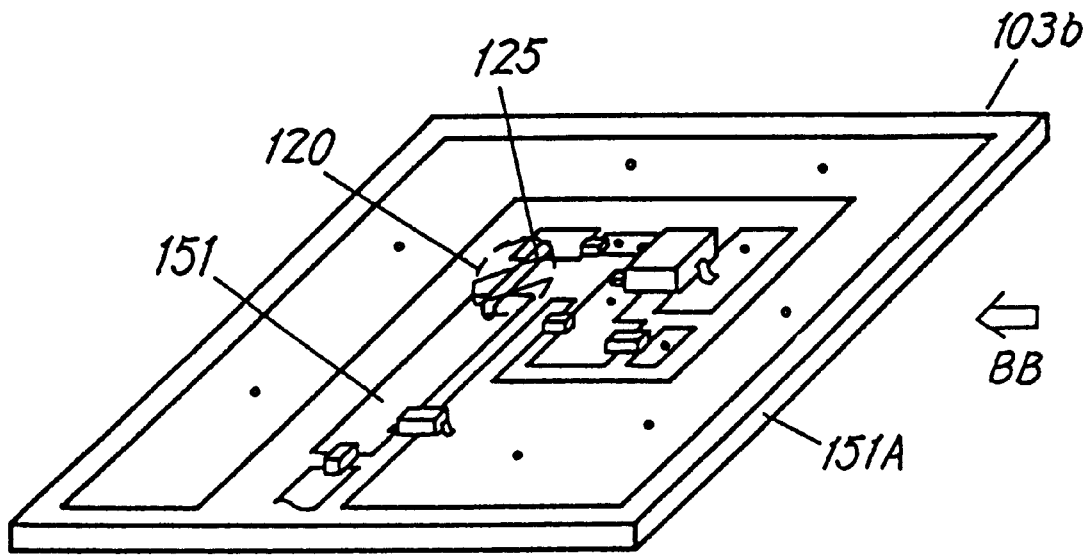
FIG. 7(a) is a perspective view of local oscillator in the high frequency apparatus of FIG. 6.
Figure 7B:
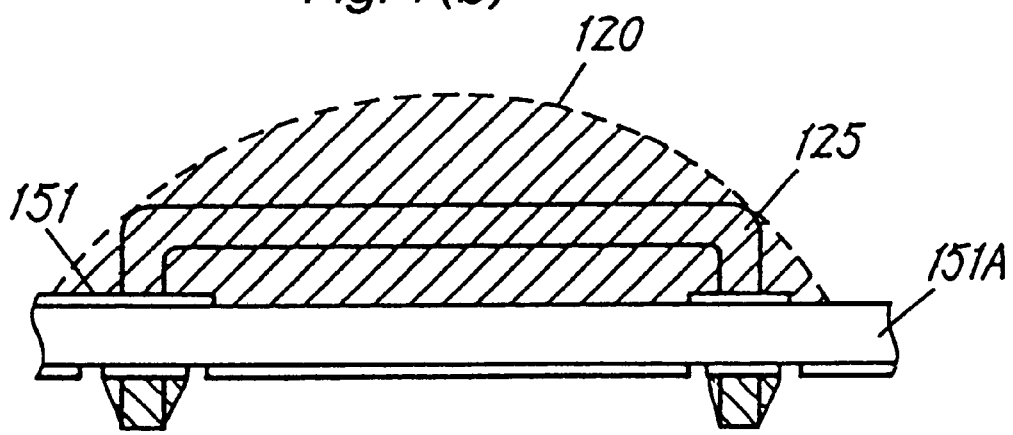
FIG. 7(b) is a side view showing adjusting section of the local oscillator of FIG. 7(a).

FIG. 7(a) shows an outline of the first voltage controlled oscillator 103b, FIG. 7(b) is a side view showing the vicinity of movable conductive member 125 as seen from line 7b—7b. An inductive element is formed with a movable conductive member 125 and a strip type transmission line 151. The variation of components constituting first voltage controlled oscillator 103b is absorbed through the adjustment of the movable conductive member 125, and then fixed with a gluing agent 120, against the change in temperature cycles, vibration, etc. Because movable conductive member 125 is provided connected in series to strip type transmission line 151 it is not necessary to dispose a movable conductive member in the vicinity thereof, as in the embodiment of FIG. 1. This contributes to reduce the required area of substrate 115A, and reduces the size of the apparatus.

Figure 7C:
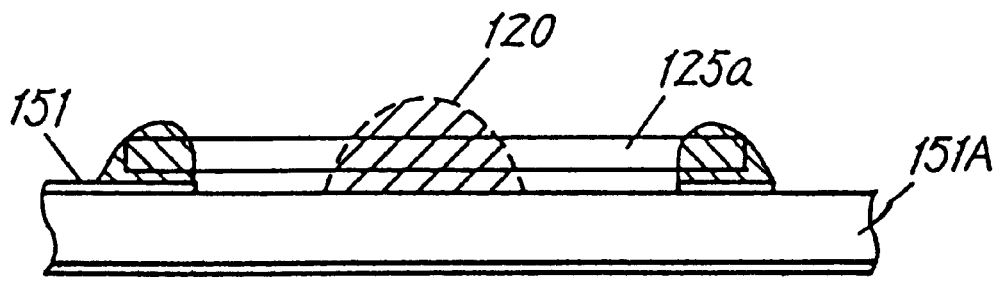
FIG. 7(c) is a side view of a second exemplary adjusting section.

A movable conductive member 125(a) as shown in FIG. 7(c) may be used for the movable conductive member 125. In this case, the movable conductive member 125a is not mounted through substrate 151A, but may be attached on the upper surface of substrate 151A for adjustment, and fixed with gluing agent 120 in approximately the middle of moveable conductive member 125.

(Embodiment 4)

A fourth exemplary embodiment of the present invention is shown in FIG. 8. FIG. 8(a) is a perspective view showing other example of a first voltage controlled oscillator, indicated as 103c. FIG. 8(b) is a cross sectional view of the key portion, FIG. 8(c) a perspective view of the key portion. FIG. 8(d) is a perspective view showing still another example.

Figure 8A:
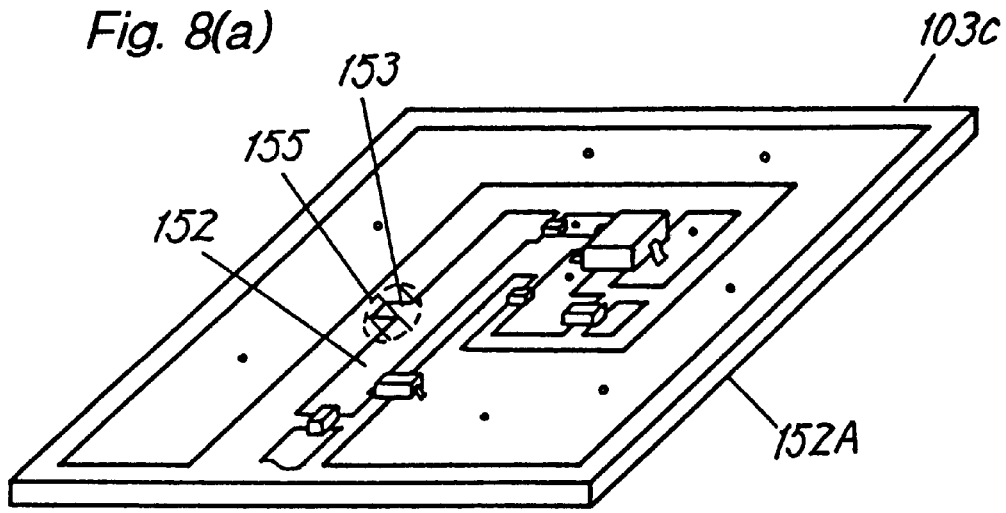
FIG. 8(a) is a perspective view of local oscillator according to Embodiment 4 of the present invention.
Figure 8B:
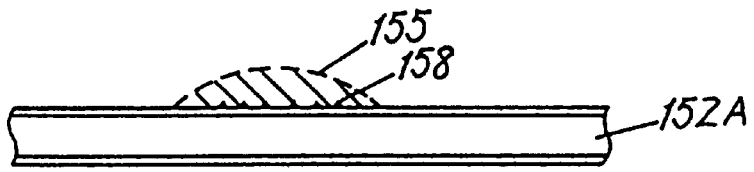
FIG. 8(b) is a side view showing adjusting section of the local oscillator of FIG. 8(a).
Figure 8C:
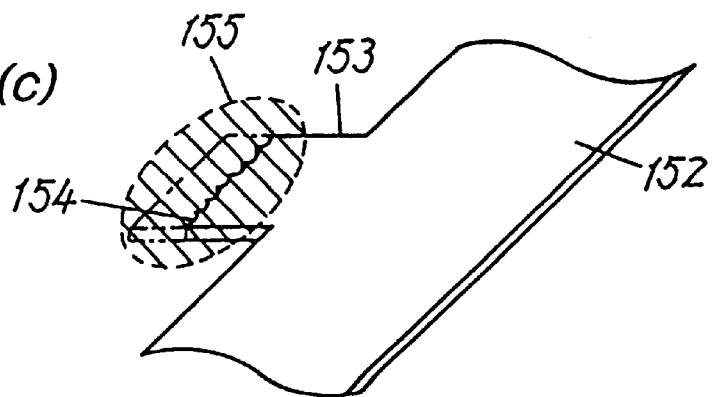
FIG. 8(c) is a perspective view showing adjusting section of the local oscillator of FIG. 8(a).

In FIG. 8(a), numeral 152 denotes a strip type transmission line constituting the inductance of tuning section. At a side of the strip type transmission line 152 is an extrusion 153 for adjusting the inductance value thereof. The inductance is adjusted to a specified value by laser-trimming the extrusion, as shown in FIG. 8(c). A cover material 155 is applied on a section 154. The reasons why the cover material is applied include; first, for protecting the section 154 exposed by cutting extrusion 153 from oxidation; second, preventing a change in the dielectric constant of the substrate which could be brought about as a result of absorption of humidity by a carbide formed when laser-trimming a resist (not shown) printed on the extrusion 153 including strip type transmission line 152, or that formed during laser-trimming conducted on a phenolic thermo-setting resin substrate 152A. Thus, an adjusted inductance value is maintained by virtue of the cover material 155.

However, when such a cover material 155 is employed the Q of tuning section drops due to dielectric loss of the cover material 155. Therefore, the phase noise at voltage controlled oscillator 103c is reduced by widening the loop band width of the control loop.

Figure 8D:
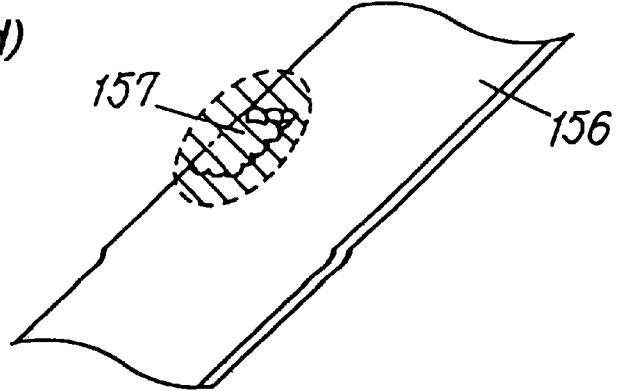
FIG. 8(d) is a perspective view of a second exemplary adjusting section.

The adjusting section may also be formed by laser-trimming the strip type transmission line 156 as an indention, as shown in FIG. 8(d). A laser-trimmed section 154 results in a rough surface 158; the application of cover material 155 is effective for protecting the rough surface 158.

(Embodiment 5)

Figure 9A:
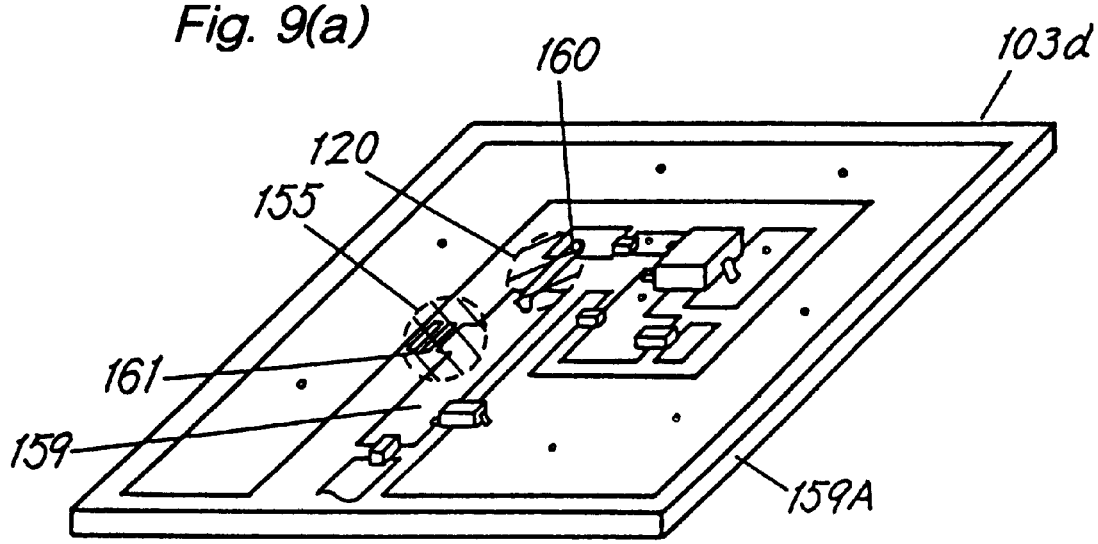
FIG. 9(a) is a perspective view of local oscillator according to Embodiment 5 of the present invention.
Figure 9B:
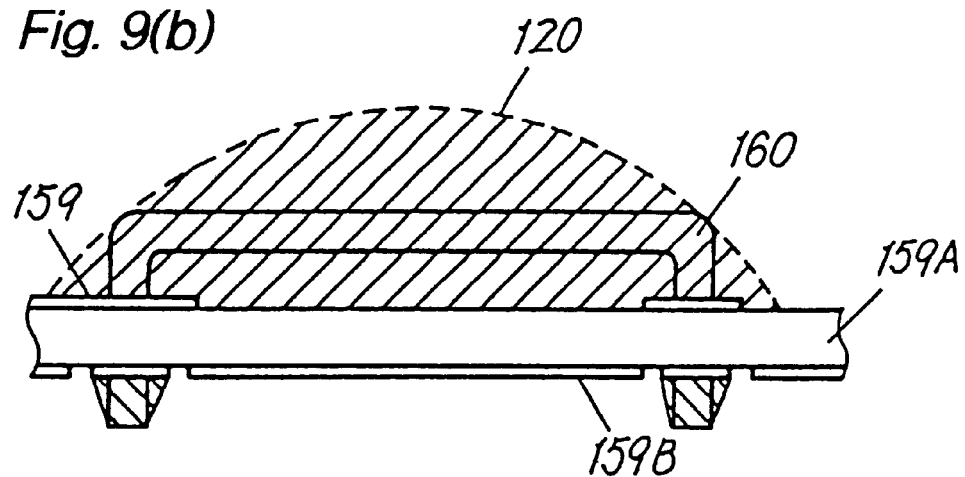
FIG. 9(b) is a side view showing movable conductive member of the local oscillator of FIG. 9(a).

In a fifth exemplary embodiment, 1 another exemplary first oscillator 103d is described, a perspective view of which is shown in FIG. 9(a). In FIG. 9, a strip type transmission line 159 provided on a substrate 159A, and forms a tuning section of a local oscillator. Movable conductive member 160 is connected in series with the strip type transmission line 159. Extruded adjusting section 161 is provided in a side of the strip type transmission line 159. Numeral 159B denotes a grounding pattern.

Figure 9C:
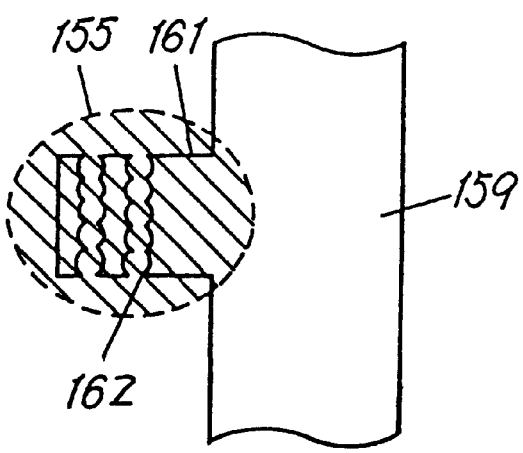
FIG. 9(c) is a plane view showing adjusting section formed in the pattern inductance of the local oscillator.

With the tuning section described above, an adjusting method will be described in the following. As shown in FIG. 9(c), the adjusting section 161 is roughly cut 162 by a laser, for example, for coarse adjustment of the inductance. Then, the inductance is fine-adjusted by movable conductive member 160. After being adjusted, a covering material 155 is applied to the adjusting section 161 so as to prevent oxidation of the cut section and the absorption of humidity by carbide formation as a result of carbonization of the substrate, or resist. A gluing agent 120 is applied to movable conductive member 160 for maintaining the adjusted value.

As described above, in the fifth exemplary embodiment adjustment is easy, because a coarse adjustment is done in adjusting section 161 and then fine-adjusted by movable conductive member 160. Thus, a precise adjustment is conducted.

In the fourth and fifth embodiments, laser trimming was described. However, trimming by drilling or other machining procedures also serve the same purpose.

In the fourth embodiment, the gluing agent described in embodiments 1, 2 and 3 is not used. However, deterioration of the oscillation characteristic of the tuning section arises when the inductive rate of the substrate material increases, creating a dielectric loss as a result of formation of a micro strip type transmission line on the substrate tuning section. Therefore, the phase noise is reduced by raising the loop band width, in the same manner as in described the embodiments 1, 2 and 3.

(Embodiment 6)

Figure 10:
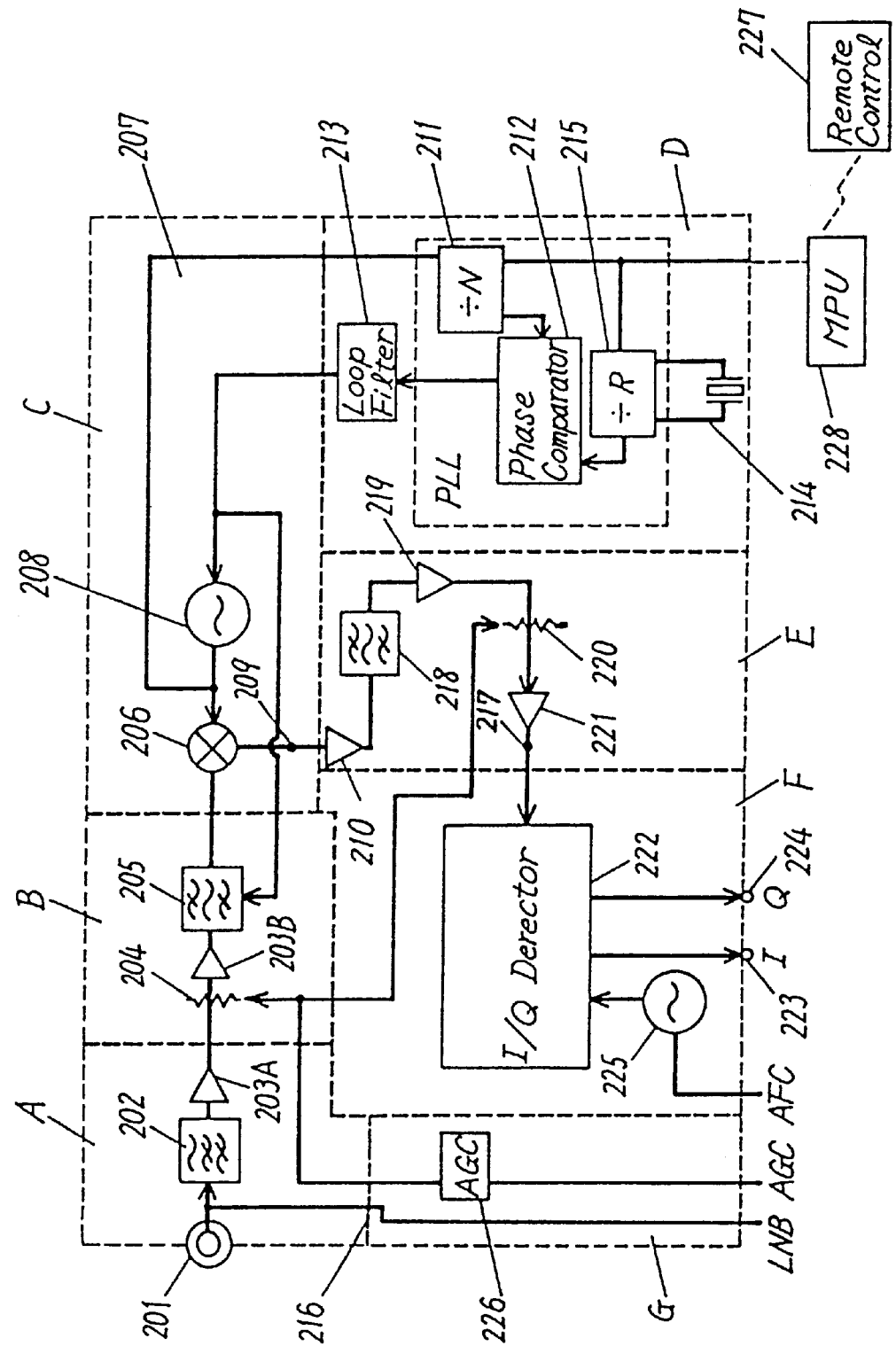
FIG. 10 is a block diagram of high frequency apparatus according to Embodiment 6 of the present invention.

In FIG. 10, numeral 201 denotes an input terminal, for receiving digitally modulated high frequency signals. To the input terminal 201, a high-pass filter 202, an amplifier 203A, a variable attenuator 204, an amplifier 203B and a tuning filter 205 are connected. The output of the tuning filter 205 is supplied to an input of a mixer 206. To the other input of mixer 206, an output signal from a voltage controlled oscillator 208 of local oscillator 207 is supplied, and output of the mixer 206 is delivered to an amplifier 210 via output terminal 209 of mixer 206. At the output of voltage controlled oscillator 208 of local oscillator 207, a frequency divider 211, a phase comparator 212 and a loop filter 213 are connected. The output of the loop filter 213 is delivered to the input of voltage controlled oscillator 208 and tuning filter 205. A signal from a quartz oscillator 214 is delivered as a reference signal to phase comparator 212 after being divided at a frequency divider 215.

A tuner section is constituted by blocks A, B, C, D and E defined by separating plate 216 indicated with dotted lines. An output terminal 217 of the tuner is provided in block E. Inside the block E, the amplifier 210, an intermediate frequency tuning filter 218, an amplifier 219, a variable attenuator 220 and an amplifier 221 are provided.

A block F is the I/Q detecting section; An I/Q detector 222 is connected to the output terminal 217 of the tuner section. The I/Q detector 222 has an output terminal 223 for outputting I signal and an output terminal 224 for outputting Q signal. A voltage controlled oscillator 225 is connected to the I/Q detector 222, for supplying frequency control voltage (AFC).

In a block G, a gain control circuit (AGC) 226 for supplying control voltage to tuner section is provided, and an AGC signal is delivered thereto. A voltage is supplied via input terminal 201 connected to an exterior antenna section to an exterior low noise converted (LNB). Thus, a signal of 1–2 GHz band, for example, is input through input terminal 201 which also functions as a voltage supply terminal.

Figure 11:
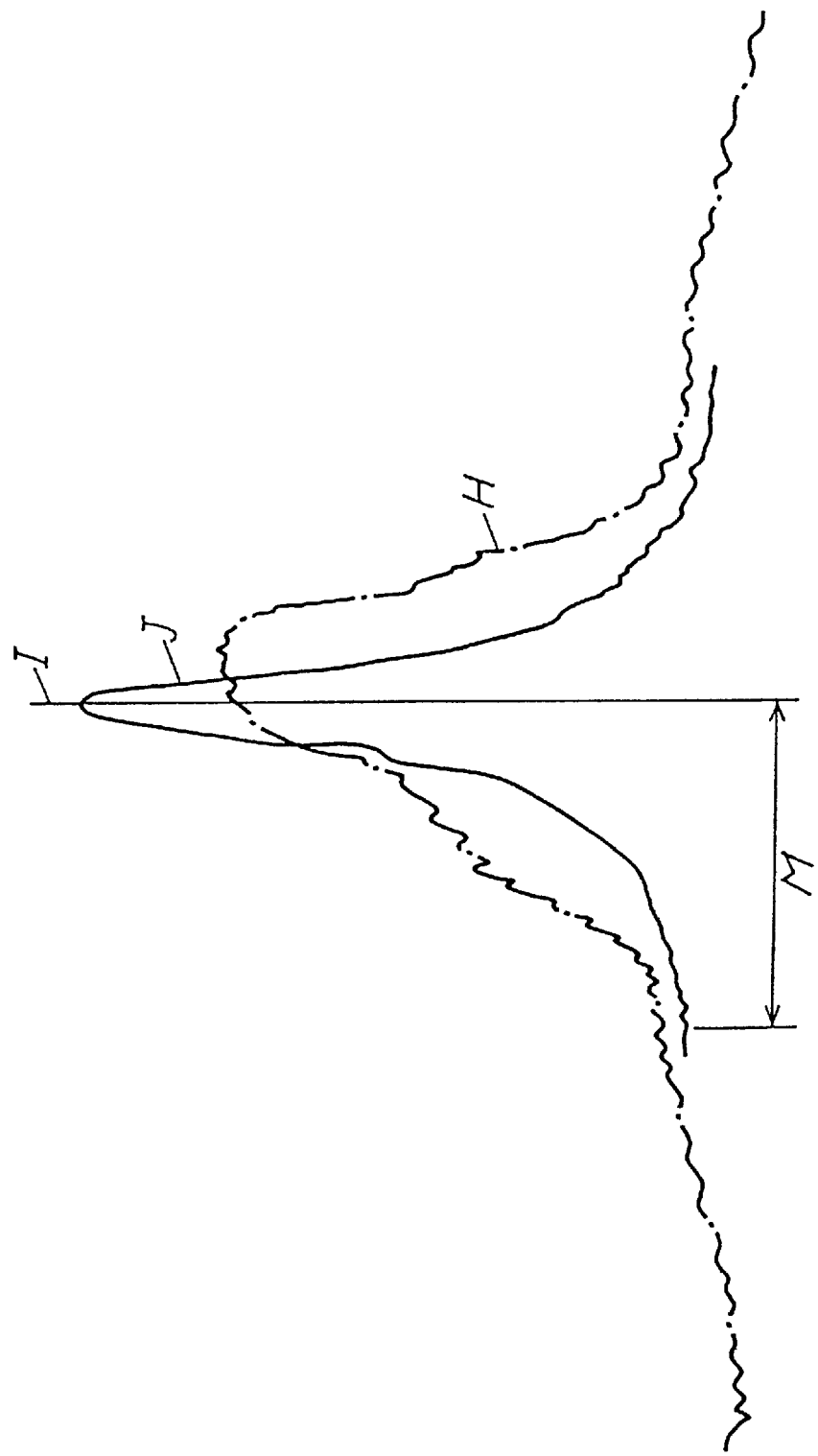
FIG. 11 is a first frequency characteristics chart for explaining characteristics of local oscillator of the high frequency apparatus of FIG. 10.

In the present embodiment, the frequency distribution characteristic of the output signal delivered from the voltage controlled oscillator 208 deviates widely deviates from a desired center frequency I (e.g. 1.8 GHz), as indicated by line H in FIG. 11. A control loop which is connected to the voltage controlled oscillator 208 and is comprised of a frequency divider 211, a phase comparator 212 and a loop filter 213, and a frequency divider 215 connected to phase comparator 212, and a quartz oscillator 214 are for correcting the distribution characteristic to a frequency distribution characteristic curve indicated by J.

In the present embodiment, the dividing ratio of frequency divider 211 is small(e.g. about 4000–7000) for raising the response characteristic. Meanwhile, the reference signal to be delivered from frequency divider 215 to phase comparator 212 is high (e.g. 360 kHz).

The noise component of voltage controlled oscillator 208 alone is removed by the control loop, and a desired frequency distribution characteristic having a minimal noise component is obtained as indicated by J in FIG. 11.

Figure 12A:
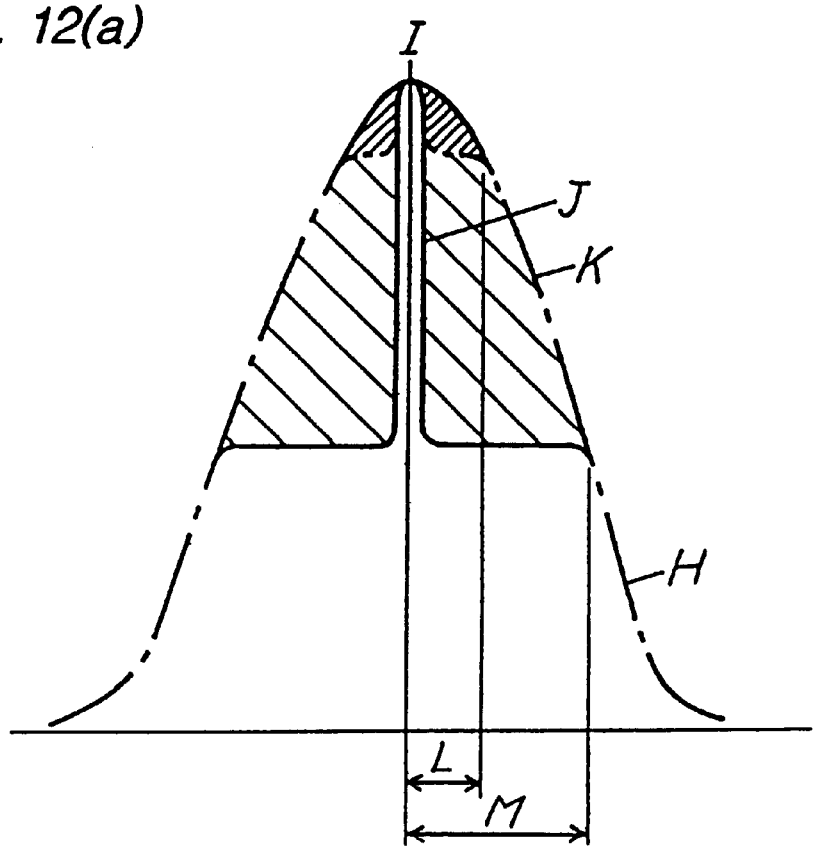
FIG. 12(a) is a second frequency characteristics chart for explaining characteristics of local oscillator of the high frequency apparatus of FIG. 10.

Now in the following, the effect of the loop band width is described referring to FIG. 12(a). If the loop band width of the control loop is narrow the frequency distribution characteristic of voltage controlled oscillator 208 alone(curve H) is not sufficiently corrected at the skirt portion, resulting in an unfavorable distribution(curve K). Namely, in FIG. 12(a), L indicates a case when the loop band width of the control loop is small, 5 kHz for example. In this case, the frequency is correctable up to 5 kHz above and below the center frequency I. In the further portion exceeding the loop band width of the control loop correction is not available.

Symbol M indicates a case when the loop band width of control loop is high. Suppose M is 7 kHz, the frequency is corrected up to 7 kHz above and below the center frequency I. As a result, a region corresponding to curve K is also converged very close to the center frequency I, as indicated by curve J. In this case, the noise region is decreased up to M, versus the noise region at L.

In the present invention, the loop band width of the control loop has been made large enough not to be dominated by noise from voltage controlled oscillator 208; symbol M in FIG. 11 and FIG. 12 (a) equals to approximately 7 kHz. As a result, an ideal output signal is obtained in which it is converged very close to center frequency I as indicated by J and is not dominated by noise of voltage controlled oscillator 208 even when the noise is large. As the above output is supplied to mixer 206, appropriate tuning and I/Q detection are performed. Furthermore, as the dividing ratio of frequency divider 211 is small the response at channel switching, for example, is very high.

The affection of reference frequency signal upon phase noise is described with reference to FIG. 12(b). An issue here is the signal level of the reference frequency signal to be delivered to phase comparator 212 having a same frequency excluding the substantially central frequency.

Figure 12B:
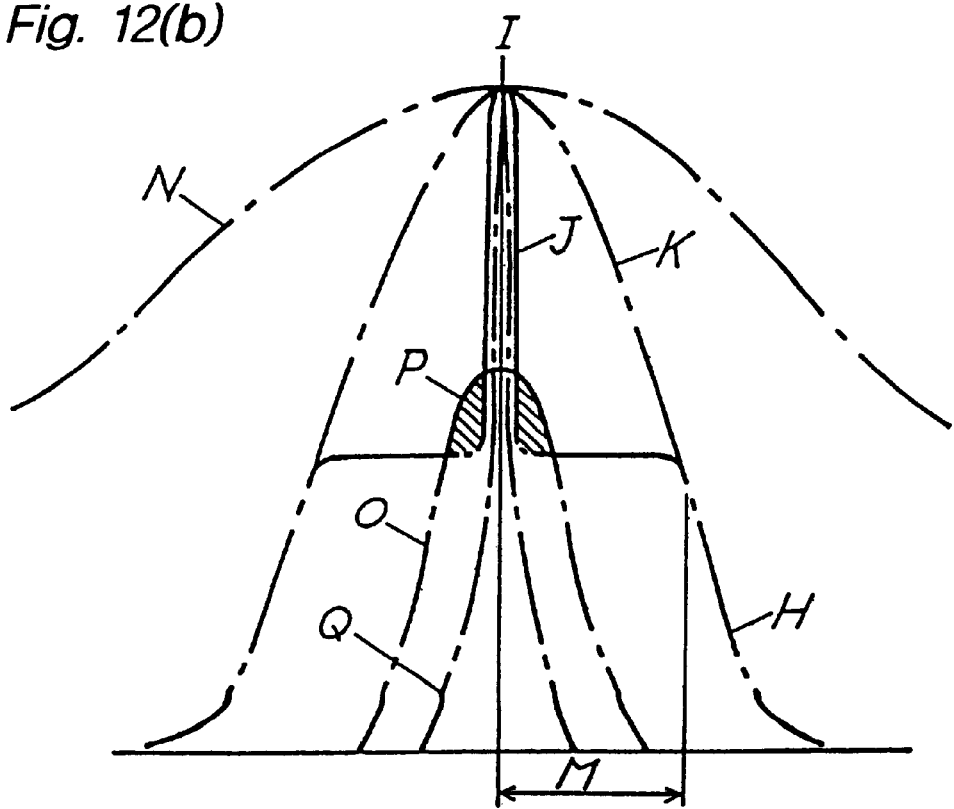
FIG. 12(b) is a third frequency characteristics chart for explaining characteristics of local oscillator of the high frequency apparatus.

In a case when the level of the reference frequency is greater than the level of the signal from voltage controlled oscillator 208 before correction by the loop band width (viz. comparative signal to be delivered from frequency divider 211 to phase comparator 212), as indicated by N in FIG. 12(b), or when the signal level of the frequency distribution characteristic in the vicinity of the center frequency of the reference frequency signal is larger, in comparison with the frequency distribution characteristic of the signal level in the vicinity of the center frequency output from local oscillator 207 to mixer 206, than a signal level to be corrected by the high loop band width in a same off-set frequency from the center frequency excluding an area substantially the center frequency (as indicated by O in FIG. 12(b)), correction by the control loop is difficult for the exceeding region as there is much reference frequency signal noise to be compared (for example, the shadowed portion by P of line O in the latter case in FIG. 12(b). Meanwhile, no correction at all for line N in the former case.) even if the loop band width was widened.

On the other hand, when a source of the oscillating reference frequency signal is selected, the level of which being purer than at least the signal of voltage controlled oscillator 208 before the correction by loop band width and not affecting the correction effect of a high loop band width (line Q in FIG. 12(b) for example), the correction effect of the high loop band width is available more economically.

In FIG. 10, numeral 227 denotes a controller for channel switching, etc. Signals from controller 227 are delivered to frequency dividers 211, 215 via a microprocessor unit 228.

Figure 13:
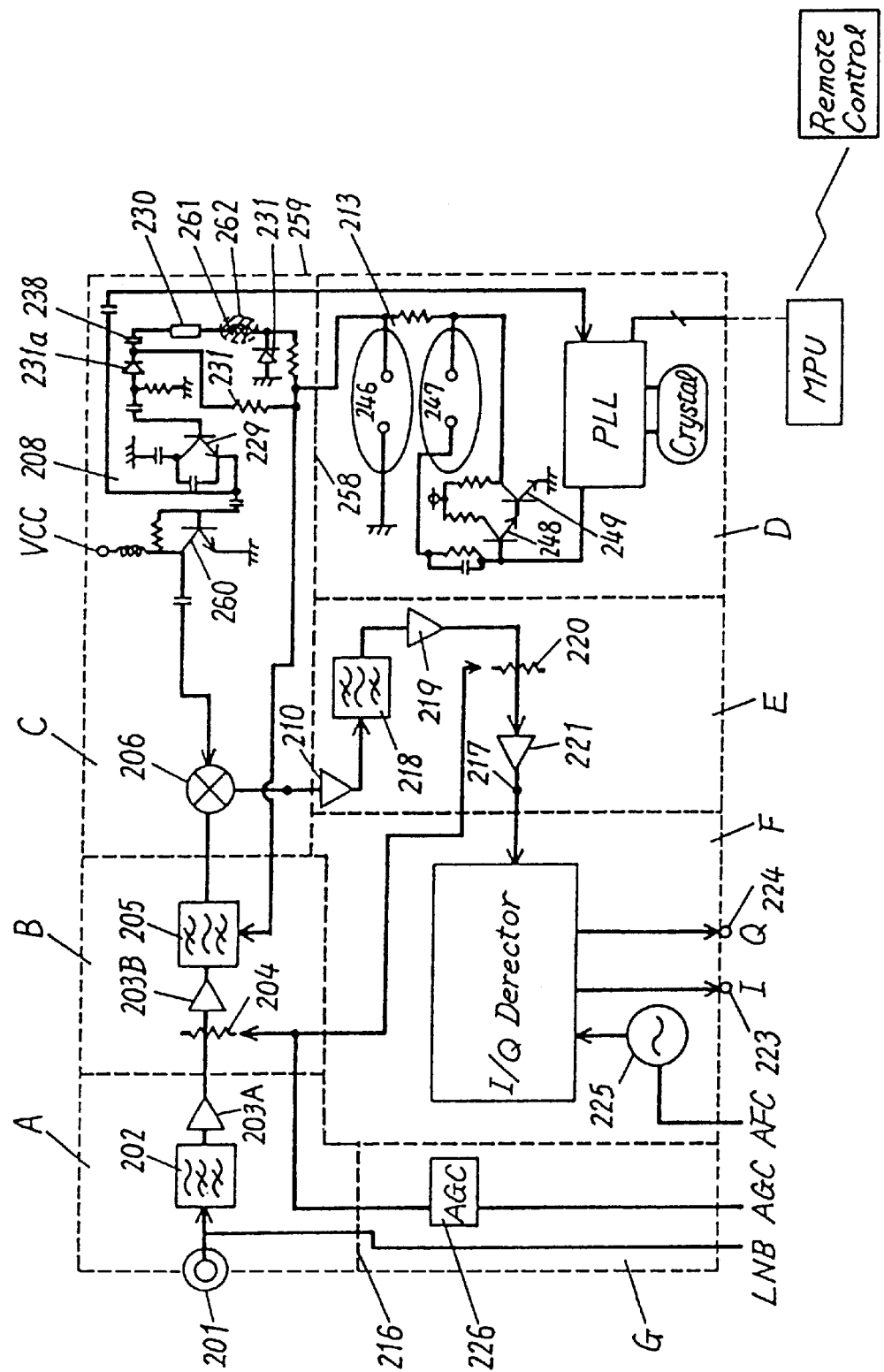
FIG. 13 is a detailed block diagram showing the high frequency apparatus of FIG. 10.
Figure 14A:
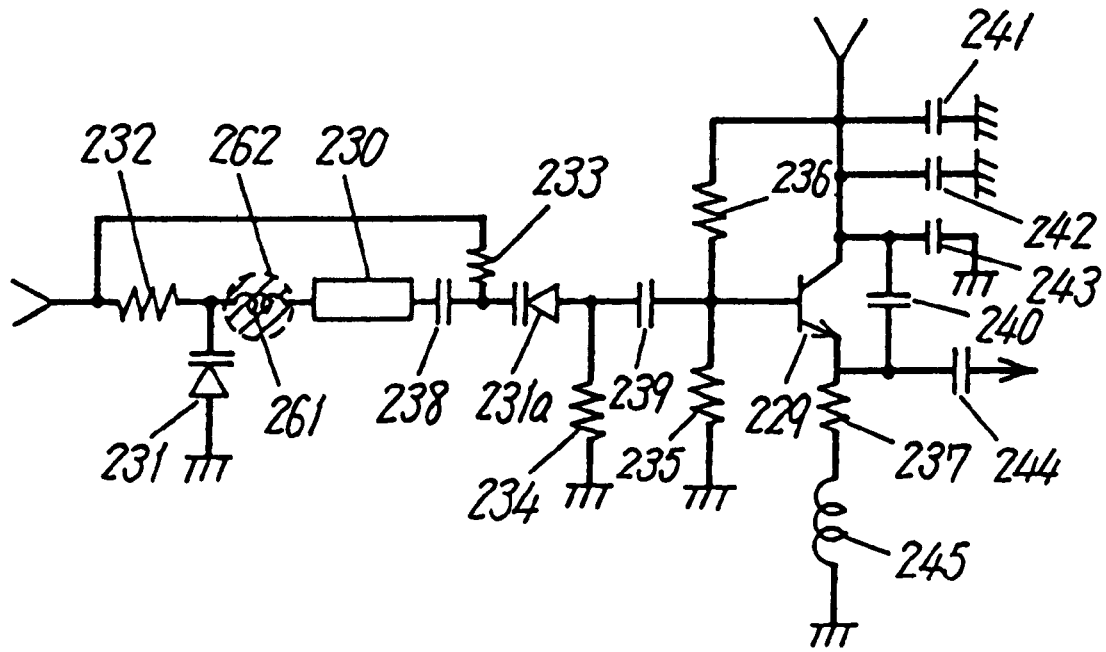
FIG. 14(a) is a first exemplary circuit diagram of voltage controlled oscillator of the high frequency apparatus of FIG. 10.

FIG. 13 illustrates the blocks C and D more in detail. Voltage controlled oscillator 208 is comprised of an oscillating section having a transistor 229 as the main component and a tuning section having a strip type transmission line 230 provided on substrate and varactor diodes 231, 231a. FIG. 14(a) simply illustrates the above described constitution. In FIG. 14(a), numerals 232, 233 and 234 denote resistors for applying voltage, 235, 236 and 237 are resistors for bias, 238 and 239 are capacitors for temperature compensation, 240 is a capacitor for feedback, 241, 242 and 243 are capacitors for grounding, and 244 is a capacitor for output.

Numeral 245 denotes an inductance for impedance aligning, which is formed on the substrate in a certain pattern shape. Numeral 261 denotes a movable conductive member for adjusting the inductance of the tuning section, which was described above in detail in the third and fifth embodiments. Numeral 262 denotes a gluing agent, which is intended as in the foregoing embodiments to fix the movable conductive member 261 for maintaining the inductance value stable for a long term.

Figure 15:
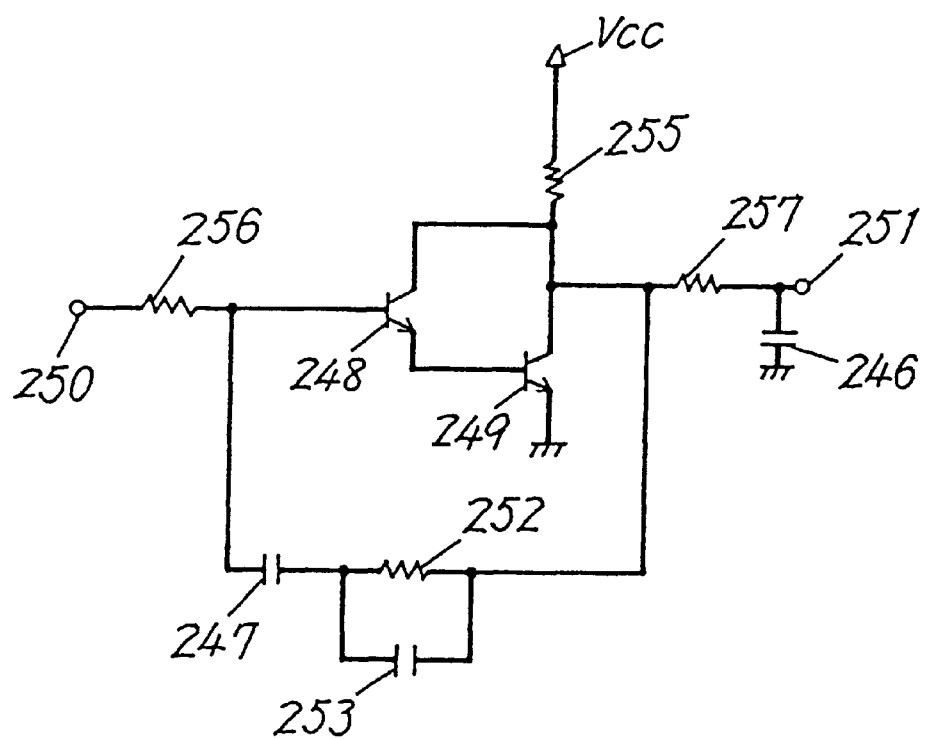
FIG. 15 is a circuit diagram showing loop filter of local oscillator in the high frequency apparatus of FIG. 10.

Returning to FIG. 13, a loop filter 213 is comprised of capacitors 246, 247 and transistors 248, 249, etc., detail of which is shown in FIG. 15. A signal from phase comparator 212 is input from an input terminal 250, amplified by an amplifier comprised of darlington-connected transistors 248 and 249, and provided to an output terminal 251. A part of the signal goes via capacitor 247 to transistor 248 as feedback, by which a filtering operation is performed.

In FIG. 15, numeral 253 denotes a capacitor, 255, 256 and 257 resistors. Film capacitors have been used for the capacitors 246 and 247, with the view to an anti-vibration property. Namely, if ceramic capacitors are used for these capacitors unwanted voltage is generated by the piezoelectric effect due to vibration, which deteriorates the phase noise. Therefore, film capacitors with lead wires, which bear least piezoelectric effect, have been employed.

In FIG. 13, the capacitor 246 is a film capacitor, which has a considerably large size. Taking advantage of the size, an opening provided in a separating plate 216 disposed between blocks C and D for allowing a line 258 which connects capacitor 246 and strip type transmission line 230 to go through is covered with the capacitor 246, by disposing the capacitor 246 in block D at a place close to the opening. The above structure is one of considerations to suppress the transmission of noise between block C and D through the opening as small as possible.

The film capacitors 246, 247 are vulnerable to high temperature. These capacitors 246, 247 are mounted on the substrate by inserting the lead wires into through holes of the substrate to be soldered with a conductive pattern provided on the back surface of substrate. What is important is that neither of the through holes is provided with electrode in the inside. This is for preventing the solder from going into the through hole and conveying the heat to capacitors 246, 247.

The strip type transmission line 230 has been disposed close to the separating plate 216 or wall of metal case 259 of C, in FIG. 13. This is part of the consideration to suppress noise invading onto the strip type transmission line 230 as much as possible. In FIG. 13, a transistor 260 is for amplifying signals.

In FIG. 14(a), a small capacitance (several pF–several tens pF) chip capacitor 238 is placed between strip type transmission line 230 and varactor diode 231a, for raising the impedance of the line. The above represents a consideration to minimize an influence to be caused by substantial change in the length, etc. of the lead wire of varactor diode 231a, which occurs as a result of soldering, etc.; through raising of the impedance by the chip capacitor 238.

The varactor diode 231a is heavier than the chip capacitor 238, and no self-alignment effect is expectable in a reflow soldering. Therefore, substantial length of lead wires disperses and the impedance is not uniform. On the other hand, as the chip capacitor 238 is light in weight, the mounting position becomes uniform because of the self-alignment effect in reflow soldering. Therefore, the inductance of strip type transmission line 230 becomes uniform. Although there is a possibility for the inductance between chip capacitor 238 and varactor diode 231a to disperse, the dispersion of oscillation frequency is suppressed by the high impedance brought about by the chip capacitor 238.

A further smooth temperature compensation characteristic is presented by providing a chip capacitor 239, in addition to the chip capacitor 238, as the temperature compensation capacitor, as shown in FIG. 14(a). Thus a voltage controlled oscillator is implementable that functions stably in view of temperature change.

Figure 14B:
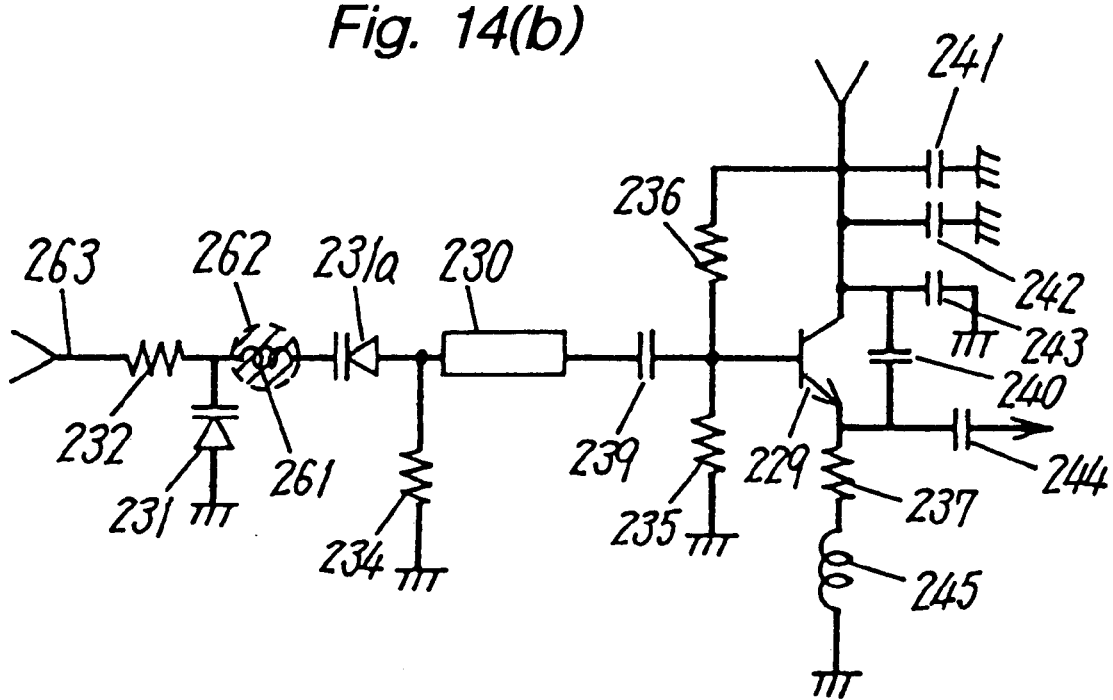
FIG. 14(b) is a second exemplary circuit diagram of voltage controlled oscillator of the high frequency apparatus.

FIG. 14(b) shows an exemplary embodiment, in which the chip capacitor 238 in FIG. 14(a), being provided for reducing the dispersion around strip type transmission line 230, is eliminated, yet a favorable tuning section is presented. In FIG. 14(b), an input terminal 263 of oscillation frequency control voltage is connected to the cathode of a varactor diode 231 via a resistor 232, ?? the anode grounded. Between the connecting point of the resistor 232/varactor diode 231 and an oscillating transistor 229, a movable conductive member 261, a varactor diode 231a and a strip type transmission line 230 are serially connected in order, with the strip type transmission line 230 connected to the transistor 229. The inductance of movable conductive member 261 being approximately 6 nH, the strip type transmission line 230 being formed by a printed pattern, 4–6 mm long, and approximately 1 mm wide.

Now in the following, description will be made on a supposed structure where both movable conductive member 261 and strip type transmission line 230 are disposed between the cathodes of varactor diodes 231 and 231a, As there exists, between the varactor diodes 231 and 231a, the stray capacitance of both movable conductive member 261 and strip type transmission line 230, the tuning frequency range becomes broader in proportion to the size of the stray capacitance than in a case where the cathodes of varactor diode 231 and varactor diode 231a are simply connected. The tuning frequency range may be broadened to a certain desired range. However, if broadened too much, exceeding the range the tuning sensitivity, the ratio of tuning frequency shift with respect to the capacitance change in varactor diode 231a increases, therefore, when noise is injected in the loop filter 213, a resultant voltage causes a larger change in the frequency of voltage connection oscillator. This invites a drawback of increased phase noise. Therefore, there is desirably an optimum value in the stray capacitance between varactor diodes 231 and 231a.

When an effort is made to reduce the value of the stray capacitance of movable conductive member 261 and strip type transmission line 230 in search for the optimum value, the surface area becomes small in each of the two. As a result, the resistance increases due this loss of surface area by surface effect, and the Q value decreases deteriorating the phase noise. This means that the values of respective stray capacitance are desirably higher than a certain specific level, which poses a limit in lowering the tuning sensitivity.

It is known that, in order to optimize the stray capacitance between the varactor diodes 231 and 231a either the movable conductive member 261 or strip type transmission line 230 has to be moved to a region between varactor diode 231a and oscillating transistor 229. It is important, in this case, to move the strip type transmission line 230, not the movable conductive member 261. With the above structure, where the strip type transmission line 230 having fixed inductance is disposed in the side of oscillating transistor 229, unstable coupling, due to harmonic mode, does not occur, making adjustment easy. If the movable conductive member 261 is disposed in the side of transistor 229 the movable conductive member 261 and the transistor 229 get close to each other, and unstable coupling occurs due to harmonic mode, depending on how the movable conductive member 261 is adjusted. Therefore, a stable oscillation is not obtainable.

In a case where there are elements of, for example, a variable capacitance varactor diode 231a of approximately 1 pF–15 pF, a strip type transmission line 230 and a movable conductive member 261 for adjusting, the timing sensitivity may be lowered further, within a range where appropriate tuning is secured(oscillation frequency range 1330 MHz–2700 MHz), by disposing the movable conductive member 261 in a region between cathodes of varactor diodes 231 and 231a. In the above structure, the varactor diode 231a is disposed in between without substantially splitting the movable conductive member 261 or the strip type transmission line 230. Therefore, the mounting efficiency is high, while the securing of tuning of input signal and the reduction of phase noise are well balanced.

In the following, description is made on obtaining a large loop band width. Referring to FIG. 10, the reference frequency may be raised by making the dividing ratio of a frequency divider for dividing a signal from quartz oscillator 214 small, and the loop band width may be large by lowering the frequency dividing as a loop. However, this results in a coarse steps in station tuning and dislocation in receiving channel selection. The dislocation may be minimizes and a higher loop band width may be implemented maintaining a desired tuning by varying the dividing ratio of frequency divider 215 to about 10–20%, depending on the channel.

The relationship is represented in (Formula 1), where local oscillation frequency is Fvco, 64/65 2-modules type main counter is N, swallow counter is A, reference signal frequency is Xtal, and the dividing ratio of the reference frequency divider is R:

(Formula 1)

$$Fvco=(64N+A)(Xtal/R)$$

For example; Fvco=1800 MHz, Xtal=16 MHz, R=32, then (N, A)=(56, 16). Even if A is stepped up, it is variable by 16/32=0.5 MHz step. However, if R=33, (N, A)=(58, 1), then it turns to (Formula 2), making a fine tuning by 0.24 MHz steps possible. Thus, fine tuning is implemented while maintaining the high loop band width characteristic.

(Formula 2)

$$Fvco=(6458+1)(16/33)=1800.24$$

The higher the output frequency of voltage controlled oscillator 208, the lower the frequency control sensitivity of voltage controlled oscillator 208. As a result, the phase noise improvement effect due to the high loop band width is diminished in the vicinity of output frequency. Therefore, the phase noise is improved by making the loop band width high, through a setting where the dividing ratio of the reference frequency divider becomes smaller with increasing output frequency.

As an example, in a case where the low frequency Fvco1=1488 MHz and the high frequency Fvco2=2500 MHz, calculations using (Formula 1) with dividing ratios of reference frequency divider R1=45 and R2=32 yield (Formula 3) and (Formula 4), respectively.

(Formula 3)

$$1488=(6465+25)(16/45)$$

(Formula 4)

$$2500=(6478+8)(16/32)$$

The output frequency is set through the above described formulae. Namely, the high loop band width has been implemented by setting reference frequency at, for the case of low frequency, Fvco1 16/45=0.35 MHz, for the case of high frequency, Fvco2 16/32=0.5 MHz.

Next, variable attenuators 204, 220 will be described. In FIG. 10 and FIG. 13, an AGC 226 delivers control voltage to both of the variable attenuators 204 and 220. The variable attenuator 204 in the fore stage varies the input level for controlling the mixed modulation arising at a mixer 206 with multiple signals of strong electric fields. The total gain is controlled by the variable attenuator 220, the operational range of which being larger than 50 dB. A wide input range is thus implemented.

(Embodiment 7)

Figure 17:
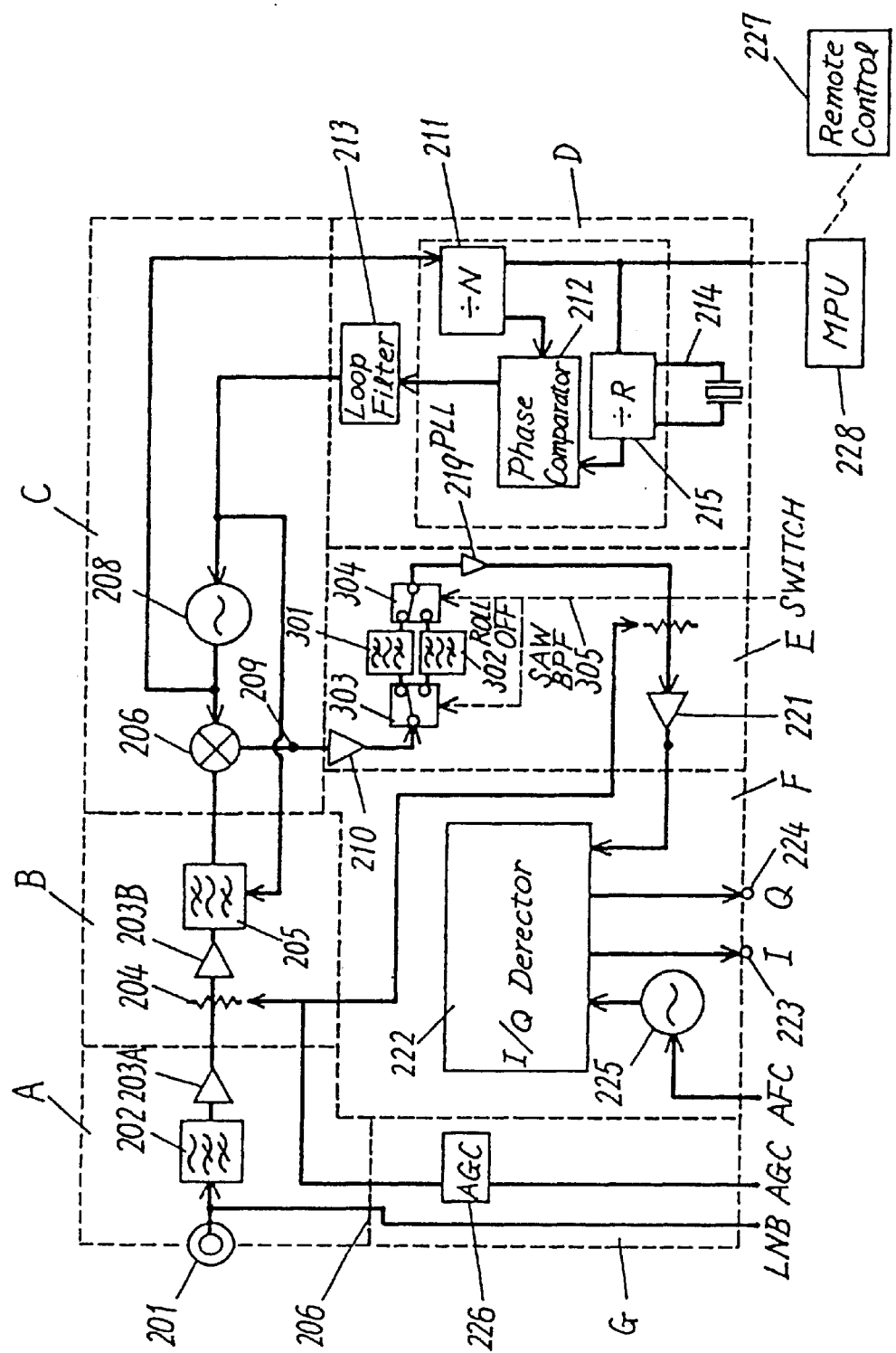
FIG. 17 is a block diagram of high frequency apparatus according to Embodiment 7 of the present invention.

An intermediate frequency tuning filter having a roll-off characteristic is described in the following. FIG. 17 shows other example of block E of FIG. 10 and FIG. 13. Numerals 303, 304 denote switches, and 301, 302 intermediate frequency tuning filters each having a roll-off characteristic and different band width. The switches 303 and 304 are interlocked and operated by an external switching signal 305, allowing an intermediate frequency signal to go selectively through the intermediate frequency tuning filter 301 or 302. Thus, high frequency signals are received in an optimum state even if the band width of the signals differs due to different transmission rate.

(Embodiment 8)

Figure 18:
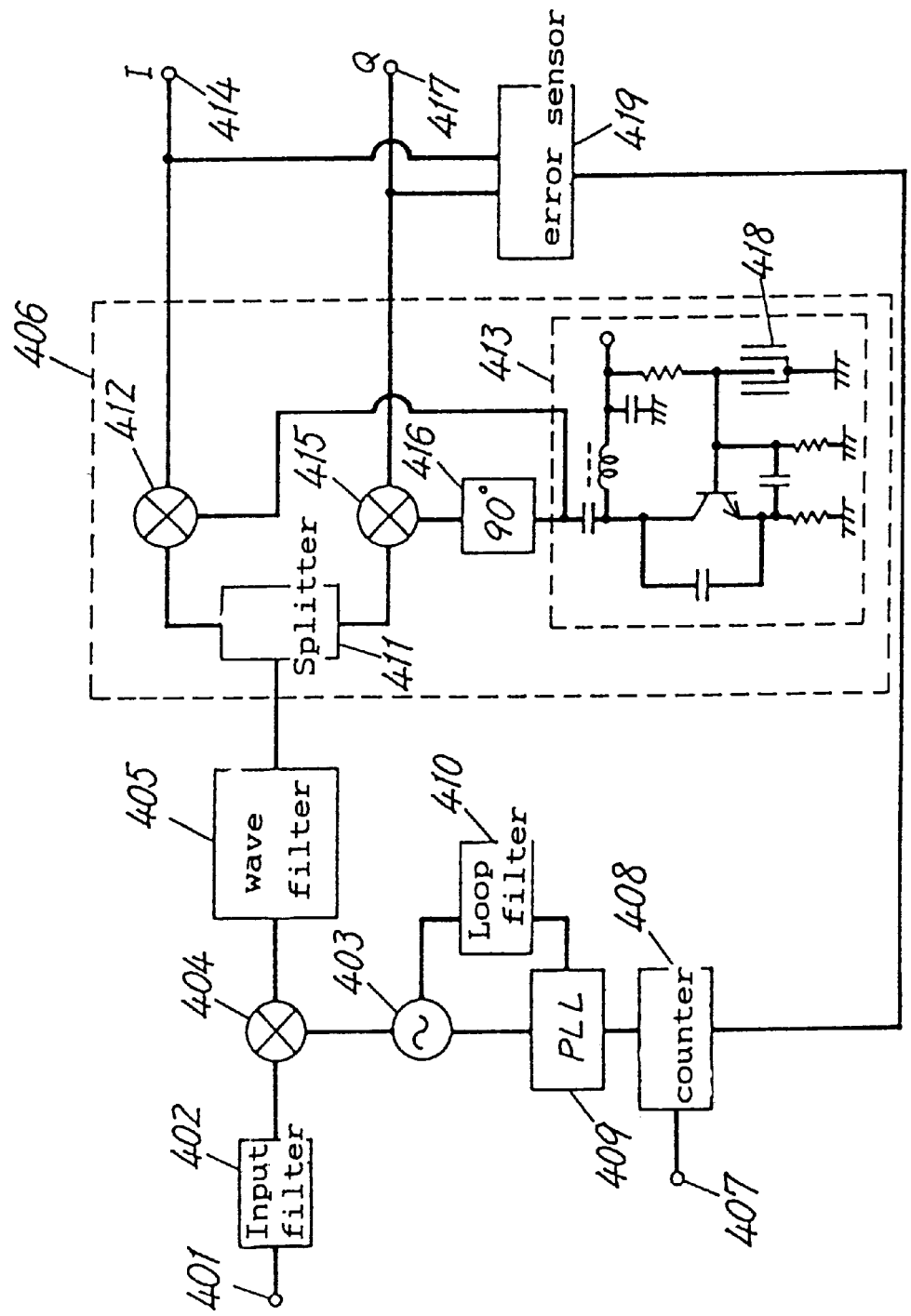
FIG. 18 is a block diagram of high frequency apparatus according to Embodiment 8 of the present invention.
Figure 19D:
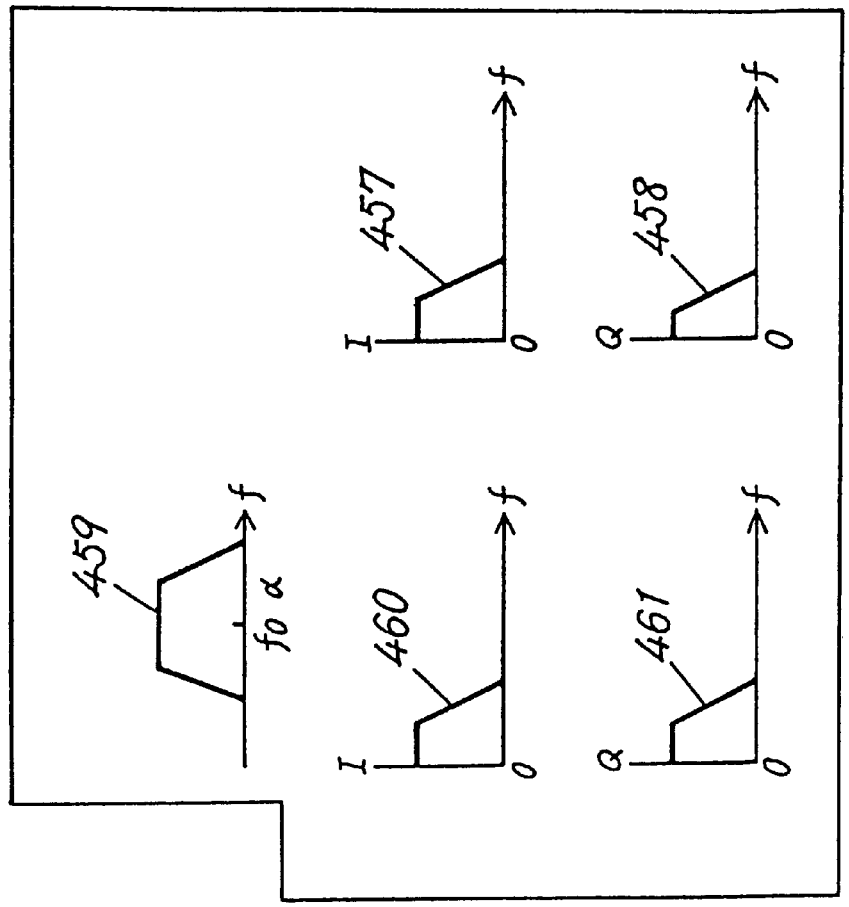
FIG. 19(d) are wave form charts showing key portions of wave forms in the high frequency apparatus of FIG. 18.
Figure 19A:
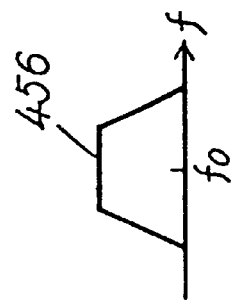
FIG. 19(a) is a IF signal
Figure 19B:
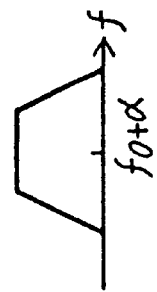
FIG. 19(b) is a frequency band characteristic of IF tuning surface acoustic wave filter.
Figure 19C:
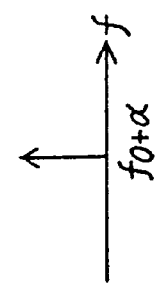
FIG. 19(c) is I/Q detector second oscillator.

An exemplary embodiment 8 of the present invention is described in the following. Referring to FIG. 18, a high frequency apparatus according to the present invention comprises an input terminal 401 for receiving high frequency digital signals, an input filter 402 connected to the input terminal 401, a mixer 404 which receives the output of input filter 402 at one input and one output of a first oscillator 403 at the other input, an intermediate frequency tuning surface acoustic wave filter 405 to which the output of mixer 404 is delivered, an I/Q detector 406 to which the output of intermediate frequency tuning surface acoustic wave filter 405 is connected, a control data input terminal 407 for receiving frequency control data, a PLL 409 connected to the control data input terminal 407 via an adding/subtracting counter 408, the PLL 409 being connected to the other output of the first oscillator 403, and a loop filter 410(hereinafter referred to as low-pass filter) connected between output of the PLL 409 and input of the first oscillator 403.

The I/Q detector 406 is connected to a splitter 411 which is connected to the output of the intermediate frequency tuning surface acoustic wave filter 405, a first detector 412 which is connected to one output of the splitter 411 at one input, to the other input of first detector 412 output of a second oscillator 413 is connected, and the output of first detector 412, or I signal output, is delivered to a first output terminal 414.

A second detector 415 coupled with other output of the splitter 411 at one input is connected to a quadrature splitter 416 at the other input, and the second oscillator 413 is connected to the input of quadrature splitter 416.

The Q signal output of the second detector 415 is connected to a second output terminal 417. The second oscillator 413 is comprised of a resonance element employing a surface acoustic wave resonator 418, with the same material being used for the substrate of the surface acoustic wave resonator 418 and the substrate of the intermediate frequency tuning surface acoustic wave filter 405. A frequency error sensor 419 to which the I signal output and the Q signal output are connected is connected to the adding/subtracting counter 408.

In the following, the operation of above described high frequency digital signal receiver is described. The oscillation frequency of first oscillator 403 is determined by a control data first inputted to the control terminal 407. Intermediate frequency signal 456 obtained therefrom is shown in FIG. 19; the intermediate frequency signal 456 is centered at f0.

Due to change in external temperature etc., the center frequency f0 of intermediate frequency tuning surface acoustic wave filter 405 and the oscillation frequency f0 of the second oscillator shift together by about f0+a, because the substrate of the both items uses a same material. If the intermediate frequency signal stays in the same state as 456, symmetry between the base band signal 457 of I signal output and the base band signal 458 of Q signal output is corrupted as the center frequency of intermediate frequency tuning surface acoustic wave filter 405 shifts by about f0+a due to change of external temperature etc. This is especially true where the base band signal bandwidth of Q signal output becomes narrow, and the detection error rises.

Therefore, the first oscillator 403 is controlled according to the frequency error of the base band signal by the adding/subtracting counter so as the intermediate frequency signal becomes f0+a, as indicated by numeral 459 in FIG. 19(*d*). As a result, the base band signal 460 of I signal output and the base band signal 461 of signal output are balanced, and no detection error arises.

In a case where the 3 dB cutoff frequency band width of intermediate frequency tuning surface acoustic wave filter 405 is made to be greater than −0% within +5% of the frequency band width which being equal to symbol rate of receiving signal, a roll-off filter may be eliminated; which otherwise may be necessary at the subsequent stage of first output terminal 414 and second output terminal 417. Namely, the intermediate frequency tuning surface acoustic wave filter 405 additionally functions as the roll-off filter.

Namely, the band width of a frequency 3 dB down from the band width characteristic of intermediate frequency tuning surface acoustic wave filter 405 is made to be greater than −0% within +5% of the frequency band width which being equal to symbol rate of receiving signal. Then, the 3 dB cutoff frequency of the base band signal 460 of I signal output and the base band signal 461 of Q signal output respectively becomes greater than −0% within +5% of one half the band width of symbol rate.

Namely, the function of the roll-off filter is implemented in the intermediate frequency tuning surface acoustic wave filter 405 with an accuracy greater than −0% within +5%. Therefore, there is no need to provide an additional roll-off filter in the subsequent stage of first output terminal 414 and second output terminal 417. As a result, the present exemplary embodiment presents an inexpensive high frequency apparatus.

(Embodiment 9)

Figure 20:
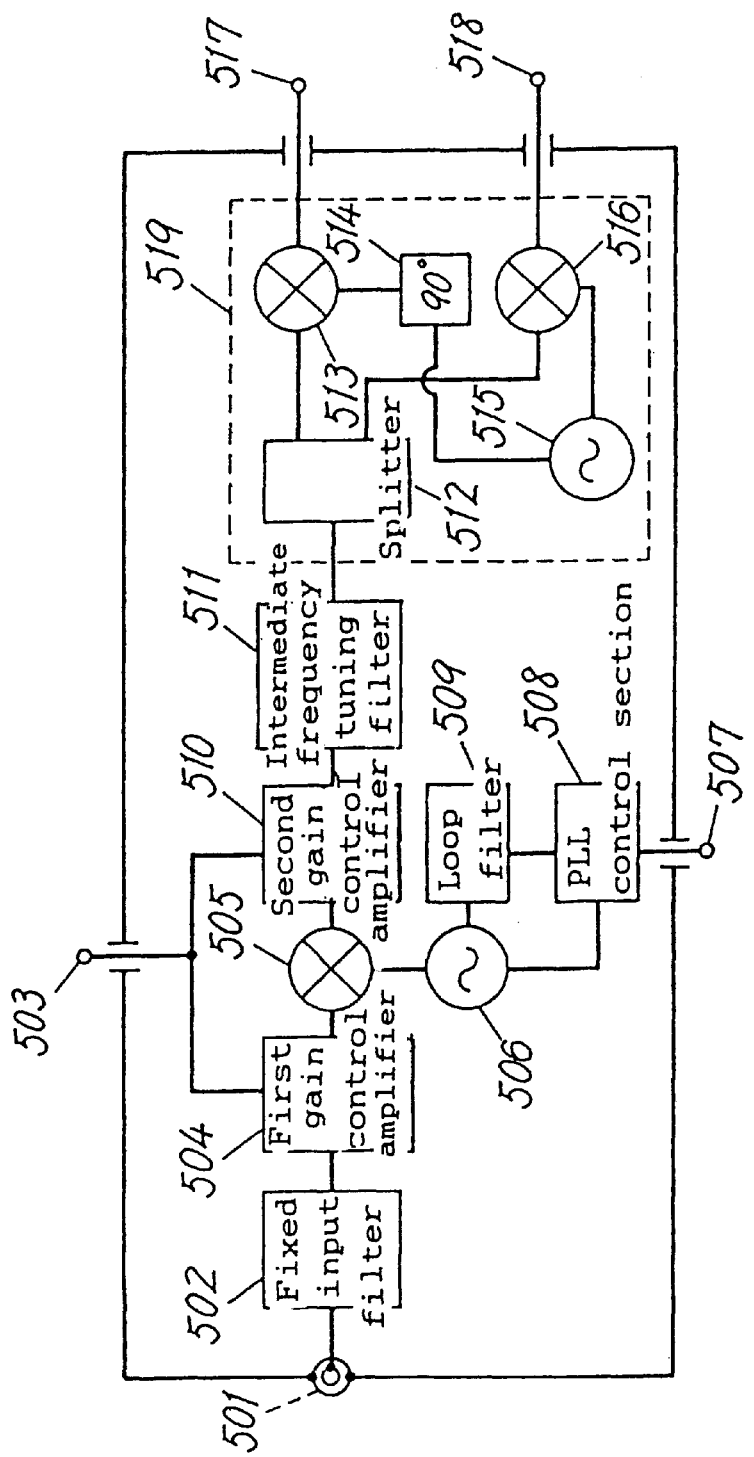
FIG. 20 is a block diagram of high frequency apparatus according to Embodiment 9 of the present invention.

A ninth exemplary embodiment of the present invention is described in the following. FIG. 20 is a block diagram showing the ninth exemplary embodiment of the present invention.

In FIG. 20, numeral 501 denotes an input terminal, 502 is a fixed input filter connected to the input terminal 501, 504 is a first gain control amplifier connected to output of the fixed input filter 502, 503 is a gain control terminal connected to the gain control input of first gain control amplifier 504, 505 is a mixer connected to output of the first gain control amplifier 504 at one input, 506 is a first oscillator one output of which is connected to the other input of mixer 505, 508 is a PLL control section connected to the other output of first oscillator 506, 509 is a loop filter (hereinafter referred to as low-pass filter) connected between the output of PLL control section 508 and the input of the first oscillator 506, 507 is a control terminal connected to the frequency data input terminal of the PLL control section 508, 510 is a second gain control amplifier connected to the output of the mixer 505, 511 is an intermediate frequency tuning filter connected to the output of second gain control amplifier 510, the gain control input of second gain control amplifier 510 being connected to the gain control terminal 503, 519 is an I/Q detector connected to the output of intermediate frequency tuning filter 511, 517 is a first output terminal connected to the Q signal output of I/Q detector 519, and 518 is a second output terminal connected to the I signal output of the I/Q detector 519.

The I/Q detector 519 comprises a splitter 512 connected to the output of the intermediate frequency tuning surface acoustic wave filter 511, a first detector 513 connected to one output of the splitter 512 at one input, a quadrature splitter 514 connected to the other input of first detector 513, a second oscillator 515 connected to the input of quadrature splitter 514, and a second detector 516 connected to the other output of the splitter 512 at one input, the other input of second detector 516 being connected to the second oscillator 515 and the output delivered to a second output terminal 518.

The output of the first detector 513 is connected to first output terminal 517. The frequency of the first oscillator 506 is determined so that an intermediate frequency to be inputted to the tuning filter 511 is greater than one half the difference between the largest frequency and the smallest frequency of signals input to input terminal 501.

The operation of the above described high frequency apparatus is described in the following. Suppose the intermediate frequency is represented as IF, the largest frequency to be input to the input terminal as RFmax, the smallest frequency as RFmin, and the image interference frequency of the upper heterodyne system as Im. If Im>RFmax, then the image interference frequency is not supplied to input terminal 501 of the high frequency apparatus.

Meanwhile, Im=RF+2IF, therefore a frequency at the smallest Im frequency is RFmin+2IF. Namely, RFmin+2IF>RFmax. This formula is modified to IF>(RFmax−RFmin) / 2

Therefore, if first oscillator 506 is controlled in its oscillation frequency so that an intermediate frequency IF is larger than one half the difference between the largest frequency RFmax and the smallest frequency RFmin to be input to input terminal 501, an image interference frequency IF, even if it is input to the input terminal 501, is not allowed by the fixed input filter 502 to go through the intermediate frequency tuning filter 511 because the frequency is greater than RFmax.

In the present exemplary embodiment, RFmax=550 MHz, RFmin=50 MHz. By determining an intermediate frequency IF to be greater than (550−50) / 2=250 MHz, an image disturbing frequency Im, even if it is inputted to the input terminal 501, is blocked by the fixed input filter 502, therefore not delivered from the intermediate frequency tuning filter 511.

Presently, in many CATV down signals, the 612 MHz band is a vacant channel and is not used for signal transmission. Therefore, in an example of the present embodiment, the 612 MHz band has been determined as the intermediate frequency of the high frequency apparatus.

In other exemplary embodiment, in the case where there is a direct interference in the 612 MHz band, a 612 MHz band attenuation trap is added to the fixed input filter 502 interference.

As described above, a filter for removing an image interference frequency Im has been eliminated by managing to obtain an intermediate frequency IF greater than one half the difference between the largest frequency RFmax and the smallest frequency RFmin of signals input to input terminal 501. Namely, a simple fixed input filter 502 which allows the frequency input in the input terminal 501 (RFmax–RFmin) to pass through is enough. As the fixed input filter 502 does not allow a frequency smaller than the smallest frequency RFmin to pass through, there is no possibility of interference caused by a CATV up signal. A high frequency apparatus is thus implemented with a simple control system. Further, in the present high frequency apparatus, a lock disturbance is avoidable by housing a high frequency apparatus of embodiment 5 within one shield case.

(Embodiment 10)

Figure 21:
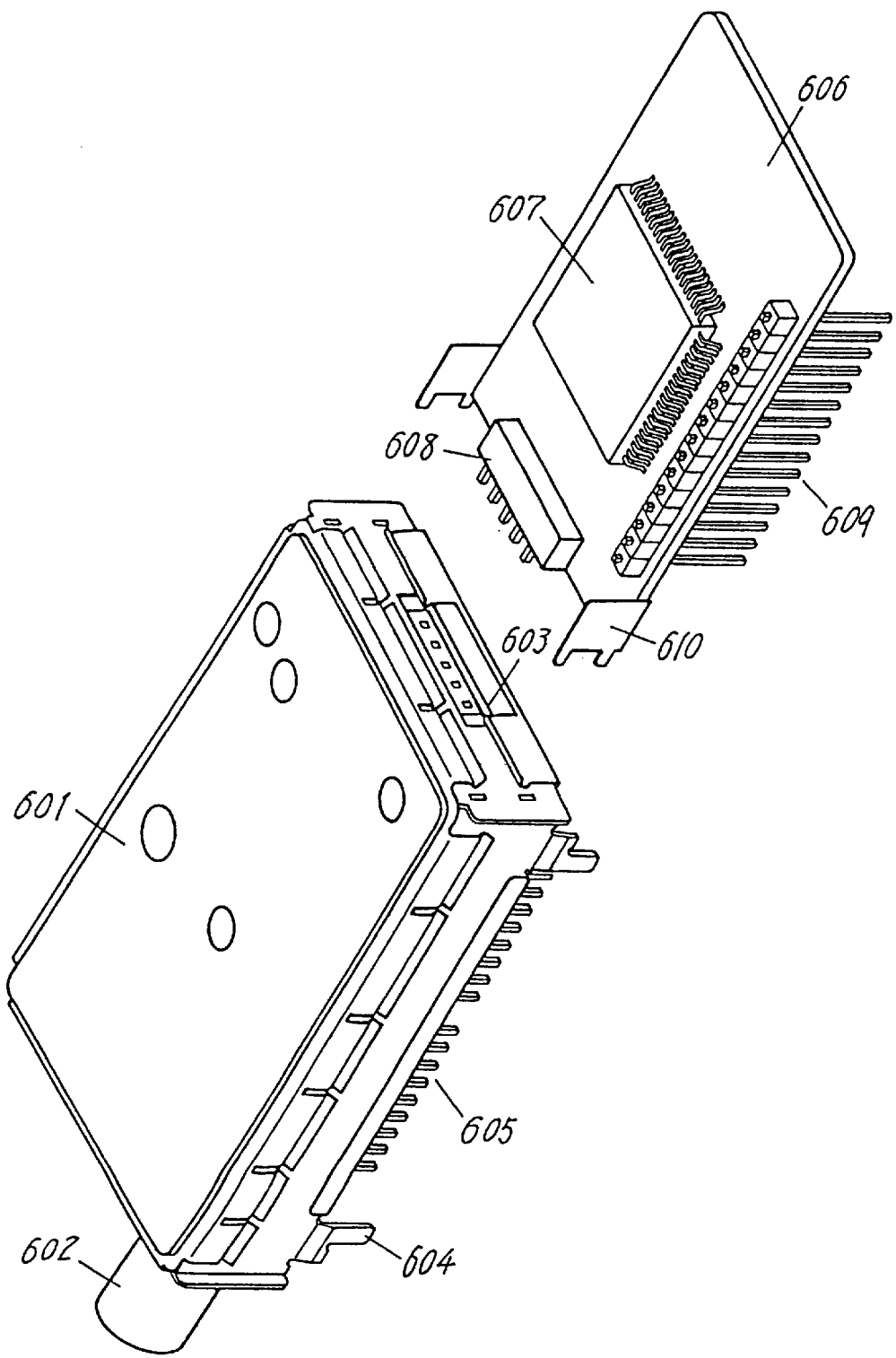
FIG. 21 is a perspective view showing a first exemplary high frequency apparatus according to Embodiment 10 of the present invention.

In FIG. 21, numeral 601 denotes a rectangular metal case, which is so-called a tuner section. In one side of the metal case 601, an input terminal 602 is provided, while in the other side an output terminal 603 is provided. Inside the metal case 601, a mixer which receives the input signal input to the input terminal 602 at one input and an output of local oscillator at the other input, and an I/Q extracting means provided between the mixer and the output terminal 603 are mounted. Numeral 604 is a foot for mounting the case 601 on a mother substrate, 605 a group of input/output terminals provided in the longitudinal direction on a plane having the largest area in case 601, the terminals being connected to a mixer, a local oscillator, an I/Q extracting means, etc. The I/Q extracting means contains at least either one of an I/Q detector and an A/D converter.

Numeral 606 is a substrate, on the surface of which a demodulator 607 forming a demodulating section constituted by integrated circuits is mounted. Input of the demodulator 607 is connected to an input terminal 608 of substrate 606, and input terminal 608 is connected to the output terminal 603 with a connector. Numeral 609 denotes a group of input/output terminals connected to the demodulator 607, provided on substrate 606 in the longitudinal direction.

Numeral 610 denotes a connecting portion provided on the substrate 606 at the same side as the input terminal 608. The substrate is connected with the metal case 601 in the side of output terminal 603 by means of the connecting portion 610. The substrate 606 is not covered by any case, but the demodulator 607 mounted on the substrate 606 is directly exposed to the outside air. This is to dissipate the heat generated by the demodulator 607, whose electric power consumption may be as much as approximately 2 W.

Figure 22:
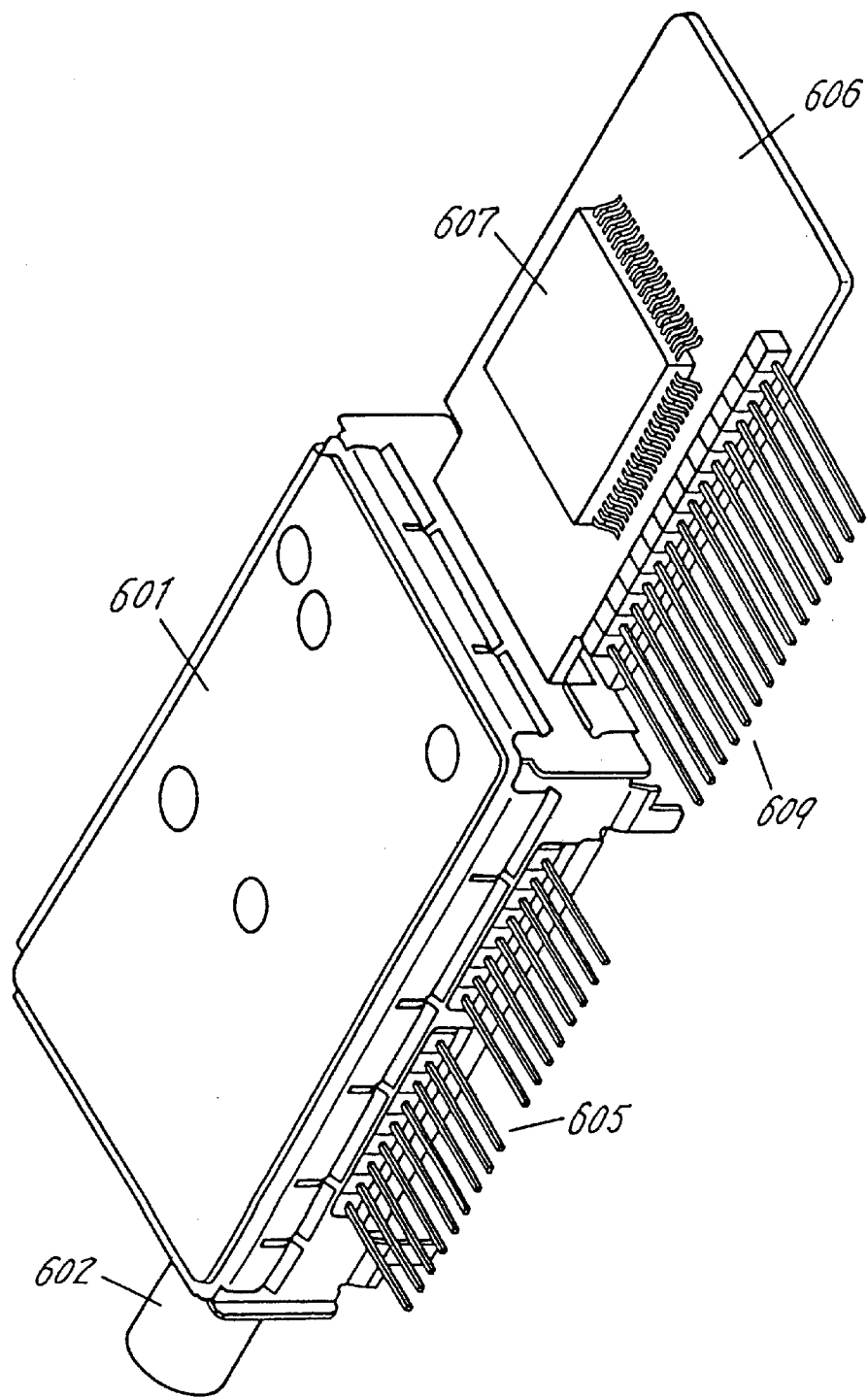
FIG. 22 is a perspective view of a second exemplary high frequency apparatus of FIG. 21.
Figure 23:
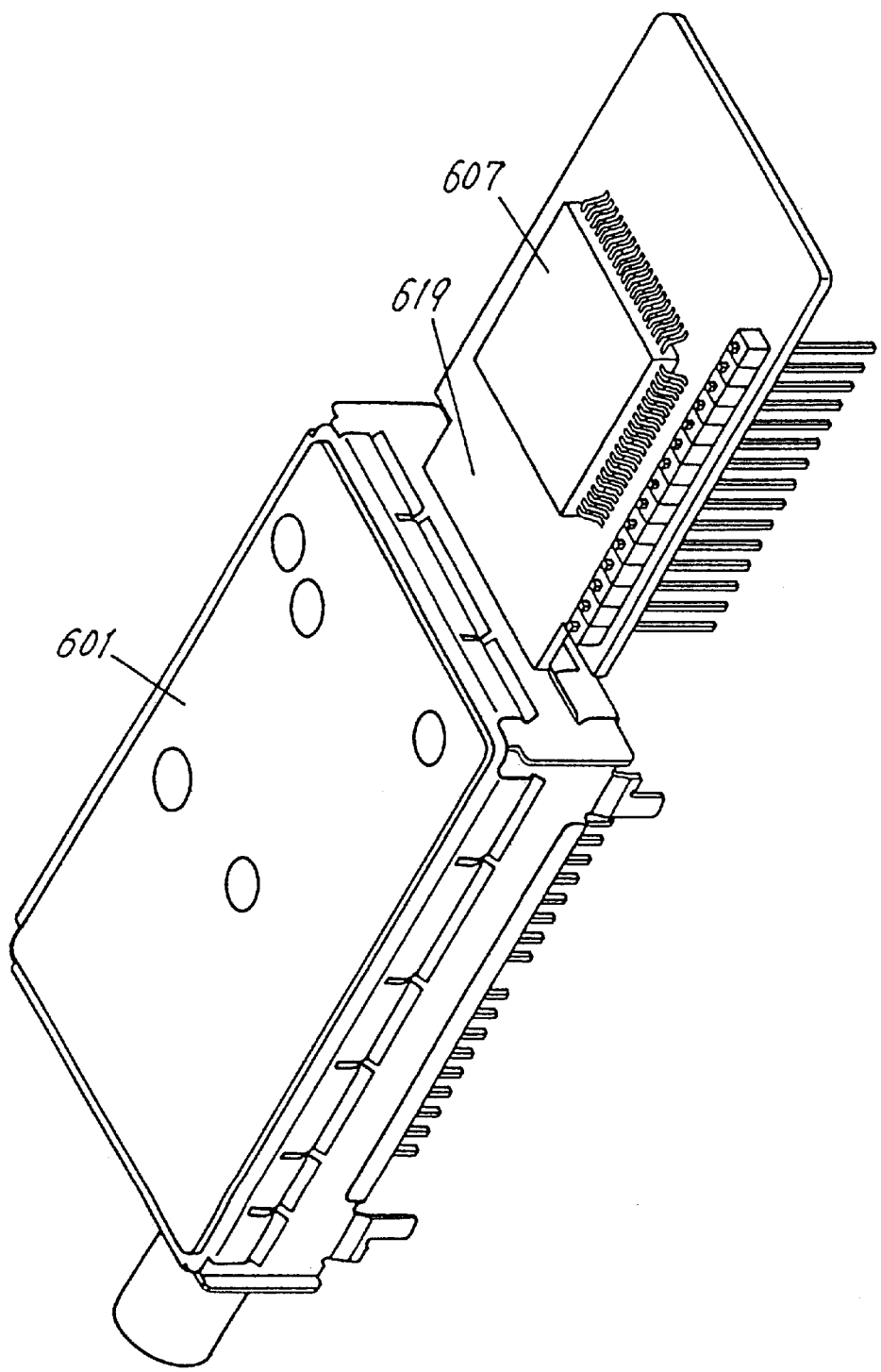
FIG. 23 is a perspective view of a third exemplary high frequency apparatus of FIG. 21.

In the present exemplary embodiment, the groups of input terminals 605, 609 are disposed on a plane of largest area to enable flat mounting on the mother substrate. This helps make the mother substrate thinner and presents a flat shaped apparatus. It is also possible to provide the groups of input/output terminals 605, 609 on a length side plane next to the largest area plane, as shown in FIG. 22. This enables a vertical mounting, which helps reducing the mounting area on the mother substrate.

Furthermore, the substrate in case 601 and the substrate 619 on which a demodulator 607 is mounted may be constituted on a single substrate.

Figure 24A:
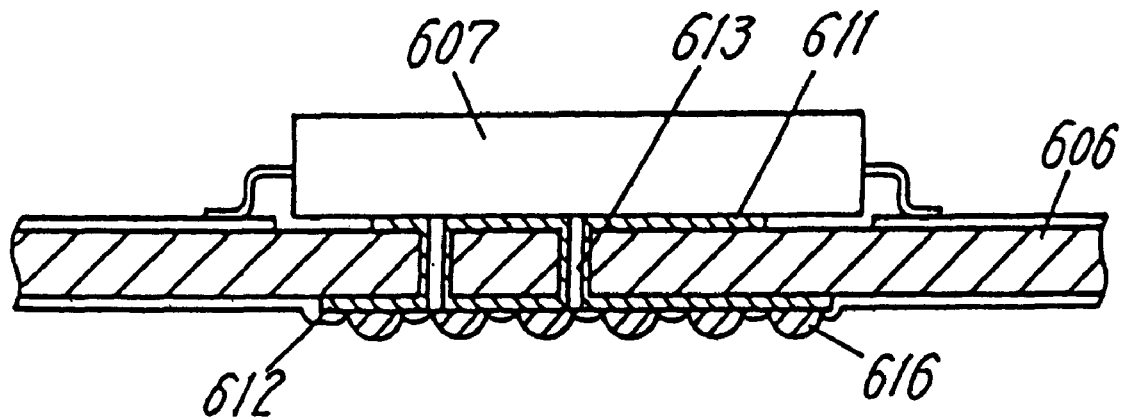
FIG. 24(a) is a cross sectional view showing key part of demodulator of the high frequency apparatus of FIG. 21.

FIG. 24(a) is a cross sectional view showing a key portion of substrate 606 on which a demodulator 607 is mounted. On the top surface of substrate 606 a copper foil 611 is laid in an area underneath the demodulator 607, the bottom surface of the demodulator 607 being in contact with the copper foil 611. Also on the back surface of substrate 606 a copper foil 612 is provided which is connected with the copper foil 611 by means of a plurality of through holes 613. With the above structure, the heat generated by demodulator 607 is conducted to copper foil 611, and then via through hole 613 to copper foil 612 on the back surface of substrate 606 and dissipated.

Figure 24B:
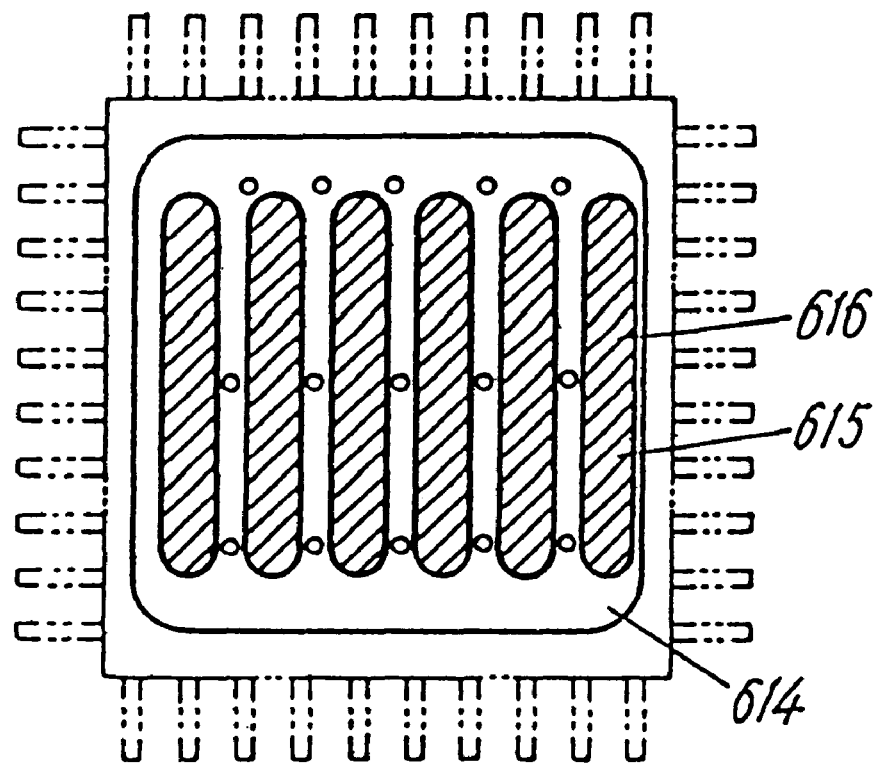
FIG. 24(b) is a plane view showing a key part of the demodulator as viewed from the back surface of substrate.

FIG. 24(b) is a plan view showing a key portion of the substrate 606 as viewed from the bottom. In FIG. 24(b), a solder resist 614 is printed on the copper foil 612 providing a plurality of strip-shaped void patterns 615. On the void patterns 615, solder protrusions 616 are provided to make the heat dissipation more efficient. The through hole 613 is disposed in the solder resist print 614 to avoid a short circuit etc. which may be caused by the solder 616 passing to the side having demodulator 607. The width of solder resist prints 614 between the plurality of solders 616 is made to be approximately identical. In the present exemplary embodiment the width is approximately 1 mm. The diameter of through holes is approximately 0.5 mm, and about 15 such holes are provided concentrated beneath the demodulator 607.

Figure 25:
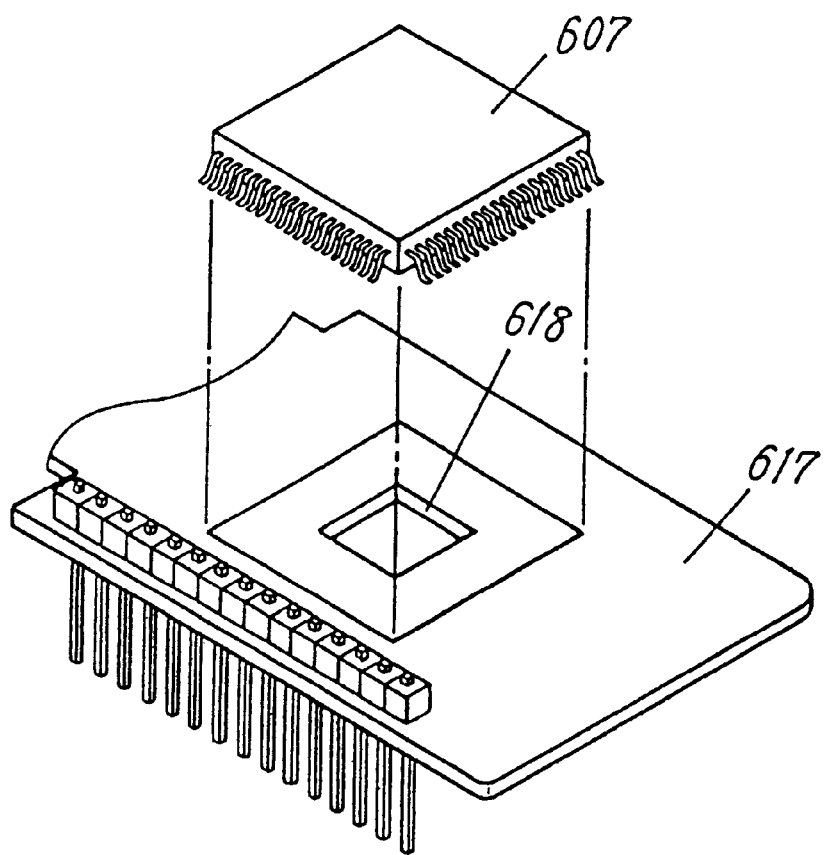
FIG. 25 is a perspective view showing a second exemplary demodulator in the high frequency apparatus of FIG. 21.

FIG. 25 shows a substrate 617 for mounting a demodulator 607, in which substrate a hole 618 is provided under the demodulator 607, instead of providing the above described through holes. The size of hole 618 being larger than chip size and smaller than the overall dimensions of demodulator 607. The hole 618 may either be square or round; in view of heat dissipation it should be as large as possible within a limitation that it should be smaller by about 0.5 mm than the outer dimensions of demodulator 607. The 0.5 mm is a safety margin to allow some dislocation when mounting demodulator 607.

Figure 26:
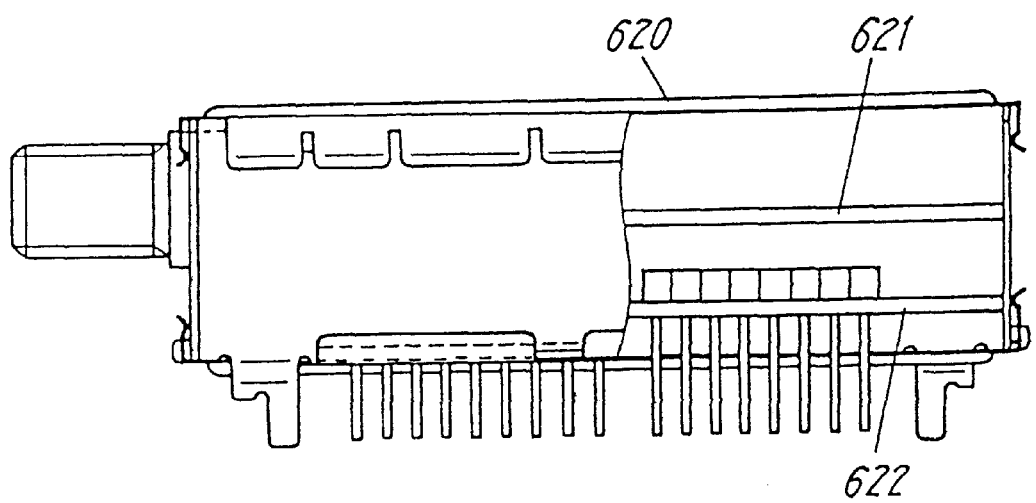
FIG. 26 is a partially broken side view of a fourth exemplary high frequency apparatus of FIG. 21.

In FIG. 26, a first substrate 621 and a second substrate 622 are disposed in a parallel arrangement within a case 620 for housing a high frequency apparatus. In this example, first substrate 621 has a tuner section, while second substrate 622 has a demodulating section. With the above described mounting arrangement, the tuner section and demodulating section may be disposed in the most appropriate mounting locations with a shortest connection distance. This contributes to make a high frequency apparatus smaller.

(Embodiment 11)

Figure 27:
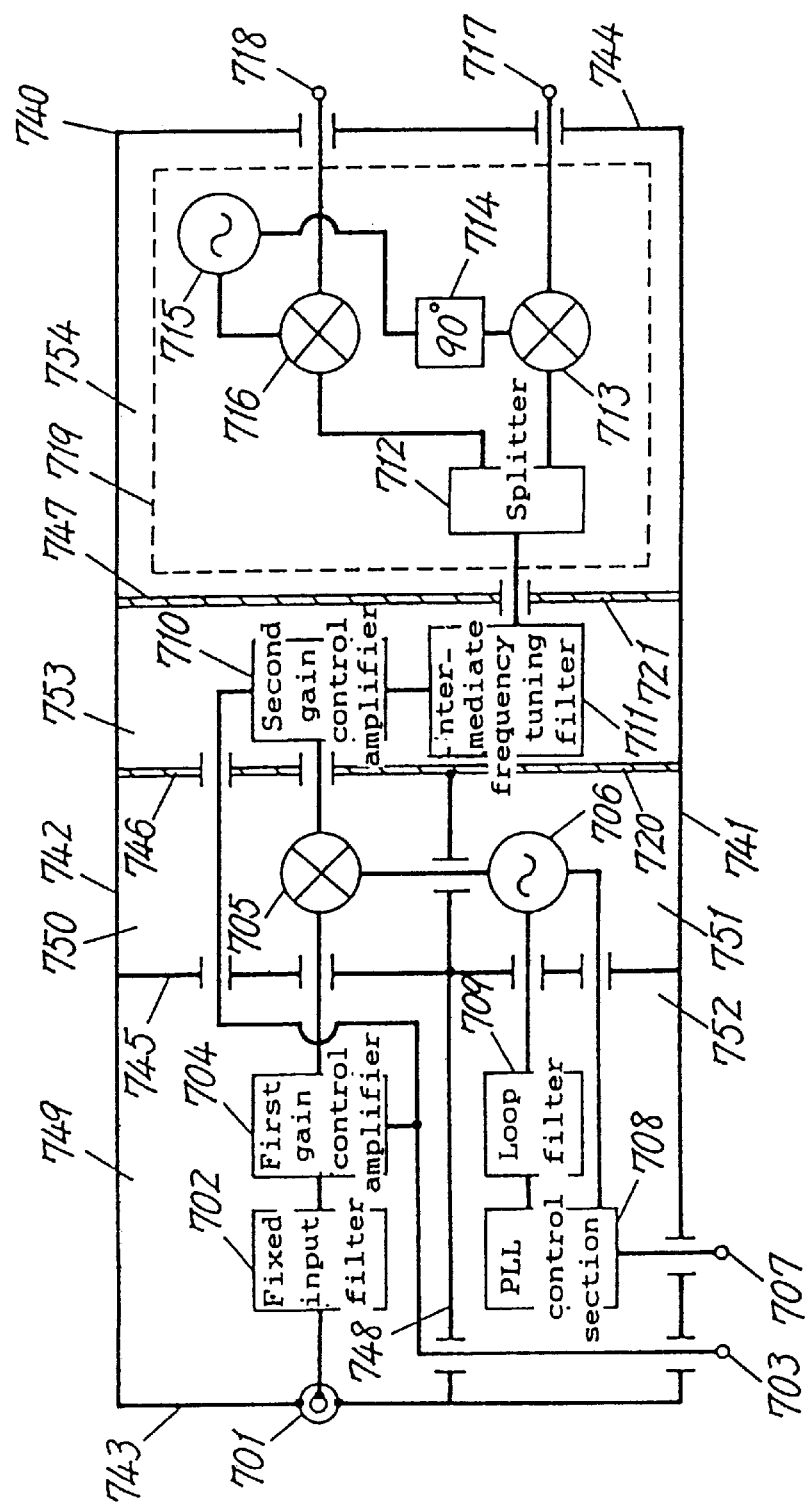
FIG. 27 is a block diagram of high frequency apparatus according to Embodiment 11 of the present invention.

FIG. 27 is a block diagram showing layout of respective blocks of a high frequency apparatus according to an eleventh exemplary embodiment of the present invention.

In FIG. 27, numeral 701 denotes an input terminal, 702 is a fixed input filter connected to the input terminal 701, 704 is a first gain control amplifier connected to the output side of fixed input filter 702, 703 is a gain control terminal connected to the gain control input of first gain control amplifier 704, 705 is a mixer connected to the output of the first gain control amplifier 704 at one input, 706 is a first oscillator connected to the other input of mixer 705 at one input, 708 is a PLL control section connected to the other output of first oscillator 706, 709 is a loop filter (hereinafter referred to as low-pass filter) connected between the output of PLL control section 708 and the input of the first oscillator 706, 707 is a control terminal connected to the frequency data input terminal of the PLL control section 708, 710 is a second gain control amplifier connected to the output of the mixer 705, the gain control input of second gain control amplifier 710 being connected to the gain control terminal 703, 711 is an intermediate frequency tuning filter connected to the output of second gain control amplifier 710, 719 is an I/Q detector connected to the output of intermediate frequency tuning filter 711, 717 is a first output terminal connected to the Q signal output of I/Q detector 719, and 718 is a second output terminal connected to the I signal output of the I/Q detector 719.

The I/Q detector 719 is comprised of a splitter 712 connected to the output of the intermediate frequency tuning filter 711, a first detector 713 connected to one output of the splitter 712 at one input, a quadrature splitter 714 connected to the other input of first detector 713, a second oscillator 715 connected to the input of quadrature splitter 714, and a second detector 716 connected to the other output of the splitter 712 at one input, the other input of second detector 716 being connected to the second oscillator 715, and the output connected to an output terminal 718. The output of the first detector 713 being connected to a first output terminal 717. These components are housed in a shield case 740.

Disposition of respective components housed in the metal shield case 740 is described in the following. The shield case 740 is comprised of a first lengthwise side board 741, a second lengthwise side board 742 provided in parallel with the first lengthwise side board 741, a first widthwise side board 743 and a second widthwise side board 744 both provided perpendicular to the lengthwise side boards 741, 742, and takes shape of a parallelogram. Metal separating plates are provided in parallel with the widthwise side boards 743, 744; in the order from the first widthwise side board 743, a first separating plate 745, a second separating plate 746 and a third separating plate 747.

A fourth separating plate 748 is provided in parallel with the lengthwise side board 741, from the first widthwise side board 743, through the first separating plate 745, reaching the second separating plate 746, forming compartments.

In a compartment 749 formed by separating plate 745, separating plate 748 and lengthwise side board 742, the input terminal 701 positioned on the widthwise side board 743, the fixed input filter 702 and the first gain control amplifier 704 are disposed. In a compartment 750 formed by separating plate 745, separating plate 746, separating plate 748 and lengthwise side board 742, the mixer 705 is mounted. In a compartment 751 formed by separating plate 745, separating plate 746 separating plate 748 and lengthwise side board 741, the oscillator 706 is mounted. In a compartment 752 formed by separating plate 748, separating plate 745 widthwise side board 743 and lengthwise side board 741, the PLL control section 708, the low pass filter 709 are mounted, and the gain control terminal 703 and the control terminal 707 are attached on the lengthwise side board 741. In a compartment 753 formed by separating plate 746 and separating plate 747, the second gain control amplifier 710 is mounted in the side of lengthwise side board 742, and the intermediate frequency tuning filter 711 in the side of lengthwise side board 741.

In a compartment 754 formed by separating plate 747, lengthwise side boards 741, 742 and widthwise side board 744, the I/Q detector 719 is mounted, and the first output terminal 717 and the second output terminal 718 are attached on the widthwise side board 744. The above described disposition is for keeping the symmetry of I/Q detection output, by making a length from the first detector 713 to the first output terminal 717 and that from the second detector 716 to the second output terminal 718 identical to each other.

The first output terminal 717 and the second output terminal 718 may be disposed on the lengthwise side board 741, on condition that the symmetry of I/Q detection output is maintained. In such a case, the shield case 740 may be attached on the mother substrate with the lengthwise side board 741 facing down; this arrangement will offer a convenience in wiring, as the signals come to the mother substrate side disposed towards a same direction. The gain control terminal 703 connected to second gain control amplifier 710 may be disposed on the lengthwise side board 741 in compartment 753. In such a case, although the gain control terminal 703 increases in number it is less prone pick up noise in compartment 749 an d compartment 750. The shield case 740 may be attached to the mother substrate in a flat lying model which improves the anti-vibration property. Thus , when a high frequency apparatus is required to be especially stable against vibration, it is preferred to attach the shield case to the mother substrate in a flat lying model.

It is important to categorize the constituent components according to the handling frequency or the function, and divide them into groups to be housed in respective compartments, as was done in the present exemplary embodiment. Depending on the requirements, it is preferred to make the separating plates 746 and 747, among others, double-structured for complete separation.

Now in the following, function of respective compartments as well as the response frequencies will be described. The compartment 749 houses a 50 MHz–550 MHz input signal filter 702 and first gain control amplifier 704; these have to be kept free from external interfering signals. The compartment 750 is a mixer for converting the input signal into a 612 MHz band intermediate frequency. It is important to prevent the signal from leaking out. The reason why the intermediate frequency is determined to be in the 612 MHz band has been described in detail in embodiment 9 above. The compartment 751 handles a variable frequency of approximately 662 MHz–1162 MHz; and it is also important to keep this signal from leaking out.

The compartment 752 handles the digital signal for channel selection. It is important to keep this signal from leading out or leading into compartment 749. The compartment 753 accurately amplifies the intermediate frequency in the 612 MHz band. Therefore, intrusion of external interfering signal into the compartment should be kept to a minimum. Namely, the separating plate 746 and the separating plate 747 are securely installed with a high degree of care. The compartment 754 houses I/Q detector 719 which handles from the 612 MHz band through the detection output signal frequency band region. Here, it is important to avoid intrusion of external signal and to conduct an error-free detection. Because of these compartments, the first oscillator 706 and the second oscillator 715 are separated from each other by separating plate 746 and separating plate 747, and are disposed on a diagonal line. In the following, the operation of the above described high frequency apparatus will be set forth.

The 50 MHz–550 MHz high frequency digital signals input at input terminal 701 go through fixed input filter 702 to have unnecessary signals removed, such as those other than in the range of 50 MHz–550 MHz. After being amplified by first gain control amplifier 704, the signals are mixed with a frequency delivered from oscillator 706 to produce the 612 MHz band intermediate frequency. The intermediate frequency is amplified at second gain control amplifier 710, and filtered at intermediate frequency tuning filter 711 leaving the 612 MHz band, or intermediate frequency. Then, after detection at I/Q detector 719, the I signal output is delivered to second output terminal 718, and the Q signal is output to first output terminal 717. These I signal output and Q signal output are then processed by a digital signal demodulator having digital clock.

In the present exemplary embodiment where a high frequency apparatus according to the present exemplary embodiment is housed in one shield case 740, the shielding effect of shield case 740 prevents the high frequency apparatus from being disturbed by the digital clock.

Other effects include, that the first oscillator 706 and the second oscillator 715 are separated from each other by separating plate 746 and separating plate 747 and are disposed on a diagonal line for the purpose of decreasing the spurious interference due to the mutual interference of the first oscillator 706 and the second oscillator 715. Therefore, the spurious interference due to the mutual interference of the first oscillator 706 and the second oscillator 715 is decreased.

A further effect includes, the separation of compartment 752 eliminates the possibility of a digital signal for channel selection interfering with other compartments.

Another effect includes, that as a result of erection of compartment 753 the first oscillator 706 and the second oscillator 715 are separated from each other, and the spurious interference due to mutual interference of the first oscillator 706 and the second oscillator 715 is decreased. A further effect includes, that by disposing the first output terminal 717 and the second output terminal 718 on lengthwise side board 741 maintaining the symmetry of I/Q detection output as it is, and placing the shield case 740 on the mother substrate with the lengthwise side board 741 facing down, the signals come to the mother substrate side in a same direction; which provides for convenience in wiring.

As described above, a high frequency apparatus according to the present invention is a tuner for PSK or PAM data applications which comprises an input terminal for receiving digital modulated high frequency signals, a mixer which receives signals inputted to the input terminal at one input and an output signal of local oscillator at the other input, and an output terminal for delivering output signal of the mixer, the local oscillator being comprised of a voltage controlled oscillator, a frequency divider intervening in the control loop of voltage controlled oscillator, a phase comparator, and a loop filter. The voltage controlled oscillator being comprised of an oscillation section and a tuning section. The tuning section comprises a frequency adjusting section and a means for maintaining a tuned state of the frequency adjusting section. The control loop has a high loop band width great enough so as the noise of the local oscillator is not dominated by noise of the voltage controlled oscillator.

With the above described constitution, as there is a frequency adjusting section provided as the tuning section of voltage controlled oscillator the tuning adjustment is easy, and as a state of the frequency adjusting section after adjustment is maintained by a maintaining means the anti-vibration property and the stability of oscillation frequency are sufficiently assured for a long term. On the other hand, when the maintaining means is employed for ensuring anti-vibration property etc., a stray capacitance is formed due to the dielectric constant higher than the air, which causes an dielectric loss inviting a deteriorated oscillation characteristic. In the present invention, however, this issue has been solved by making the control loop of voltage controlled oscillator to have a sufficiently high loop band width so as the noise of local oscillator is not dominated by the noise of voltage controlled oscillator. Therefore, the deterioration of oscillation frequency is correctable for a broad frequency band. Thus the output signal of local oscillator to be delivered to mixer is a clear one that is free from phase noise.

Further, by making the control loop of voltage controlled oscillator to have a sufficiently high loop band width so as the noise of local oscillator is not dominated by the noise of voltage controlled oscillator, and by making the level of a reference frequency signal to be delivered to phase comparator smaller relative to a comparative signal delivered from frequency divider to comparator, in a same frequency with the exception of a portion substantially the center of frequency, the deterioration of oscillation frequency is correctable for a broad frequency band. Therefore, the output signal of local oscillator to mixer is a clear one having least phase noise.

Furthermore, by making the control loop of voltage controlled oscillator to have a high loop band width high enough so as the noise of local oscillator is not dominated by noise of voltage controlled oscillator, and the level of the frequency distribution characteristic at the center frequency of reference frequency signal to be delivered to phase comparator to be lower, relative to the frequency distribution characteristic of signal level delivered to mixer from local oscillator, than the level of a signal to be noise-reduced by the high loop band width, in the same off-set frequency from the center frequency, the correction is conducted effectively for the high loop band width covering a broad frequency band width in practical use, without the noise reduction effect due to the high loop band width of local oscillator being affected by the noise of reference frequency signal. As a result, a local oscillator is economically implemented and a clear output signal having least phase noise is obtained.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A high frequency apparatus for use with a signal, said apparatus comprising:
   a mixer having:
   i) a first input coupled to the signal and,
   ii) a second input coupled to an output of a local oscillator, and
   iii) an output terminal coupled to an output signal of said mixer; said local oscillator includes:
   i) a voltage controlled oscillator, having
      a) an oscillating section, and
      b) a tuning section including a frequency adjustment section for adjusting a frequency of the voltage controlled oscillator, and
      c) maintaining means for maintaining the frequency of the voltage controlled oscillator after adjustment of the frequency,
   ii) a frequency divider,
   iii) a phase comparator, and
   iv) a loop filter,
   wherein said frequency divider, said phase comparator and said loop filter are part of a control loop;
   said control loop having a loop band width such that a noise effect of said local oscillator are not dominated by said voltage controlled oscillator.
   and a signal level of the reference frequency signal supplied to said phase comparator is lower than a signal level of a further frequency signal supplied from said frequency divider to said phase comparator within a respective frequency region including a predetermined region above and below the center frequency.

2. The high frequency apparatus of claim 1, wherein the frequency adjusting section comprises a movable conductive member provided on a substrate, and a fixing member is the means for maintaining said movable conductive member fixed.

3. The high frequency apparatus of claim 1, wherein a pattern inductance line is an inductive element of the voltage controlled oscillator, a movable conductive member is disposed in the vicinity of the pattern inductance line, the adjustment is conducted using the movable conductive member, and the movable conductive member is fixed, after adjustment, with a fixing member employed as the maintaining means.

4. The high frequency apparatus of claim 3, wherein the movable conductive member is disposed approximately in parallel with the pattern inductance line and above the center of the width of the pattern inductance line.

5. The high frequency apparatus of claim 3, wherein the movable conductive member is disposed in the vicinity of an open end of the pattern inductance line.

6. The high frequency apparatus of claim 1, wherein a coreless coil or a flat type transmission line is provided as the inductance element of the tuning section, the coreless coil or the flat type transmission line is adjusted, and said coreless coil or flat type transmission line is fixed with a fixing member.

7. The high frequency apparatus of claim 1, wherein the frequency adjusting section is comprised of an outer surface of a core and a conductor wound around said core.

8. The high frequency apparatus of claim 1, wherein the inductance element of tuning section is comprised of a cylindrical insulator, a conductor wound around an outer surface of said cylindrical insulator, a female screw provided in the inner wall surface of said cylindrical insulator and a movable core having an outer surface provided with a male screw coupled to the female screw.

9. The high frequency apparatus of claim 1, wherein the inductance element of the tuning section is formed by a pattern inductance line and a movable conductive member are coupled in series at each respective end, said movable conductive member is adjusted, and said movable conductive member is fixed by a fixing member.

10. The high frequency apparatus of claim 1, wherein a pattern inductance line is the inductance element of the tuning section, an adjusting portion of the pattern inductance line undergoes trimming for adjustment, and the trimmed part is covered with a covering material.

11. The high frequency apparatus of claim 10, wherein a pattern inductance line and a movable conductive member are connected together in series at each respective end, the movable conductive member is adjusted, a fixing member is employed as the maintaining means, and said movable conductive member is fixed by said fixing member.

12. The high frequency apparatus of claim 1, wherein the local oscillator and the mixer are housed respectively in a metal case, and a pattern inductance line laid on a substrate as a part of the tuning section of said local oscillator is provided in the vicinity of said metal case or a metal separating plate facing the substrate.

13. The high frequency apparatus of claim 1, wherein a film capacitor is used as the capacitance of the loop filter.

14. The high frequency apparatus of claim 13, wherein the film capacitor is mounted on the surface of a substrate, a lead wire of said film capacitor being inserted in a through hole provided in said substrate, said lead wire is soldered to a conductive pattern in the back surface of substrate, while there is no electrode formed inside said through hole.

15. The high frequency apparatus of claim 13, wherein the loop filter and the local oscillator are separated from each other by a separating plate, the separating plate being provided with an opening for allowing a conductive pattern connecting said loop filter and said local oscillator to go through, and said film capacitor is mounted in the vicinity of the opening in a manner to cover the opening.

16. The high frequency apparatus of claim 1, wherein the loop filter is comprised of two stage transistors.

17. The high frequency apparatus of claim 1, wherein a movable conductive member is provided in the tuning section, said movable conductive member, a varactor diode and a pattern inductance line are connected together in series in that order, and said pattern inductance line is connected to the oscillating section.

18. The high frequency apparatus of claim 1, wherein the tuning section is comprised of a varactor diode and a pattern inductance line, said varactor diode and pattern inductance line being connected together in series with a small capacitance chip capacitor in between, and said small capacitance chip capacitor is mounted in the vicinity of said pattern inductance line.

19. The high frequency apparatus of claim 18, wherein a small capacitance chip capacitor is provided as a first capacitor between the varactor diode and the inductance, and a second capacitor is provided between said varactor diode and oscillating section, said first capacitor and said second capacitor being temperature compensating capacitors.

20. The high frequency apparatus of claim 1 further comprising a reference frequency divider in connection to the phase comparator, to which phase comparator a reference frequency signal is input, the dividing ratio of the reference frequency divider being variable.

21. The high frequency apparatus of claim 20, wherein the dividing ratio of the reference frequency divider decreases as the output frequency of the voltage controlled oscillator increases.

22. The high frequency apparatus of claim 11 where comprising a plurality of parallel-connected intermediate frequency tuning filters each having a roll-off characteristic and a different band width, wherein any one of the intermediate frequency tuning filters is selectively switched based on the transmission rate of the signal input to the input terminal.

23. The high frequency apparatus of claim 1 further comprising a variable attenuator between the input terminal and the mixer, and a control terminal for controlling the variable attenuator.

24. The high frequency apparatus of claim 1 further comprising:
    an I/Q detector connected to the output terminal via an intermediate frequency tuning surface acoustic wave filter,
    a first output terminal to which the I signal of I/Q detector is delivered,
    a second output terminal to which the Q signal of said I/Q detector is delivered, and
    a second oscillator for supplying oscillation frequency signal to said I/Q detector;
    wherein said second oscillator comprises a resonating section, the substrate of said surface acoustic wave resonator of said resonating section and the substrate of said intermediate frequency tuning surface acoustic wave filter being made of a same material, and a frequency error sensor is provided for sensing the frequency error of signals output from said first output terminal and said second output terminal; the center of intermediate frequency and the oscillation frequency of said second oscillator are made almost identical by controlling the data of frequency divider at an increasing/decreasing counter based on the output of error sensor.

25. The high frequency apparatus of claim 24, wherein the band width defined by a 3 dB cut-off frequency of the intermediate frequency tuning surface acoustic wave filter is made to be more than 0% within +5% of the band width identical to symbol rate of the receiving signal.

26. The high frequency apparatus of claim 1 further comprising an input filter between the input terminal and the mixer, wherein the local oscillator oscillates a frequency so as to obtain an intermediate frequency that is greater than one half the difference between the largest frequency and the smallest frequency of signals input to said input terminal, said input filter being a fixed filter which allows a frequency range from said smallest frequency to the largest frequency to pass through.

27. The high frequency apparatus of claim 26, wherein the output signal frequency of the mixer is approximately 612 MHz.

28. The high frequency apparatus of claim 1 further comprising an I/Q extracting means connected to the output terminal, a first output terminal connected to an I signal output of I/Q extracting means, a second output terminal connected to a Q signal output of said I/Q extracting means, and a demodulator connected to said first and second output terminals, the demodulator being disposed outside of a metal cover.

29. The high frequency apparatus of claim 28, wherein a substrate on which surface the demodulator comprised of integrated circuits is mounted, a copper foil laid on a surface of said substrate in an area underneath said demodulator, and a copper foil provided on a back surface of said substrate are connected together by a through hole.

30. The high frequency apparatus of claim 28, wherein the substrate on which the demodulator comprised of integrated circuits is mounted is provided with a hole underneath said integrated circuits, the size of the hole being larger than a chip size within the integrated circuits and smaller than the outer dimensions of integrated circuits.

31. The high frequency apparatus of claim 29, wherein a plurality of strip-shaped areas void of solder resist are provided on the copper foil of the back surface of substrate, and a solder is provided protruded in the strip-shaped areas void of solder resist.

32. The high frequency apparatus of claim 1, further comprising an input filter provided between the input terminal and the mixer, an intermediate frequency tuning filter connected to the output terminal, an I/Q extracting means to which the output of the intermediate frequency tuning filter is connected, a first output terminal connected to an I signal output of I/Q extracting means, and a second output terminal connected to a Q signal output of said I/Q extracting means; wherein all of the above items are housed in one shield case.

33. The high frequency apparatus of claim 32, wherein at least one shield board is provided between the mixer and the oscillator of the I/Q extracting means.

34. The high frequency apparatus of claim 32, wherein the mixer and the oscillator of the I/Q extracting means are housed in one shield case, and disposed on a diagonal line.

35. The high frequency apparatus of claim 32, wherein the input terminal is disposed on one lengthwise side board of an approximately rectangular-shaped shield case, an input filter and said mixer are disposed after the input terminal, a separating plate is provided approximately in parallel with said input filter and said mixer, and said local oscillator for supplying oscillation frequency to said mixer is provided in the other side of said separating plate opposite to said input filter and said mixer.

36. The high frequency apparatus of claim 33, wherein a compartment for housing intermediate frequency tuning filter is provided between the local oscillator for supplying oscillation frequency to mixer and the I/Q extracting means.

37. The high frequency apparatus of claim 35, further comprising an output terminal of the I/Q extracting means and a control terminal of the local oscillator disposed in the vicinity of the first widthwise side board of shield case.

38. A high frequency apparatus for use with an input signal, said apparatus comprising:
a mixer having
  i) a first input coupled to the input signal,
  ii) a second input coupled to an output of a local oscillator, and
  iii) an output terminal coupled to an output signal of the mixer;
said local oscillator having
  i) a voltage controlled oscillator including
    a) an oscillating section, and
    b) a tuning section including a frequency adjusting section for adjusting a frequency of the voltage controlled oscillator, and
  means for maintaining the frequency of the voltage controlled oscillator after adjustment,
  ii) generating means for generating a reference frequency signal, said reference signal having a reference center frequency,
  iii) a phase comparator coupled to said reference frequency signal,
  iv) a frequency divider generating a second frequency signal, and
  v) a loop filter,
wherein said generating means for generating said reference frequency signal, said phase comparator, said frequency divider, and said loop filter are part of a control loop;
said control loop having a loop band width such that a noise effect of said local oscillator are not dominated by said voltage controlled oscillator, and a signal level of the reference frequency signal supplied from said frequency divider to said phase comparator is lower than a signal level of a further frequency signal supplied to said phase comparator within a respective frequency region including a predetermined region above and below the center frequency.

39. The high frequency apparatus of claim 38, wherein the frequency adjusting section comprises a movable conductive member provided on a substrate, and a fixing member is employed as the means for maintaining said movable conductive member fixed.

40. The high frequency apparatus of claim 38, wherein a pattern inductance line is employed as the inductance element of the tuning section, a movable conductive member is disposed at the vicinity of the pattern inductance line, an adjustment is conducted using the movable conductive member, and the movable conductive member is fixed, after adjusted, with a fixing member employed as the maintaining means.

41. The high frequency apparatus of claim 40, wherein a movable conductive member is disposed approximately in parallel with the pattern inductance line above the width center of the pattern inductance line.

42. The high frequency apparatus of claim 40, wherein the movable conductive member is disposed in the vicinity of an open end of the pattern inductance line.

43. The high frequency apparatus of claim 38, wherein a coreless coil or a flat type transmission line is provided as the inductance element of the tuning section, the coreless coil or the flat type transmission line is adjusted, and then said coreless coil or flat type transmission line is fixed with a fixing member employed as the maintaining means.

44. The high frequency apparatus of claim 38, wherein the frequency adjusting section is comprised of an outer surface of a core employed as the maintaining means and a conductor wound around said core.

45. The high frequency apparatus of claim 38, wherein an inductance element of the tuning section is comprised of a cylindrical insulator, a conductor wound around an outer surface of said cylindrical insulator, a female screw provided in an inner wall surface of said cylindrical insulator and a movable core the outer surface of which is provided with a male screw matching the female screw.

46. The high frequency apparatus of claim 38, wherein an inductance element of the timing section is formed by a pattern inductance line and a movable conductive member connected together in series at each respective end, said movable conductive member is adjusted, a fixing member is employed as the maintaining means, and said movable conductive member is fixed by said fixing member.

47. The high frequency apparatus of claim 38, wherein a pattern inductance line is used as the inductance element of the tuning section, an adjusting portion of the pattern inductance line undergoes trimming for adjustment, and the trimmed part is covered with a covering material.

48. The high frequency apparatus of claim 47, wherein the pattern inductance line and a movable conductive member are connected together in series at each respective end, the movable conductive member is adjusted, a fix member is employed as the maintaining means, and said movable conductive member is fixed by said fix member.

49. The high frequency apparatus of claim 38, wherein the local oscillator and the mixer are housed respectively in metal case, and a pattern inductance line laid on substrate as a part of the tuning section of said local oscillator is provided in the vicinity of said metal case or a metal separating plate facing the substrate.

50. The high frequency apparatus of claim 38, wherein a film capacitor is used as the capacitance of loop filter.

51. The high frequency apparatus of claim 50, wherein the film capacitor is mounted on the surface of substrate, a lead wire of said film capacitor being inserted in a through hole provided in said substrate, said lead wire is soldered to a conductive pattern in the back surface of substrate, while there is no electrode formed inside said through hole.

52. The high frequency apparatus of claim 50, wherein the loop filter and the local oscillator are separated to each other by a separating plate, the separation plate being provided with an opening for allowing a conductive pattern connecting said loop filter and said local oscillator to go through, and said film capacitor is mounted in the vicinity of the opening in a manner to cover the opening.

53. The high frequency apparatus of claim 38, wherein the loop filter is comprised of two stage transistors.

54. The high frequency apparatus of claim 38, wherein a movable conductive member is provided in the tuning section, said movable conductive member, a varactor diode and a pattern inductance line are connected together in series in the order, and said pattern inductance line is connected to the oscillating section.

55. The high frequency apparatus of claim 38, wherein the tuning section is comprised of a varactor diode and a pattern inductance line, said varactor diode and pattern inductance line being connected in series with a small capacitance chip capacitor in between, and said small capacitance chip capacitor is mounted in the vicinity of said pattern inductance line.

56. The high frequency apparatus of claim 55, wherein a small capacitance chip capacitor is provided as a first capacitor between the varactor diode and the inductance, and a second capacitor is provided between said varactor diode and the oscillating section, said first capacitor and said second capacitor being temperature compensation capacitors.

57. The high frequency apparatus of claim 38 further comprising a reference frequency divider in connection to the phase comparator, to which phase comparator a reference frequency signal is inputted, the dividing ratio of reference frequency divider being variable.

58. The high frequency apparatus of claim 57, wherein the dividing ratio of reference frequency divider is made to go smaller along with the increasing output frequency of voltage controlled oscillator.

59. The high frequency apparatus of claim 38 further comprising a plurality of parallel-connected intermediate frequency tuning filters each having roll-off characteristic and different band width, wherein one of the intermediate frequency tuning filters is selectively switched based on the transmission rate of signal inputted to the input terminal.

60. The high frequency apparatus of claim 38 further comprising a variable attenuator between the input terminal and the mixer, and a control terminal for controlling the variable attenuator.

61. The high frequency apparatus of claim 38 further comprising an I/Q detector connected to the output terminal via an intermediate frequency tuning surface acoustic wave filter, a first output terminal to which the I signal of I/Q detector is delivered, a second output terminal to which the Q signal of said I/Q detector is delivered, and a second oscillator for supplying oscillation frequency signal to said I/Q detector; wherein said second oscillator comprises resonating section, the substrate of surface acoustic wave resonator of said resonating section and the substrate of said intermediate frequency tuning surface acoustic wave filter being made of a same material, and a frequency error sensor is provided for sensing the frequency error of signals outputted from said first output terminal and said second output terminal; thereby the center of intermediate frequency and the oscillation frequency of said second oscillator are made almost identical by controlling the data of frequency divider at an increasing/decreasing counter based on the output of error sensor.

62. The high frequency apparatus of claim 61, wherein the band width defined by 3 dB cut-off frequency of intermediate frequency tuning surface acoustic wave filter is made to be more than 0% within +5% of the band width identical to symbol rate of receiving signal.

63. The high frequency apparatus of claim 38 further comprising an input filter between the input terminal and the mixer, wherein the local oscillator oscillates a frequency so as to obtain an intermediate frequency greater than one half the difference between the largest frequency and the smallest frequency of signals inputted to said input terminal, said input filter being a fixed filter which allows a frequency range from said smallest frequency to the largest frequency to pass through.

64. The high frequency apparatus of claim 63, wherein the output signal frequency of mixer is approximately 612 MHz.

65. The high frequency apparatus of claim 38 further comprising an I/Q extracting means connected to the output terminal, a first output terminal connected to the I signal output of I/Q extracting means, a second output terminal connected to the Q signal output of said I/Q extracting means, and a demodulator connected to said first and second output terminals, the demodulator being disposed outside of metal cover.

66. The high frequency apparatus of claim 65, wherein a substrate having the demodulator comprised of integrated circuits mounted on the surface, a copper foil laid on the surface of said substrate in an area underneath said demodulator, and a copper foil provided on the back surface of said substrate are connected together by a through hole.

67. The high frequency apparatus of claim 65, wherein the substrate having the demodulator comprised of integrated circuits mounted on the surface is provided with a hole underneath said integrated circuits, the size of the hole being larger than chip size within the integrated circuits and smaller than the outer dimensions of integrated circuits.

68. The high frequency apparatus of claim 66, wherein a plurality of strip-shaped areas void of solder resist are provided on the copper foil of the back surface of substrate, and a solder is provided protruded in the strip-shaped areas void of solder resist.

69. The high frequency apparatus of claim 38, further comprising an input filter provided between the input terminal and the mixer, an intermediate frequency tuning filter connected to the output terminal, an I/Q extracting means to which the output of intermediate frequency tuning filter is connected, a first output terminal connected to the I signal output of I/Q extracting means, and a second output terminal connected to the Q signal output of said I/Q extracting means; wherein all of the above items are housed in one shield case.

70. The high frequency apparatus of claim 69, wherein at least one shield board is provided between the mixer and the oscillator of I/Q extracting means.

71. The high frequency apparatus of claim 69, wherein the mixer and the oscillator of I/Q extracting means are housed in one shield case, and disposed on a diagonal line.

72. The high frequency apparatus of claim 69, wherein the input terminal is disposed on one lengthwise side board of an approximately rectangular-shaped shield case, an input filter and said mixer are disposed next to the input terminal, a separating plate is provided approximately in parallel with said input filter and said mixer, and a local oscillator for supplying oscillation frequency to said mixer is disposed in the other side of said separating plate opposite to said input filter and said mixer.

73. The high frequency apparatus of claim 70, wherein a compartment for housing intermediate frequency tuning filter is provided between the local oscillator for supplying oscillation frequency to mixer and the I/Q extracting means.

74. The high frequency apparatus of claim 72, further comprising an output terminal of I/Q extracting means and a control terminal of the local oscillator disposed in the vicinity of the first widthwise side board of shield case.

75. A high frequency apparatus for use with an input signal, said apparatus having a center frequency and comprising:
a mixer having
i) a first input coupled to the input signals,
ii) a second input coupled to an output of a local oscillator, and
iii) an output terminal coupled to an output signal of the mixer;
said local oscillator including
i) a voltage controlled oscillator having,
a) an oscillating section,
b) a tuning section including a frequency adjusting section for adjusting a frequency of the voltage controlled oscillator, and means for maintaining the frequency of the voltage controlled oscillator after adjustment,
ii) generating means for generating a reference frequency signal said reference signal having a reference center frequency,
iii) a phase comparator receiving said reference frequency signal,
iv) a frequency divider, and
v) a loop filter,
wherein said generating means for generating said reference frequency signal, said phase comparator, said frequency divider, and said loop filter are part of a control loop,
said control loop having a loop band width such that a noise effect of said local oscillator is not dominated by said voltage controlled oscillator, a signal level of a frequency distribution characteristic within a predetermined region of the reference center frequency is lower, relative to the signal level of a frequency distribution characteristic within a predetermined region of a center frequency of the output signal from said local oscillator, than a signal level to be noise-reduced by the high loop band width in a same off-set frequency from the respective center frequency excluding a portion substantially at the center frequency of the high frequency apparatus.

76. The high frequency apparatus of claim 75, wherein the frequency adjusting section comprises a movable conductive member provided on substrate, a fix member is employed as the means for maintaining said movable conductive member fixed.

77. The high frequency apparatus of claim 75, wherein a pattern inductance line is employed as the inductance element of tuning section, a movable conductive member is disposed at the vicinity of pattern inductance line, an adjustment is conducted using the movable conductive member, and the movable conductive member is fixed, after adjusted, with a fix member employed as the maintaining means.

78. The high frequency apparatus of claim 77, wherein the movable conductive member is disposed approximately in parallel with the pattern inductance line above the width center of the pattern inductance line.

79. The high frequency apparatus of claim 77, wherein the movable conductive member is disposed in the vicinity of an open end of the pattern inductance line.

80. The high frequency apparatus of claim 75, wherein a coreless coil or a flat type transmission line is provided as the inductance element of tuning section, the coreless coil or the flat type transmission line is adjusted, and then said coreless coil or flat type transmission line is fixed with a fix member employed as the maintaining means.

81. The high frequency apparatus of claim 75, wherein the frequency adjusting section is comprised of outer surface of a core employed as the maintaining means and a conductor wound around said core.

82. The high frequency apparatus of claim 75, wherein an inductance element of the tuning section is comprised of a cylindrical insulator, a conductor wound around the outer surface of said cylindrical insulator, a female screw provided in the inner wall surface of said cylindrical insulator and a movable core the outer surface of which is provided with a male screw matching the female screw.

83. The high frequency apparatus of claim 75, wherein an inductance element of the tuning section is formed by a pattern inductance line and a movable conductive member connected together in series at each respective end, said movable conductive member is adjusted, a fix member is employed as the maintaining means, and said movable conductive member is fixed by said fix member.

84. The high frequency apparatus of claim 75, wherein a pattern inductance line is used as the inductance element of tuning section, an adjusting portion of the pattern inductance line undergoes trimming for adjustment, and the trimmed part is covered with a covering material.

85. The high frequency apparatus of claim 84, wherein the pattern inductance line and a movable conductive member are connected together in series at each respective end, the movable conductive member is adjusted, a fix member is employed as the maintaining means, and said movable conductive member is fixed by said fix member.

86. The high frequency apparatus of claim 75, wherein the local oscillator and the mixer are housed respectively in metal case, and a pattern inductance line laid on substrate as a part of the tuning section of said local oscillator is provided in the vicinity of said metal case or a metal separating plate facing the substrate.

87. The high frequency apparatus of claim 75, wherein a film capacitor is used as the capacitance of loop filter.

88. The high frequency apparatus of claim 87, wherein the film capacitor is mounted on the surface of substrate, a lead wire of said film capacitor being inserted in a through hole provided in said substrate, said lead wire is soldered to a conductive pattern in the back surface of substrate, while there is no electrode formed inside said through hole.

89. The high frequency apparatus of claim 13, wherein the loop filter and the local oscillator are separated to each other by a separating plate, the separating plate being provided with an opening for allowing a conductive pattern connecting said loop filter and said local oscillator to go through, and said film capacitor is mounted in the vicinity of the opening in a manner to cover the opening.

90. The high frequency apparatus of claim 75, wherein the loop filter is comprised of two stage transistors.

91. The high frequency apparatus of claim 75, wherein a movable conductive member is provided in the tuning section, said movable conductive member, a varactor diode and a pattern inductance line are connected together in series in the order, and said pattern inductance line is connected to the oscillating section.

92. The high frequency apparatus of claim 75, wherein the tuning section is comprised of a varactor diode and a pattern inductance line, said varactor diode and pattern inductance line being connected in series with a small capacitance chip capacitor in between, and said small capacitance chip capacitor is mounted in the vicinity of said pattern inductance line.

93. The high frequency apparatus of claim 92, wherein a small capacitance chip capacitor is provided as a first capacitor between the varactor diode and the inductance, and a second capacitor is provided between said varactor diode and the oscillating section, said first capacitor and said second capacitor being temperature compensation capacitors.

94. The high frequency apparatus of claim 75 further comprising a reference frequency divider in connection to the phase comparator, to which phase comparator a reference frequency signal is inputted, the dividing ratio of the reference frequency divider being variable.

95. The high frequency apparatus of claim 94, wherein the dividing ratio of reference frequency divider is made to go smaller along with the increasing output frequency of voltage controlled oscillator.

96. The high frequency apparatus of claim 75 further comprising a plurality of parallel-connected intermediate frequency tuning filters each having roll-off characteristic and different band width, wherein one of the intermediate frequency tuning filters is selectively switched based on the transmission rate of the signal inputted to input terminal.

97. The high frequency apparatus of claim 75 when comprising a variable attenuator between the input terminal and the mixer, and a control terminal for controlling the variable attenuator.

98. The high frequency apparatus of claim 75 further comprising an I/Q detector connected to the output terminal via an intermediate frequency tuning surface acoustic wave filter, a first output terminal to which the I signal of I/Q detector is delivered, a second output terminal to which the Q signal of said In Q detector is delivered, and a second oscillator for supplying oscillation frequency signal to said I/Q detector; wherein said second oscillator comprises resonating section, the substrate of surface acoustic wave resonator of said resonating section and the substrate of said intermediate frequency tuning surface acoustic wave filter being made of a same material, and a frequency error sensor is provided for sensing the frequency error of signals outputted from said first output terminal and said second output terminal; thereby the center of intermediate frequency and the oscillation frequency of said second oscillator are made almost identical by controlling the data of frequency divider at an increasing/decreasing counter based on the output of error sensor.

99. The high frequency apparatus of claim 98, wherein the band width defined by 3 dB cut-off frequency of intermediate frequency tuning surface acoustic wave filter is made to be more than 0% within +5% of the band width identical to symbol rate of receiving signal.

100. The high frequency apparatus of claim 75 further comprising an input filter between the input terminal and the mixer, wherein the local oscillator oscillates a frequency so as to obtain an intermediate frequency that is greater than one half the difference between the largest frequency and the smallest frequency of signals inputted to said input terminal, said input filter being a fixed filter which allows a frequency range from said smallest frequency to the largest frequency to pass through.

101. The high frequency apparatus of claim 100, wherein the output signal frequency of mixer is approximately 612 MHz.

102. The high frequency apparatus of claim 75 further comprising an I/Q extracting means connected to the output terminal, a first output terminal connected to the I signal output of I/Q extracting means, a second output terminal connected to the Q signal output of said I/Q extracting means, and a demodulator connected to said first and second output terminals, the demodulator being disposed outside of metal cover.

103. The high frequency apparatus of claim 102, wherein a substrate having the demodulator comprised of integrated circuits mounted on the surface, a copper foil laid on the surface of said substrate in an area underneath said demodulator, and a copper foil provided on the back surface of said substrate are connected together by a through hole.

104. The high frequency apparatus of claim 102, wherein the substrate having the demodulator comprised of integrated circuits mounted on the surface is provided with a hole underneath said integrated circuits, the size of the hole being larger than chip size within the integrated circuits and smaller than the outer dimensions of integrated circuits.

105. The high frequency apparatus of claim 103, wherein a plurality of strip-shaped areas void of solder resist are provided on the copper foil of the back surface of substrate, and a solder is provided protruded in the strip-shaped areas void of solder resist.

106. The high frequency apparatus of claim 75, further comprising an input filter provided between the input terminal and the mixer, an intermediate frequency tuning filter connected to the output terminal, an I/Q extracting means to which the output of intermediate frequency tuning filter is connected, a first output terminal connected to the I signal output of I/Q extracting means, and a second output terminal connected to the Q signal output of said I/Q extracting means; wherein all of the above items are housed in one shield case.

107. The high frequency apparatus of claim 106, wherein at least one shield board is provided between the mixer and the oscillator of I/Q extracting means.

108. The high frequency apparatus of claim 106, wherein the mixer and the oscillator of I/Q extracting means are housed in one shield case, and disposed on a diagonal line.

109. The high frequency apparatus of claim 106, wherein the input terminal is disposed on one lengthwise side board of an approximately rectangular-shaped shield case, an input filter and said mixer are disposed next to the input terminal, a separating plate is provided approximately in parallel with said input filter and said mixer, and a local oscillator for supplying oscillation frequency to said mixer is disposed in the other side of said separating plate opposite to said input filter and said mixer.

110. The high frequency apparatus of claim 107, wherein a compartment for housing intermediate frequency tuning filter is provided between the local oscillator for supplying oscillation frequency to mixer and the I/Q extracting means.

111. The high frequency apparatus of claim 109, further comprising an output terminal of I/Q extracting means and a control terminal of the local oscillator disposed in the vicinity of the first widthwise side board of shield case.

112. A high frequency apparatus for use with an input signal, said apparatus comprising:

a mixer having i) a first input coupled to the input signal, ii) a second input coupled to an output of a local oscillator, and iii) an output terminal coupled to an output signal of the mixer;

said local oscillator includes i) a voltage controlled oscillator having a) an oscillating section, and b) a pattern inductance line formed on a substrate, ii) generating means for generating a reference frequency signal, said reference signal having a reference center frequency, iii) a phase comparator, iv) a frequency divider and v) a loop filter, wherein said generating means for generating said reference frequency signal, said phase comparator, said frequency divider, and said loop filter are part of a control loop, said control loop having a sufficiently high loop band width such that noise effects of said local oscillator are not dominated by said voltage controlled oscillator, and signal level of the reference frequency signal supplied to said phase comparator is lower than a signal level of a further frequency signal supplied from said frequency divider to said phase comparator within a respective frequency region including a predetermined region above and below the center frequency.

113. A high frequency apparatus for use with an input signal, said apparatus having a center frequency and comprising:

a mixer having i) a first input coupled to the input signal, ii) a second input coupled to an output signal of a local oscillator, and iii) an output terminal coupled to an output signal of the mixer;

said local oscillator includes i) a voltage controlled oscillator having a) an oscillating section, and b) a pattern inductance line formed on a substrate, ii) generating means for generating a reference frequency signal, said reference signal having a reference center frequency, iii) a phase comparator, iv) a frequency divider, and v) a loop after, wherein said generating means for generating said reference frequency signal, said phase comparator, said frequency divider, and said loop filter are part of a control loop, said control loop having a sufficiently high loop band width such that noise effects of said local oscillator are not dominated by said voltage controlled oscillator, a signal level of a frequency distribution characteristic within a predetermined region of the reference center frequency is lower, relative to a signal level of a frequency distribution characteristic within a predetermined region of a center frequency of the output signal from said local oscillator, than a signal level to be noise-reduced by the high loop band width in a same off set frequency from the respective center frequency excluding a portion substantially at the center frequency of the high frequency apparatus.

* * * * *

UNITED STATES PATENT AND TRADE MARK OFFICE
CERTIFICATE OF CORRECTION

PATENT NO. : 6,052,571
DATED : April 18, 2000
INVENTOR(S) : Akira Mishima, Shigeharu Sumi and Motoyoshi Kitagawa It is certified that error appears in the above-identified patent and that said Letters Patent is hereby corrected as shown below:

Column 34, claim 22, line 33, "11" should be --1--.

Column 34, claim 22, line 33, "where" should be --further--.

Column 42, claim 97, line 5, "when" should be --further--.

Column 42, claim 98, line 14, "In Q" should be --I/Q--.

Column 44, claim 113, line 36, "after" should be --filter--.

Signed and Sealed this

Twenty-fourth Day of April, 2001

*Attest:*

NICHOLAS P. GODICI

*Attesting Officer*      *Acting Director of the United States Patent and Trademark Office*